(12) United States Patent
Kurs et al.

(10) Patent No.: US 10,913,368 B2
(45) Date of Patent: Feb. 9, 2021

(54) PWM CAPACITOR CONTROL

(71) Applicant: WiTricity Corporation, Watertown, MA (US)

(72) Inventors: Andre B. Kurs, Chestnut Hill, MA (US); Milisav Danilovic, Watertown, MA (US)

(73) Assignee: WiTricity Corporation, Watertown, MA (US)

( * ) Notice: Subject to any disclaimer, the term of this patent is extended or adjusted under 35 U.S.C. 154(b) by 148 days.

(21) Appl. No.: 16/038,569

(22) Filed: Jul. 18, 2018

(65) Prior Publication Data

US 2018/0323654 A1    Nov. 8, 2018

Related U.S. Application Data

(63) Continuation of application No. 15/427,186, filed on Feb. 8, 2017, now Pat. No. 10,063,104.

(Continued)

(51) Int. Cl.
 *B60L 53/12*        (2019.01)
 *H03H 7/40*         (2006.01)
 (Continued)

(52) U.S. Cl.
 CPC ............. *B60L 53/12* (2019.02); *H02J 50/12* (2016.02); *H03H 7/40* (2013.01); *H03H 11/28* (2013.01);
 (Continued)

(58) Field of Classification Search
 CPC . H02J 50/12; B60L 53/12; H03H 7/40; H03H 11/28; H03H 7/383; H03K 5/1536;
 (Continued)

(56) References Cited

U.S. PATENT DOCUMENTS 645,576 A   3/1900 Tesla
649,621 A   5/1900 Tesla
(Continued)

FOREIGN PATENT DOCUMENTS

CA    142352    8/1912
CN    102239633 11/2011
(Continued)

OTHER PUBLICATIONS

The International Preliminary Report on Patentability and Written Opinion for International Application No. PCT/US2017/017054 dated Aug. 23, 2018 (12 pages).

(Continued)

*Primary Examiner* — Daniel J Cavallari
(74) *Attorney, Agent, or Firm* — Fish & Richardson P.C.

(57) ABSTRACT

Methods, systems, and devices for controlling a variable capacitor. One aspect features a variable capacitance device that includes a capacitor, a first transistor, a second transistor, and control circuitry. The control circuitry is configured to adjust an effective capacitance of the capacitor by performing operations including detecting a zero-crossing of an input current at a first time. Switching off the first transistor. Estimating a first delay period for switching the first transistor on when a voltage across the capacitor is zero. Switching on the first transistor after the first delay period from the first time. Detecting a zero-crossing of the input current at a second time. Switching off the second transistor. Estimating a second delay period for switching the second transistor on when a voltage across the capacitor is zero. Switching on the second transistor after the second delay period from the second time.

20 Claims, 52 Drawing Sheets

Related U.S. Application Data

(60) Provisional application No. 62/292,474, filed on Feb. 8, 2016, provisional application No. 62/376,217, filed on Aug. 17, 2016, provisional application No. 62/407,010, filed on Oct. 12, 2016, provisional application No. 62/408,204, filed on Oct. 14, 2016.

(51) Int. Cl.
*H02J 50/12* (2016.01)
*H03H 11/28* (2006.01)
*H03K 5/1536* (2006.01)
*H03K 7/08* (2006.01)
*H03K 17/284* (2006.01)

(52) U.S. Cl.
CPC ............ *H03K 5/1536* (2013.01); *H03K 7/08* (2013.01); *H03K 17/284* (2013.01)

(58) Field of Classification Search
CPC ........ H03K 7/08; H03K 17/284; Y02T 90/14; Y02T 10/70; Y02T 10/7072; H02M 1/08
See application file for complete search history.

(56) References Cited

U.S. PATENT DOCUMENTS

| | | |
|---|---|---|
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 4,088,999 A | 5/1978 | Fletcher et al. |
| 4,095,998 A | 6/1978 | Hanson |
| 4,180,795 A | 12/1979 | Matsuda et al. |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hiering et al. |
| 5,053,774 A | 10/1991 | Schuermann et al. |
| 5,070,293 A | 12/1991 | Ishii et al. |
| 5,118,997 A | 6/1992 | El-Hamamsy |
| 5,216,402 A | 6/1993 | Carosa |
| 5,229,652 A | 7/1993 | Hough |
| 5,287,112 A | 2/1994 | Schuermann |
| 5,341,083 A | 8/1994 | Klontz et al. |
| 5,367,242 A | 11/1994 | Hulman |
| 5,374,930 A | 12/1994 | Schuermann |
| 5,408,209 A | 4/1995 | Tanzer et al. |
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,541,604 A | 7/1996 | Meier |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,703,461 A | 12/1997 | Minoshima et al. |
| 5,703,573 A | 12/1997 | Fujimoto et al. |
| 5,710,413 A | 1/1998 | King et al. |
| 5,742,471 A | 4/1998 | Barbee, Jr. et al. |
| 5,821,728 A | 10/1998 | Sshwind |
| 5,821,731 A | 10/1998 | Kuki et al. |
| 5,864,323 A | 1/1999 | Berthon |
| 5,898,579 A | 4/1999 | Boys et al. |
| 5,903,134 A | 5/1999 | Takeuchi |
| 5,923,544 A | 7/1999 | Urano |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,321,067 B1 * | 11/2001 | Suga .................. G07C 9/28 455/41.2 |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 | 11/2005 | Landis |
| 6,975,198 B2 | 12/2005 | Baarman |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Govorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |

(56) References Cited

U.S. PATENT DOCUMENTS

| | | |
|---|---|---|
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 8,754,549 B2 | 6/2014 | Kawakami et al. |
| 9,825,553 B2 * | 11/2017 | Celani .................. H02M 7/217 |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0218406 A1 * | 11/2004 | Jang .................... H02J 50/12 |
| | | 363/37 |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |

(56) References Cited

U.S. PATENT DOCUMENTS

| | | |
|---|---|---|
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |

(56) References Cited

U.S. PATENT DOCUMENTS

| | | |
|---|---|---|
| 2010/0102638 A1 | 4/2010 | Chen et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Smith et al. |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |

(56) References Cited

U.S. PATENT DOCUMENTS

| | | |
|---|---|---|
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0062551 A1 | 3/2014 | Bhaumik et al. |
| 2014/0070764 A1 | 3/2014 | Keeling |
| 2015/0278681 A1 | 10/2015 | Saxena |
| 2017/0149291 A1 | 5/2017 | Iwasaki et al. |
| 2017/0229917 A1 | 8/2017 | Kurs et al. |
| 2017/0311396 A1* | 10/2017 | Sadwick ............. F21V 25/00 |

FOREIGN PATENT DOCUMENTS

| | | | |
|---|---|---|---|
| CN | 102439669 | 5/2012 | |
| CN | 103329397 | 9/2013 | |
| CN | 103855928 | 6/2014 | |
| DE | 38 24 972 | 1/1989 | |
| DE | 100 29147 | 12/2001 | |
| DE | 200 16 655 | 3/2002 | |
| DE | 102 21 484 | 11/2003 | |
| DE | 103 04 584 | 8/2004 | |
| DE | 10 2005 036290 | 2/2007 | |
| DE | 10 2006 044057 | 4/2008 | |
| EP | 1 335 477 | 8/2003 | |
| EP | 1 521 206 | 4/2005 | |
| EP | 1 524 010 | 4/2005 | |
| EP | 1 555 753 | 7/2005 | ............. H03H 11/12 |
| EP | 2 357 716 | 8/2011 | |
| JP | 02-097005 | 4/1990 | |
| JP | 4-265875 | 9/1992 | |
| JP | 6-341410 | 12/1994 | |
| JP | 9-182323 | 7/1997 | |
| JP | 9-298847 | 11/1997 | |
| JP | 10-164837 | 6/1998 | |
| JP | 11-75329 | 3/1999 | |
| JP | 11-188113 | 7/1999 | |
| JP | 2001-309580 | 11/2001 | |
| JP | 2002-010535 | 1/2002 | |
| JP | 2003-179526 | 6/2003 | |
| JP | 2004-166459 | 6/2004 | |
| JP | 2004-201458 | 7/2004 | |
| JP | 2004-229144 | 8/2004 | |
| JP | 2005-57444 | 3/2005 | |
| JP | 2005-149238 | 6/2005 | |
| JP | 2006-074848 | 3/2006 | |
| JP | 2007-505480 | 3/2007 | |
| JP | 2007-266892 | 10/2007 | |
| JP | 2007-537637 | 12/2007 | |
| JP | 2008-508842 | 3/2008 | |
| JP | 2008-206231 | 9/2008 | |
| JP | 2008-206327 | 9/2008 | ............. H01G 7/00 |
| JP | 2009-147204 | 7/2009 | |
| JP | 2011-072074 | 4/2011 | |
| JP | 2012-504387 | 2/2012 | |
| JP | 2013-543718 | 12/2013 | |

(56) References Cited

FOREIGN PATENT DOCUMENTS

| | | | | |
|---|---|---|---|---|
| KR | 10-2002-0089226 | 11/2002 | ............... | H03B 5/12 |
| KR | 10-2007-0017804 | 2/2007 | | |
| KR | 10-2008-0007635 | 1/2008 | | |
| KR | 10-2009-0122072 | 11/2009 | | |
| KR | 10-2011-0050920 | 5/2011 | | |
| SG | 112842 | 7/2005 | | |
| WO | WO 92/17929 | 10/1992 | | |
| WO | WO 93/23908 | 11/1993 | | |
| WO | WO 94/28560 | 12/1994 | | |
| WO | WO 95/11545 | 4/1995 | | |
| WO | WO 96/02970 | 2/1996 | | |
| WO | WO 98/50993 | 11/1998 | | |
| WO | WO 00/77910 | 12/2000 | | |
| WO | WO 03/092329 | 11/2003 | | |
| WO | WO 03/096361 | 11/2003 | | |
| WO | WO 03/096512 | 11/2003 | | |
| WO | WO 2004/015885 | 2/2004 | | |
| WO | WO 2004/038888 | 5/2004 | | |
| WO | WO 2004/055654 | 7/2004 | | |
| WO | WO 2004/073150 | 8/2004 | | |
| WO | WO 2004/073166 | 8/2004 | | |
| WO | WO 2004/073176 | 8/2004 | | |
| WO | WO 2004/073177 | 8/2004 | | |
| WO | WO 2004/112216 | 12/2004 | | |
| WO | WO 2005/024865 | 3/2005 | | |
| WO | WO 2005/060068 | 6/2005 | | |
| WO | WO 2005/109597 | 11/2005 | | |
| WO | WO 2005/109598 | 11/2005 | | |
| WO | WO 2006/011769 | 2/2006 | | |
| WO | WO 2007/008646 | 1/2007 | | |
| WO | WO 2007/020583 | 2/2007 | | |
| WO | WO 2007/042952 | 4/2007 | | |
| WO | WO 2007/084716 | 7/2007 | | |
| WO | WO 2007/084717 | 7/2007 | | |
| WO | WO 2008/109489 | 9/2008 | | |
| WO | WO 2008/118178 | 10/2008 | | |
| WO | WO 2009/009559 | 1/2009 | | |
| WO | WO 2009/018568 | 2/2009 | | |
| WO | WO 2009/023155 | 2/2009 | | |
| WO | WO 2009/023646 | 2/2009 | | |
| WO | WO 2009/033043 | 3/2009 | | |
| WO | WO 2009/062438 | 5/2009 | | |
| WO | WO 2009/070730 | 6/2009 | | |
| WO | WO 2009/126963 | 10/2009 | | |
| WO | WO 2009/140506 | 11/2009 | | |
| WO | WO 2009/149464 | 12/2009 | | |
| WO | WO 2009/155000 | 12/2009 | | |
| WO | WO 2010/010710 | 1/2010 | ............... | H02M 3/07 |
| WO | WO 2010/030977 | 3/2010 | | |
| WO | WO 2010/036980 | 4/2010 | | |
| WO | WO 2010/039967 | 4/2010 | | |
| WO | WO 2010/090538 | 8/2010 | | |
| WO | WO 2010/090539 | 8/2010 | | |
| WO | WO 2010/093997 | 8/2010 | | |
| WO | WO 2010/104569 | 9/2010 | | |
| WO | WO 2011/061388 | 5/2011 | | |
| WO | WO 2011/061821 | 5/2011 | | |
| WO | WO 2011/062827 | 5/2011 | | |
| WO | WO 2011/112795 | 9/2011 | | |
| WO | WO 2012/037279 | 3/2012 | | |
| WO | WO 2012/170278 | 12/2012 | | |
| WO | WO 2013/013235 | 1/2013 | | |
| WO | WO 2013/020138 | 2/2013 | | |
| WO | WO 2013/036947 | 3/2013 | | |
| WO | WO 2013/059441 | 4/2013 | | |
| WO | WO 2013/067484 | 5/2013 | | |
| WO | WO 2013/113017 | 8/2013 | | |
| WO | WO 2013/142840 | 9/2013 | | |
| WO | WO 2013/177205 | 11/2013 | ............... | H02J 17/00 |
| WO | WO 2014/004843 | 1/2014 | | |
| WO | WO 2016/019159 | 2/2016 | ............... | H02J 7/02 |

OTHER PUBLICATIONS

"Intel CTO Says Gap between Humans, Machines Will Close by 2050", *Intel News Release*, (See Intel.com/ .../20080821comp.htm?iid=S . . . ) (Printed Nov. 6, 2009).
"Physics Update, Unwired Energy", *Physics Today*, pp. 26, (Jan. 2007) (See http://arxiv.org/abs/physics/0611063.).
"In pictures: A year in technology", *BBC News*, (Dec. 28, 2007).
"Next Little Thing 2010 Electricity without wires", CNN Money (See money.cnn.com/galleries/2009/smallbusiness/0911/gallery.next_little_thing_2010.smb/) (dated Nov. 30, 2009).
Abe et al. "A Noncontact Charger Using a Resonant Converter with Parallel Capacitor of the Secondary Coil". IEEE, 36(2):444-451, Mar./Apr. 2000.
Ahmadian, M. et al., "Miniature Transmitter for Implantable Micro Systems", *Proceedings of the 25th Annual International Conference of the IEEE EMBS Cancun, Mexico*, pp. 3028-3031 (Sep. 17-21, 2003).
Aoki, T. et al., "Observation of strong coupling between one atom and a monolithic microresonator", Nature, vol. 443:671-674 (2006).
Apneseth et al. "Introducing wireless proximity switches" ABB Review Apr. 2002.
Aristeidis Karalis et al., "Efficient Wireless *non-radiative mid-range* energy transfer", *Annals of Physics*, vol. 323, pp. 34-48 (2008).
Baker et al., "Feedback Analysis and Design of RF Power Links for Low-Power Bionic Systems," *IEEE Transactions on Biomedical Circuits and Systems*, vol. 1(1):28-38 (Mar. 2007).
Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/1114/2, (Nov. 14, 2006) 2 pages.
Biever, C., "Evanescent coupling' could power gadgets wirelessly", NewScientistsTech.com, http://www. newscientisttech.com/article.ns?id=dn1 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).
Boyle, A., "Electro-nirvana? Not so fast", MSNBC, http:/lcosmiclog.msnbc.msn.com/_news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging the Wireless Way—Even physicists forget to recharge their cell phones sometimes.", PC Magazine, ABC News Internet Ventures, (Dec. 12, 2006) 1 page.

(56) References Cited

OTHER PUBLICATIONS

Chinaview, ,"Scientists light bulb with 'wireless electricity'",www. Chinaview.cn, http://news.xinhuanet.com/english/2007-06/08/content_6215681.htm,Jun. 2007,1 page.
Cooks, G., "The vision of an MIT physicist: Getting rid of pesky rechargers", Boston.com, (Dec. 11, 2006) 1 page.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).
Esser et al., "A New Approach to Power Supplies for Robots", IEEE, vol. 27(5):872-875, (Sep./Oct. 1991).
Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).
Fenske et al., "Dielectric Materials at Microwave Frequencies", Applied Microwave & Wireless, pp. 92-100 (2000).
Fernandez, C. et al., "A simple dc-dc converter for the power supply of a cochlear implant", *IEEE*, pp. 1965-1970 (2003).
Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).
Fildes, J., "Physics Promises Wireless Power", (Science and Technology Reporter), BBC News, (Nov. 15, 2006) 3 pages.
Fildes, J., "The technology with impact 2007", BBC News, (Dec. 27, 2007) 3 pages.
Fildes, J., "Wireless energy promise powers up", BBC News, http://news.bbc.co.uk/2/hi/technology/6725955.stm, (Jun. 7, 2007) 3 pages.
Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).
Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D.H., "Power on a Chip", MIT Technology Review, (Nov. 2004).
Gary Peterson, "MIT WiTricity Not so Original After All", *Feed Line No. 9*, (See http://www.tfcbooks.com/articles/witricity.htm) printed Nov. 12, 2009.
Geyi, Wen, "A Method for the Evaluation of Small Antenna Q", IEEE Transactions on Antennas and Propagation, vol. 51(8):2124-2129 (Aug. 2003).
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).
Highfield, R., "Wireless revolution could spell end of plugs-",(Science Editor), Telegraph.co.uk, http://www. telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).
Hirai et al., "Practical Study on Wireless Transmission of Power and Information for Autonomous Decentralized Manufacturing System", IEEE, vol. 46(2):349-359, Apr. 1999.

Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
Infotech Online, "Recharging gadgets without cables", infotech.indiatimes.com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).
Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resonances", *Science* vol. 317, pp. 83-86 (Jul. 6, 2007).
Kurs, A. et al., "Simultaneous mid-range power transfer to multiple devices", *Applied Physics Letters*, vol. 96, No. 044102 (2010).
Kurs, A. et al.,"Optimized design of a low-resistance electrical conductor for the multimegahertz range", *Applied Physics Letters*, vol. 98:172504-172504-3 (Apr. 2011).
Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages (2003).
Lee, "RFID Coil Design," Microchip Technology Inc., AN678, 21 pages (1998).
Liang et al., "Silicon waveguide two-photon absorption detector at 1.5 µm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Mediano, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R. ,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.

(56) References Cited

OTHER PUBLICATIONS

Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
PRESSTV, "Wireless power transfer possible", http://edition.presstv.ir/detail/12754.html, Jun. 11, 2007, 1 page.
Reidy, C. (GLOBE STAFF), "MIT discovery could unplug your iPod forever", Boston.com, http://www.boston.com/ business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.
Zierhofer, Clemens M. et al., "High-Efficiency Coupling-Insensitive Transcutaneous Power and Data Transmission via an Inductive Link", *IEEE Transactions on Biomedical Engineering*, vol. 37, No. 7, pp. 716-722 (Jul. 1990).
International Search Report and Written Opinion of the International Searching Authority dated Apr. 18, 2017.
European Search Report for European Application No. 17 15 5271 dated Jun. 27, 2017.

* cited by examiner

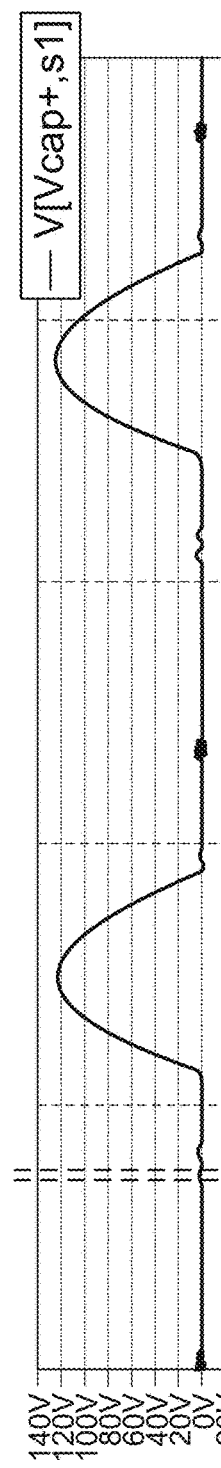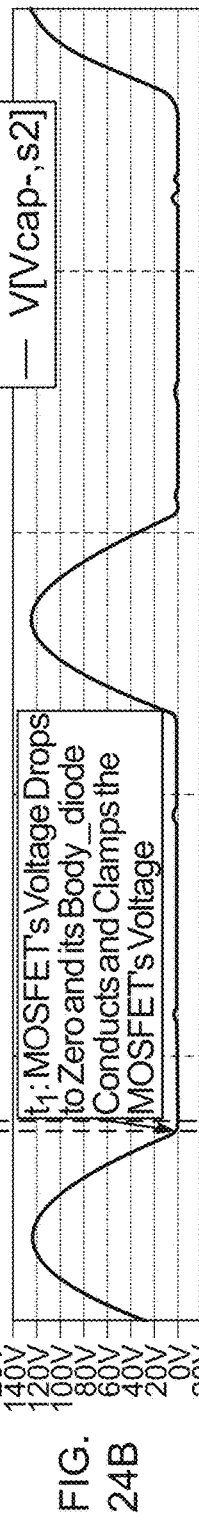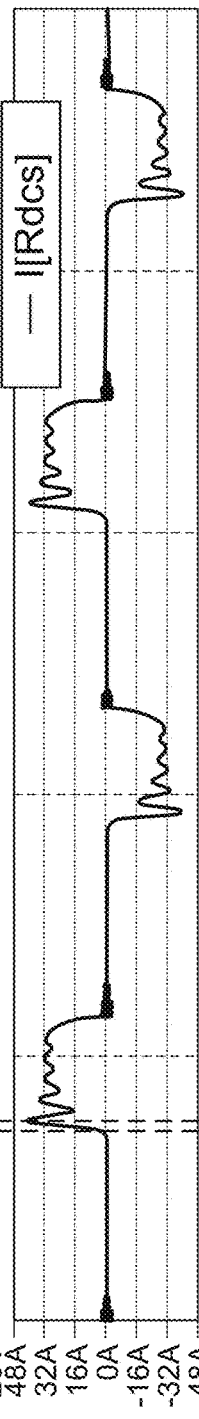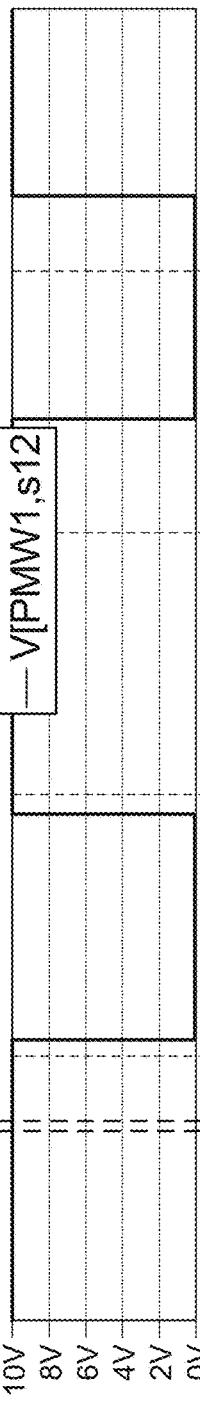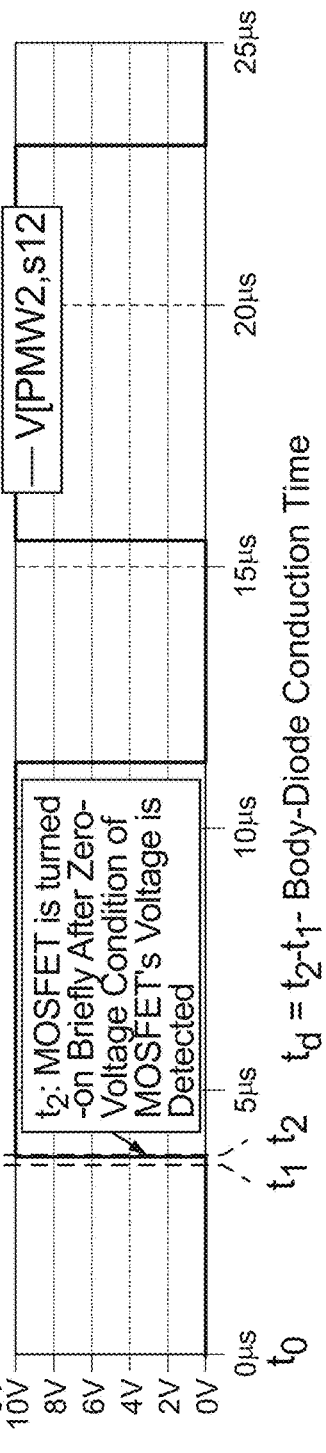

Delay pwm M1 Turn on so Automatic ZVS can be Allowed to Complete ZVS Process

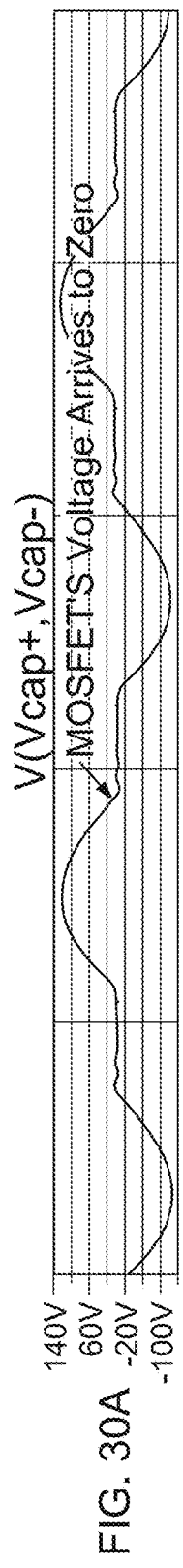
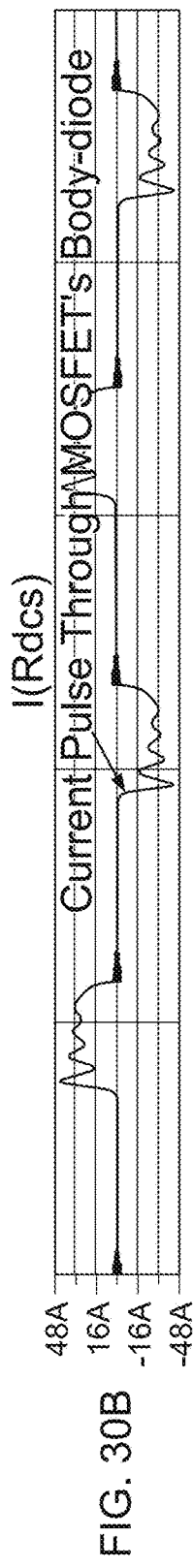
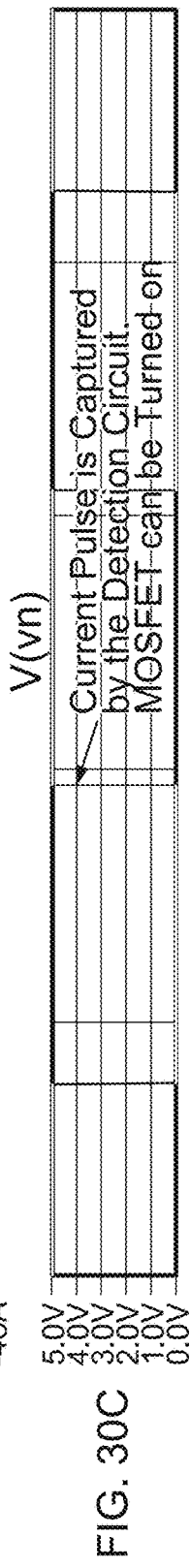
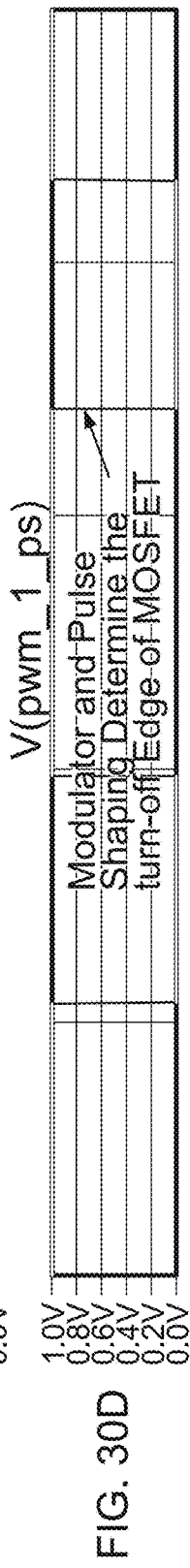
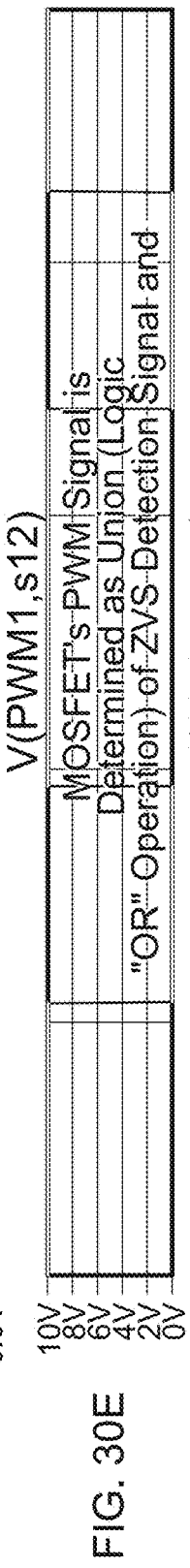
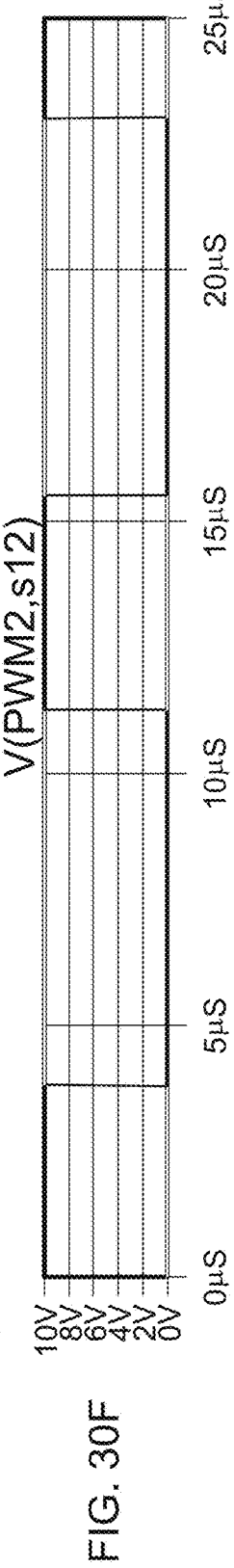

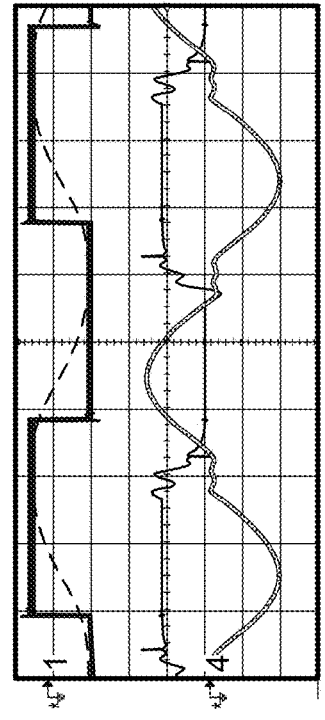
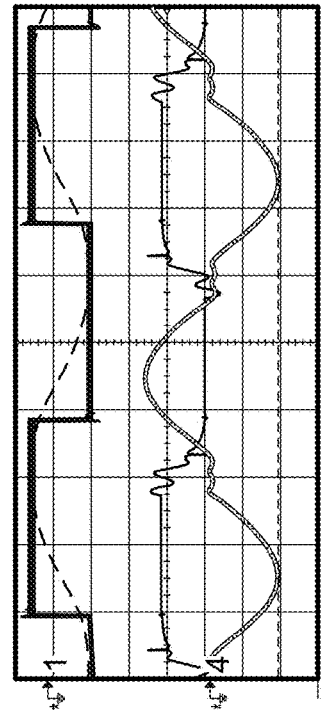
FIG. 31A
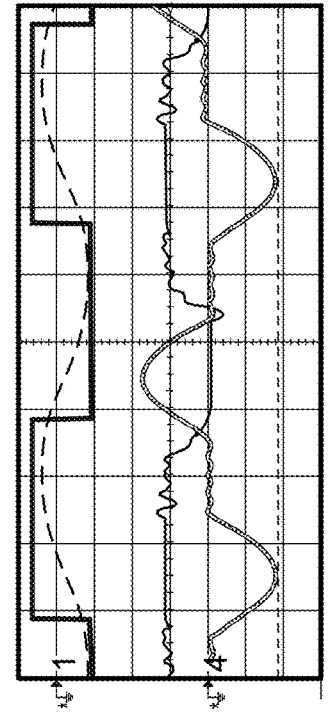
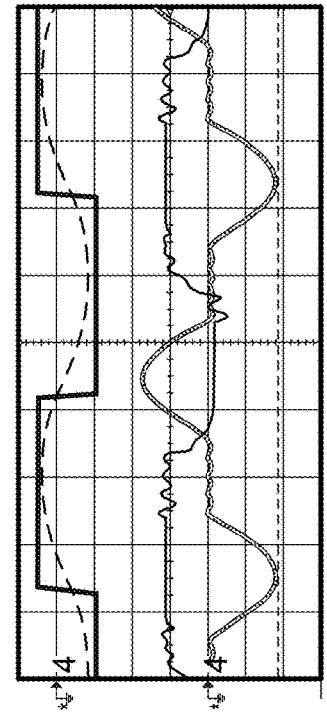
FIG. 31B

PWM CAPACITOR CONTROL

CROSS-REFERENCE TO RELATED APPLICATION

Under 35 U.S.C. § 120, this application is a continuation of and claims priority to U.S. patent application Ser. No. 15/427,186, filed on Feb. 8, 2017, which claims priority to U.S. Provisional Patent Application Nos. 62/292,474, filed on Feb. 8, 2016; 62/376,217, filed on Aug. 17, 2016; 62/407,010, filed on Oct. 12, 2016; and 62/408,204 filed on Oct. 14, 2016. The entire contents of each of these priority applications are incorporated herein by reference in their entirety.

BACKGROUND

Power electronics may rely on electronic circuits such as rectifiers, AC (Alternating Current) to DC (Direct Current) converters, impedance matching circuits, and other power electronics to condition, monitor, maintain, and/or modify the characteristics of the voltage and/or current used to provide power to electronic devices. Circuit components with adjustable impedance can used in such contexts to modify the voltage and/or current characteristics of various electronic devices. Controlling such components to avoid damage can be challenging. Moreover, present adjustable impedance circuit components may sacrifice efficiency power losses in order to ensure safe operation. For example, PWM controlled reactive components (e.g., capacitors and inductors) may rely on lossy diode conduction currents to clamp component voltages at zero while transistors are switched in order to avoid damaging current surges through the transistors.

SUMMARY

In general, the disclosure features control systems and processes for controlling a variable reactive circuit component, such as a PWM controlled capacitor. The devices and process described herein can be used in a variety of contexts, including impedance matching networks, implantable devices, cell phone and other mobile computing device chargers, and chargers for electric vehicles.

In a first aspect, the disclosure features a variable capacitance device that includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a first zero-crossing of an input current at a first time. Switching off the first transistor after a first delay period from the first time. A length of the first delay period can be controlled by an input value. Detecting a second zero-crossing of the input current at a second time, after the first time. Measuring an elapsed time between switching off the first transistor and detecting the second zero-crossing. Setting a counter based on the elapsed time. Switching on the first transistor after a second delay period based on the counter.

In a second aspect, the disclosure features a high-voltage impedance matching system that includes an impedance matching network and a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a first zero-crossing of an input current at a first time. Switching off the first transistor after a first delay period from the first time. A length of the first delay period can be controlled by an input value. Detecting a second zero-crossing of the input current at a second time, after the first time. Measuring an elapsed time between switching off the first transistor and detecting the second zero-crossing. Setting a counter based on the elapsed time. Switching on the first transistor after a second delay period based on the counter.

In a third aspect, the disclosure features a wireless energy transfer system that includes an inductive coil electrically connected to a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a first zero-crossing of an input current at a first time. Switching off the first transistor after a first delay period from the first time. A length of the first delay period can be controlled by an input value. Detecting a second zero-crossing of the input current at a second time, after the first time. Measuring an elapsed time between switching off the first transistor and detecting the second zero-crossing. Setting a counter based on the elapsed time. Switching on the first transistor after a second delay period based on the counter.

These and the following aspects can each optionally include one or more of the following features.

In some implementations, the operations of the control circuitry include switching off the second transistor after the first delay period from the second time. Detecting a third zero-crossing of the input current at a third time, after the second time. Measuring a second elapsed time between switching off the second transistor and detecting the third zero-crossing. Setting a second counter based on the second elapsed time. Switching on the second transistor after a third delay period based on the second counter.

In some implementations, the effective capacitance of the capacitor is controlled by the input value.

In some implementations, the input value is a phase delay value, and the first delay period is equal to $$\frac{\varphi}{360°}T,$$

where φ represents the phase delay value and T represents a period of the input current.

In some implementations, setting the counter based on the elapsed time includes setting the counter to the measured elapsed time plus a predetermined delay time.

In some implementations, the predetermined time delay less than 800 ns.

In some implementations, the first and second transistors are silicon MOSFET transistors, silicon carbide MOSFET transistors, or gallium nitride MOSFET transistors.

In some implementations, switching on the first transistor includes switching on the first transistor in response to detecting body-diode conduction through the first transistor.

In some implementations, the body-diode conduction through the first transistor indicates a zero voltage condition across the capacitor.

In a fourth aspect, the disclosure features a variable capacitance device that includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including determining a first delay period based on a phase delay value. Determining a second delay period based on the phase delay value, where the second delay period being longer than the first delay period. Detecting a first zero-crossing of an input current at a first time. Switching off the first transistor after the first delay period from the first time. Switching on the first transistor after the second delay period from the first time. Detecting a second zero-crossing of the input current at a second time, after the first time. Switching off the second transistor after the first delay period from the second time. Switching on the second transistor after the second delay period from the second time.

In a fifth aspect, the disclosure features a high-voltage impedance matching system that includes an impedance matching network and a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including determining a first delay period based on a phase delay value. Determining a second delay period based on the phase delay value, where the second delay period being longer than the first delay period. Detecting a first zero-crossing of an input current at a first time. Switching off the first transistor after the first delay period from the first time. Switching on the first transistor after the second delay period from the first time. Detecting a second zero-crossing of the input current at a second time, after the first time. Switching off the second transistor after the first delay period from the second time. Switching on the second transistor after the second delay period from the second time.

In a sixth aspect, the disclosure features a wireless energy transfer system that includes an inductive coil electrically connected to a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including determining a first delay period based on a phase delay value. Determining a second delay period based on the phase delay value, where the second delay period being longer than the first delay period. Detecting a first zero-crossing of an input current at a first time. Switching off the first transistor after the first delay period from the first time. Switching on the first transistor after the second delay period from the first time. Detecting a second zero-crossing of the input current at a second time, after the first time. Switching off the second transistor after the first delay period from the second time. Switching on the second transistor after the second delay period from the second time.

These and the other aspects can each optionally include one or more of the following features.

In some implementations, the effective capacitance of the capacitor is controlled by the phase delay value.

In some implementations, the first delay period is equal to $$\frac{\varphi}{360°}T,$$

where φ represents the phase delay value and T represents a period of the input current.

In some implementations, the second delay period is equal to $$\frac{360° - \varphi}{360°}T,$$

where φ represents the phase delay value and T represents a period of the input current.

In some implementations, switching on the first transistor after the second delay period from the first time includes switching on the first transistor following a fixed time delay after the second delay period from the first time.

In some implementations, switching on the first transistor after the second delay period from the first time includes switching on the first transistor in response to detecting body-diode conduction through the first transistor.

In some implementations, the body-diode conduction through the first transistor indicates a zero voltage condition across the capacitor.

In some implementations, the first and second transistors are silicon MOSFET transistors, silicon carbide MOSFET transistors, or gallium nitride MOSFET transistors.

In a seventh aspect, the disclosure features a variable capacitance device that includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including generating an alternating ramp signal having peaks and troughs that are timed to correspond with zero-crossings of an input current. Switching off the first transistor in response to the ramp signal crossing a first reference value. Switching on the first transistor after the ramp signal crosses the first reference value and in response to detecting body-diode conduction through the first transistor. Switching off the second transistor in response to the ramp signal crossing a second reference value. Switching on the second transistor after the ramp signal crosses the second reference value and in response to detecting body-diode conduction through the first transistor.

In an eighth aspect, the disclosure features a high-voltage impedance matching system that includes an impedance matching network and a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including generating an alternating ramp signal having peaks and troughs that are timed to correspond with zero-crossings of an input current. Switching off the first transistor in response to the ramp signal crossing a first reference value. Switching on the first transistor after the ramp signal crosses the first reference value and in response to detecting body-diode conduction through the first transistor. Switching off the second transistor in response to the ramp signal crossing a second reference value. Switching on the second transistor after the ramp signal crosses the second reference value and in response to detecting body-diode conduction through the first transistor.

In a ninth aspect, the disclosure features a wireless energy transfer system that includes an inductive coil electrically connected to a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including generating an alternating ramp signal having peaks and troughs that are timed to correspond with zero-crossings of an input current. Switching off the first transistor in response to the ramp signal crossing a first reference value. Switching on the first transistor after the ramp signal crosses the first reference value and in response to detecting body-diode conduction through the first transistor. Switching off the second transistor in response to the ramp signal crossing a second reference value. Switching on the second transistor after the ramp signal crosses the second reference value and in response to detecting body-diode conduction through the first transistor.

These and the other aspects can each optionally include one or more of the following features.

In some implementations, the effective capacitance of the capacitor is controlled by the first and second reference values.

In some implementations, the second reference value has a value that is the negative of the first reference value.

In some implementations, switching on the first transistor includes switching on the first transistor following a fixed time delay after the ramp signal crosses the first reference value following the peak in the ramp signal.

In some implementations, switching on the first transistor includes switching on the first transistor after the ramp signal crosses the first reference value following a peak in the ramp signal and in response to detecting body-diode conduction through the first transistor.

In some implementations, the body-diode conduction through the first transistor indicates a zero voltage condition across the capacitor.

In some implementations, the first and second transistors are silicon MOSFET transistors, silicon carbide MOSFET transistors, or gallium nitride MOSFET transistors.

In a tenth aspect, the disclosure features a variable capacitance device that includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a zero-crossing of an input current at a first time. Switching off the first transistor. Estimating, based on an input value, a first delay period for switching the first transistor on when a voltage across the capacitor is zero. Switching on the first transistor after the first delay period from the first time. Detecting a zero-crossing of the input current at a second time. Switching off the second transistor. Estimating, based on the input value, a second delay period for switching the second transistor on when a voltage across the capacitor is zero. Switching on the second transistor after the second delay period from the second time.

In an eleventh aspect, the disclosure features a high-voltage impedance matching system that includes an impedance matching network and a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a zero-crossing of an input current at a first time. Switching off the first transistor. Estimating, based on an input value, a first delay period for switching the first transistor on when a voltage across the capacitor is zero. Switching on the first transistor after the first delay period from the first time. Detecting a zero-crossing of the input current at a second time. Switching off the second transistor. Estimating, based on the input value, a second delay period for switching the second transistor on when a voltage across the capacitor is zero. Switching on the second transistor after the second delay period from the second time.

In a twelfth aspect, the disclosure features a wireless energy transfer system that includes an inductive coil electrically connected to a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including detecting a zero-crossing of an input current at a first time. Switching off the first transistor. Estimating, based on an input value, a first delay period for switching the first transistor on when a voltage across the capacitor is zero. Switching on the first transistor after the first delay period from the first time. Detecting a zero-crossing of the input current at a second time. Switching off the second transistor. Estimating, based on the input value, a second delay period for switching the second transistor on when a voltage across the capacitor is zero. Switching on the second transistor after the second delay period from the second time.

These and the other aspects can each optionally include one or more of the following features.

In some implementations, the effective capacitance of the capacitor is controlled by the input value.

In some implementations, the first delay period is equal to $$\frac{360° - \varphi}{360°} T,$$

where $\varphi$ represents the input value and T represents a period of the input current.

In some implementations, switching on the first transistor after the first delay period from the first time includes switching on the first transistor following a fixed time delay after the first delay period from the first time.

In some implementations, switching on the first transistor after the first delay period from the first time includes switching on the first transistor in response to detecting body-diode conduction through the first transistor.

In some implementations, the body-diode conduction through the first transistor indicates a zero voltage condition across the capacitor.

In some implementations, the first and second transistors are silicon MOSFET transistors, silicon carbide MOSFET transistors, or gallium nitride MOSFET transistors.

In some implementations, the operations of the control circuitry include determining a third delay period, based on the input value, and switching off the first transistor includes switching off the first transistor after the third delay period from the first time.

In some implementations, the third delay period is equal to $$\frac{\varphi}{360°} T,$$

where $\varphi$ represents the input value and T represents a period of the input current.

In some implementations, the operations of the control circuitry include determining a fourth delay period, based on the input value, and switching off the second transistor includes switching off the second transistor after the fourth delay period from the second time.

In some implementations, the fourth delay period is equal to $$\frac{\varphi}{360°}T,$$

where φ represents the input value and T represents a period of the input current.

In a thirteenth aspect, the disclosure features a variable capacitance device that includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including switching off the first transistor at a first time. Switching on the first transistor after detecting a current through a first diode associated with the first transistor. Switching off the second transistor at a second time. Switching on the second transistor after detecting a current through a second diode associated with the second transistor.

In a fourteenth aspect, the disclosure features a high-voltage impedance matching system that includes an impedance matching network and a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including switching off the first transistor at a first time. Switching on the first transistor after detecting a current through a first diode associated with the first transistor. Switching off the second transistor at a second time. Switching on the second transistor after detecting a current through a second diode associated with the second transistor.

In a fifteenth aspect, the disclosure features a wireless energy transfer system that includes an inductive coil electrically connected to a variable capacitance device. The variable capacitance device includes a capacitor, a first transistor, a second transistor, and control circuitry. The first transistor includes a first-transistor source terminal, a first-transistor drain terminal, and a first-transistor gate terminal. The first-transistor drain terminal is electrically connected to a first terminal of the capacitor. The first-transistor gate terminal is coupled to the control circuitry. The second transistor includes a second-transistor source terminal, a second-transistor drain terminal, and a second-transistor a gate terminal. The second-transistor drain terminal is electrically connected to a second terminal of the capacitor. The second-transistor source terminal is electrically connected to the second-transistor source terminal. The second-transistor gate terminal is coupled to the control circuitry. The control circuitry is configured to adjust an effective capacitance of the capacitor by performing operations including switching off the first transistor at a first time. Switching on the first transistor after detecting a current through a first diode associated with the first transistor. Switching off the second transistor at a second time. Switching on the second transistor after detecting a current through a second diode associated with the second transistor.

These and the other aspects can each optionally include one or more of the following features.

In some implementations, the first diode is electrically connected in parallel with the first transistor, and the second diode is electrically connected in parallel with the second transistor.

In some implementations, the first diode is a body-diode of the first transistor, and the second diode is a body-diode of the second transistor.

Some implementations include a body diode conduction sensor electrically connected to the first transistor and the second transistor.

In some implementations, the body diode conduction sensor is coupled to the control circuitry and provides signals indicating a start of body diode conduction through the first diode and through the second diode.

In some implementations, the body diode conduction sensor includes a sense resistor electrically connected between the first transistor and the second transistor.

In some implementations, the body diode conduction sensor includes an operational amplifier comprising a first input terminal electrically connected to a one terminal of the sense resistor and a second input terminal electrically connected to another terminal of the sense resistor.

In some implementations, the body diode conduction sensor is configured to operate using a bipolar voltage supply.

In some implementations, the body diode conduction sensor is configured to operate using a unipolar voltage supply.

In some implementations, the first and second transistors are silicon MOSFET transistors, silicon carbide MOSFET transistors, or gallium nitride MOSFET transistors.

In a sixteenth aspect, the disclosure features an impedance matching network of a wireless power transmission system that includes first and second transistor switching elements having internal body diodes or external antiparallel diodes associated therewith. A PWM-switched capacitor coupled across the first and second switching elements. A controller coupled to control the first and second switching elements to minimize the body diode conduction time by steering current flow away from body diodes into the channels of the first and second transistor switching elements. This and the other aspects can each optionally include one or more of the following features.

In some implementations, the controller includes zero voltage switching ZVS circuitry to control switching to occur when a voltage across the PWM-switched capacitor and the first and second switching elements is near or at zero.

In some implementations, the controller is a mixed signal implementation.

In some implementations, the controller is a digital signal implementation and includes a microcontroller, a zero-crossing detection stage having an output sent to the microcontroller, and a power stage to which the zero-crossing detection stage is coupled. The the zero-crossing detection stage includes a comparator and a current sensor (908) that produces a voltage signal for the comparator. The power stage includes gate drivers for driving the first and second transistor switching elements and signal isolation for input signals to the gate drivers generated by the microcontroller.

In some implementations, the controller is a digital signal implementation that includes starting a cycle of a switching period; detecting a zero-crossing of an input current by a zero-crossing detector when the input current is rising; scheduling the first transistor switching element to turn off at time $t_2$ where $t_2=\varphi/360°·T$ and T is a period of the input current and phase $\varphi$ sets an equivalent capacitance of the PWM-switched capacitor to approximately $$C_{eq} = C1 \cdot \frac{1}{2-(2\varphi-\sin2\varphi)/\pi};$$

scheduling the second transistor switching element to turn on at a time $t_5$, where $$t_5 = \frac{360°-\varphi}{360°} \cdot T + T_{delay}$$

and delay $T_{delay}$ is adjusted so zero-voltage switching is ensured for all operating conditions; finishing the cycle by turning on the second transistor switching element M2; turning off the first transistor switching element; detecting zero-crossing of the input current when the input current is falling; scheduling the second transistor switching element to turn off at time $t_6$, where $t_6=T/2+\varphi/360°·T$.; scheduling the second transistor switching element to turn on at time $t_9$, where $$t_9 = \frac{480°-\varphi}{360°} \cdot T + T_{del};$$

zero voltage switching first transistor switching element; turning on the first transistor switching element; turning off the second transistor switching element; detecting zero-crossing of the input current to start a next cycle when the input current is rising; scheduling switching element to turn off after $t=\varphi/360°·T$; zero voltage switching the second transistor switching element; turning on the second transistor switching element; transitioning to a start of a next cycle.

In some implementations, the first and second transistor switching elements are MOSFET devices.

In some implementations, the first and second transistor switching elements are galium nitride (GaN) or silicon carbide (SiC) transistor switching elements.

In some implementations, the controller is a gate control module for providing a first gate control signal for the first switching element and a second gate control signal for the second switching element, as well as a reference potential for a node between the gates of the first and second switching elements.

In some implementations, the PWM-switched capacitor provides an equivalent capacitance of $$Ceq = C1\frac{1}{2-(2\varphi-\sin2\varphi)/\pi}$$

where C1 is an impedance value of the capacitor and $\varphi$ is a phase delay.

In a seventeenth aspect, the disclosure features a wireless power transmission system that includes a source-side circuit and a device-side circuit. The source-side circuit includes an inverter for powering the source-side circuit, the impedance matching network the of any of the above described aspects, and a source resonator. The device-side circuit includes a device resonator a device impedance matching network, and a rectifier. The impedance matching network couples, with a coupling factor, oscillating electromagnetic energy to the device-side circuit where the oscillating electromagnetic energy is converted by the rectifier.

In some implementations, the source-side circuit includes a source resonator coil, a series capacitor, a parallel capacitor, a capacitor, and an inductor, where the capacitor is the PWM-switched capacitor.

Particular implementations of the subject matter described in this specification can be implemented so as to realize one or more of the following advantages. Implementations may reduce body-diode (or antiparallel diode) conduction times associated with power losses in switching transistors, and thereby, improve operational efficiency and/or thermal management. Implementations may permit the use of a wider array of transistors, including those having relative large forward body-diode voltage drops, for example, gallium nitride (GaN) of silicon carbide (SiC) transistors. Implementations may provide improved tolerance of input currents that have harmonic content, such as a triangular waveform, a trapezoidal waveform, a square waveform, or a waveform with sinusoidal characteristics with significant harmonic content.

Embodiments of the devices, circuits, and systems disclosed can also include any of the other features disclosed herein, including features disclosed in combination with different embodiments, and in any combination as appropriate.

The details of one or more implementations of the subject matter described in this specification are set forth in the accompanying drawings and the description below. Other features, aspects, and advantages of the subject matter will be apparent from the description, the drawings, and the claims.

BRIEF DESCRIPTION OF THE DRAWINGS

FIGS. 24A-24E are waveform diagrams showing illustrative waveforms for the circuit of FIG. 22.

FIGS. 30A-30F are waveform diagrams showing illustrative waveforms for the circuits of FIG. 22 and FIGS. 28A and 28B.

Like reference numbers and designations in the various drawings indicate like elements.

DETAILED DESCRIPTION

Figure 1:
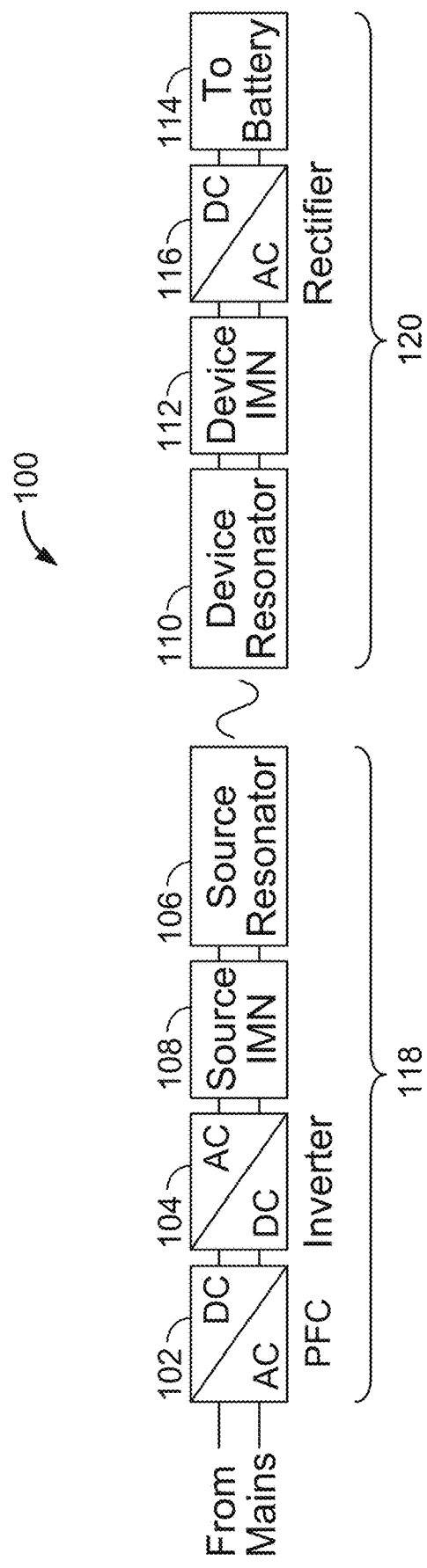
FIG. 1 is a schematic representation of a wireless energy transfer system.

In general, the disclosure features control systems and processes for controlling a variable reactive circuit component. Implementations of the present disclosure are described in the context of a circuit including a PWM-switched capacitor coupled across first and second switching elements (e.g., transistors). Implementations disclosed herein may minimize diode conduction time for external antiparallel or internal body diodes associated with the first and second switching elements. Implementations of the PWM-switched capacitor circuit can operate with sinusoidal input currents containing significantly higher harmonic content than conventional circuits. Shorting a PWM-switched capacitor when a zero voltage is not present can be undesirable and may damage the switching elements and/or increase power loss. Implementations discussed herein control the first and second switching elements to minimize the body diode conduction time (dead time) by steering current flow away from body diodes into the transistor (e.g. MOSFET) channel. In doing so, losses due to diode voltage drops are minimized. Accordingly, implementations may provide efficient circuit operation while maintaining zero voltage switching. Implementations can be implemented with a computer processor, microcontroller, digital-signal processor, FPGA, CPLD, or any other programmable processing device to generate gate control signals, in mixed signal configurations, and in digital circuitry. Furthermore, implementations of the present disclosure provide variable capacitor control that allow for efficient operation over the entire range of conditions encountered by impedance matching networks in highly-resonant wireless power transfer systems (HRWPT) system such as high-power vehicle charging systems, for example.

Control of the PWM capacitor can be implemented in several ways, such as in a mixed signal (analog and digital) implementation and/or a digital signal implementation. These implementations are described more fully below. Advantages of the disclosed implementations include the following:

In some implementations, the body-diode (or antiparallel diode) conduction time can be adjustable and significantly reduced. Such reductions in body-diode (or antiparallel diode) conduction time reduces MOSFET losses and improves efficiency and thermal management of power electronics.

In some implementations, the PWM capacitor control techniques permit the use of a wider array of transistors, including those having relative large forward body-diode voltage drops, for example, gallium nitride (GaN) of silicon carbide (SiC) transistors.

In some implementations, the PWM capacitor provides improved tolerance of input currents that have harmonic content, such as a triangular waveform, a trapezoidal waveform, a square waveform, or a waveform with sinusoidal characteristics with significant harmonic content. This is an advantage over conventional control methods that may require purely sinusoidal currents. For example, to achieve a purely sinusoidal current, filtering components can be added to the circuit, adding cost and component count. In some implementations, the PWM capacitor can tolerate transients, such as at the start-up of an associated system.

FIG. 1 shows a high level functional block diagram of an exemplary implementation of a wireless power transfer system 100 having PWM switched capacitors. Input power to the system can be provided by wall power (AC mains), for example, which is converted to DC in an AC/DC converter block 102. In some implementations, a DC voltage can be provided directly from a battery or other DC supply. In some implementations, the AC/DC converter block 102 may include a power factor correction (PFC) stage. The PFC, in addition to converting the AC input (for example, at 50 or 60 Hz) to DC, can condition the current such that the current is substantially in phase with the voltage.

A switching inverter 104 converts the DC voltage into AC voltage waveform (e.g., a high-frequency AC voltage waveform). The AC voltage waveform outputted by the inverter 104 is used to drive a source resonator 106. In some implementations, the frequency of the AC voltage waveform may be in the range of 80 to 90 kHz. In some implementations, the frequency of the AC voltage waveform may be in the range of 1 kHz to 15 MHz. In some implementations, the inverter 104 includes an amplifier.

A source impedance matching network (IMN) 108 couples the inverter 104 output to the source resonator 106. The source IMN 108 can enable efficient switching-amplifier operation. For example, class D or E switching amplifiers are suitable in many applications and can require an inductive load impedance for highest efficiency. The source IMN 108 can transform effective impedances of the source resonator as seen by the inverter 104. The source resonator impedance can be, for example, loaded by being electromagnetically coupled to a device resonator 110 and/or output load. For example, the magnetic field generated by the source resonator 106 couples to the device resonator 110, thereby inducing a corresponding voltage. This energy is coupled out of the device resonator 110 to, for example, directly power a load or charge a battery.

A device impedance matching network (IMN) 112 can be used to efficiently couple energy from the device resonator 110 to a load 114 and optimize power transfer between source resonator 106 and device resonator 110. Device IMN 112 can transform the impedance of a load 114 into an effective load impedance seen by the device resonator 110 which more closely matches the source impedance to increase system efficiency. For loads requiring a DC voltage, a rectifier 116 converts the received AC power into DC. In some implementations, the source 118 and device 120 a further include filters, sensors, and other components.

The impedance matching networks (IMNs) 108, 112 can be designed to maximize the power delivered to the load 114 at a desired frequency (e.g., 80-90 kHz, 100-200 kHz, 6.78 MHz) or to improve power transfer efficiency. The impedance matching components in the IMNs 108, 112 can be chosen and connected so as to preserve a high-quality factor (Q) value of resonators 106, 110. Depending on the operating conditions, the components in the IMNs 108, 112 can be tuned to control the power delivered for the power supply to the load 114, for example improve efficient wireless transfer of power.

The IMNs (108, 112) can have components including, but not limited to, a capacitor or networks of capacitors, an inductor or networks of inductors, or various combinations of capacitors, inductors, diodes, switches, and resistors. The components of the IMNs can be adjustable and/or variable and can be controlled to affect the efficiency and operating point of the system. Impedance matching can be performed by varying capacitance, varying inductance, controlling the connection point of the resonator, adjusting the permeability of a magnetic material, controlling a bias field, adjusting the frequency of excitation, and the like. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage, and power. The elements can be chosen to be high-Q elements.

Control circuitry in a source 118 and/or device 120 monitors impedance differences between the source 118 and the device 120 and provides control signals to tune respective IMNs 108, 112 or components thereof. In some implementations, the IMNs 108, 112 can include a fixed IMN and a dynamic IMN. For example, a fixed IMN may provide impedance matching between portions of the system with static impedances or to grossly tune a circuit to a known dynamic impedance range. In some implementations, a dynamic IMN can be further composed of a coarsely adjustable components and/or finely adjustable components. For example, the coarsely adjustable components can permit coarse impedance adjustments within a dynamic impedance range whereas the finely adjustable components can be used to fine tune the overall impedance of the IMN(s). In another example, the coarsely adjustable components can attain impedance matching within a desirable impedance range and the finely adjustable components can achieve a more precise impedance around a target within the desirable impedance range.

Figure 2:
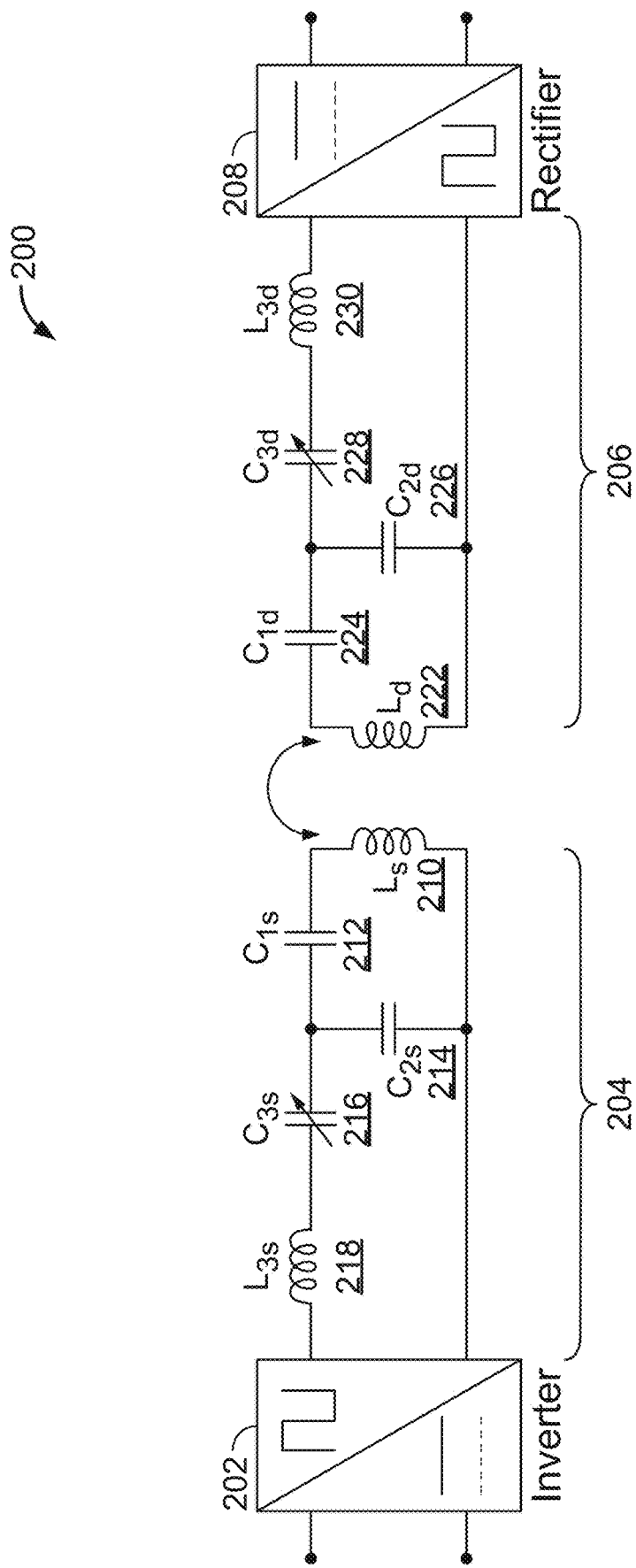
FIG. 2 is a schematic circuit representation of wireless energy transfer system including an illustrative impedance matching network(IMN) having one or more tunable capacitors.

FIG. 2 shows an exemplary embodiment of a wireless power transmission system 200 having an inverter 202 powering source-side circuit (which includes source resonator and source IMN) 204, which couples, with coupling factor k, oscillating electromagnetic energy to the device-side circuit (which includes device resonator and device IMN) 206. This oscillating energy is then converted by the rectifier 208. The source-side circuit 204 components include source resonator coil $L_s$ 210, series capacitor $C_{1s}$ 212 (in position 1), parallel capacitor $C_{2s}$ 214 (in position 2), and capacitor $C_{3s}$ 216 and inductor $L_{3s}$ 218 (in position 3). In the illustrative embodiment, capacitor $C_{3s}$ 216 can include one or more variable capacitors. For example, the variable capacitor can be a pulse width modulation (PWM) controlled capacitor. Note the each of the components listed may represent networks or groups of components and that components in at least position 1 and 3 can be balance. The device-side circuit 206 components can include device resonator coil $L_d$ 222, series capacitor $C_{1d}$ 224 (in position 1), parallel capacitor $C_{2d}$ 226 (in position 2), and capacitor $C_{3d}$ 228 and inductor $L_{3d}$ 230 (in position 3). The capacitor $C_{3d}$ 228 can be include one or more variable capacitors, such as a PWM capacitor. The PWM switched capacitors 216, 228 can promote efficient wireless energy transfer, as described more fully below.

IMNs 108 and 112 can have a wide range of circuit implementations with various components having impedances to meet the needs of a particular application. For example, U.S. Pat. No. 8,461,719 to Kesler et al., which is incorporated herein by reference in its entirety, discloses a variety of tunable impedance network configurations, such as in FIGS. 28a-37b. In some implementations, each of the components shown in FIG. 2 may represent networks or groups of components. In addition, while illustrative embodiments are shown and described in conjunction with highly resonant wireless energy transfer systems, implementations of PWM switched components described herein are applicable to a wide range of applications in which it is desirable to achieve a given equivalent impedance and minimize diode conduction times.

Figure 3B:
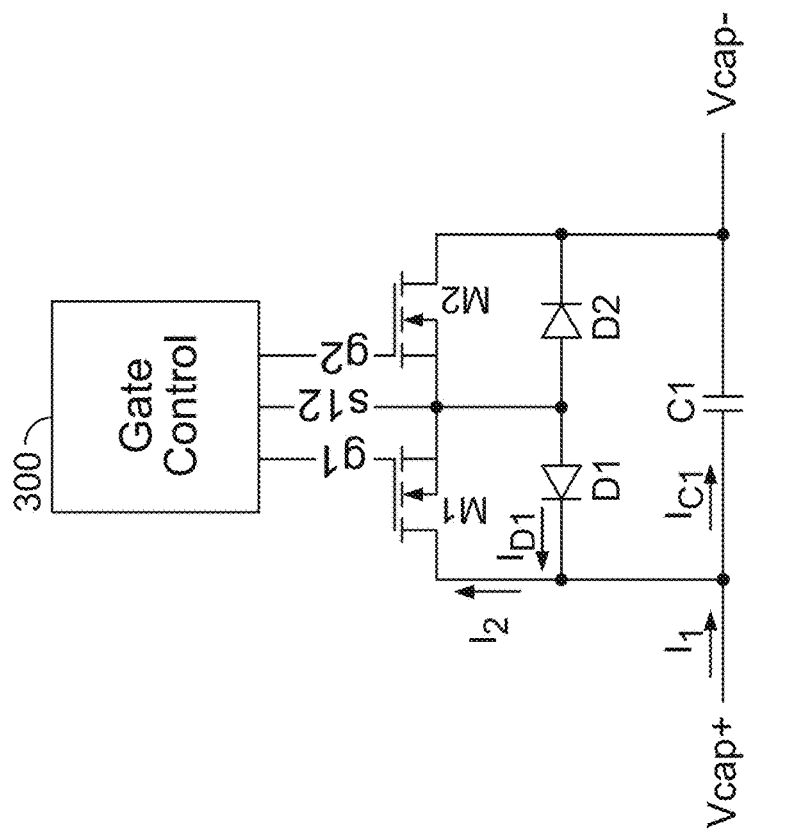
FIG. 3A-3B shows schematic representations of a PWM capacitor.
Figure 3A:
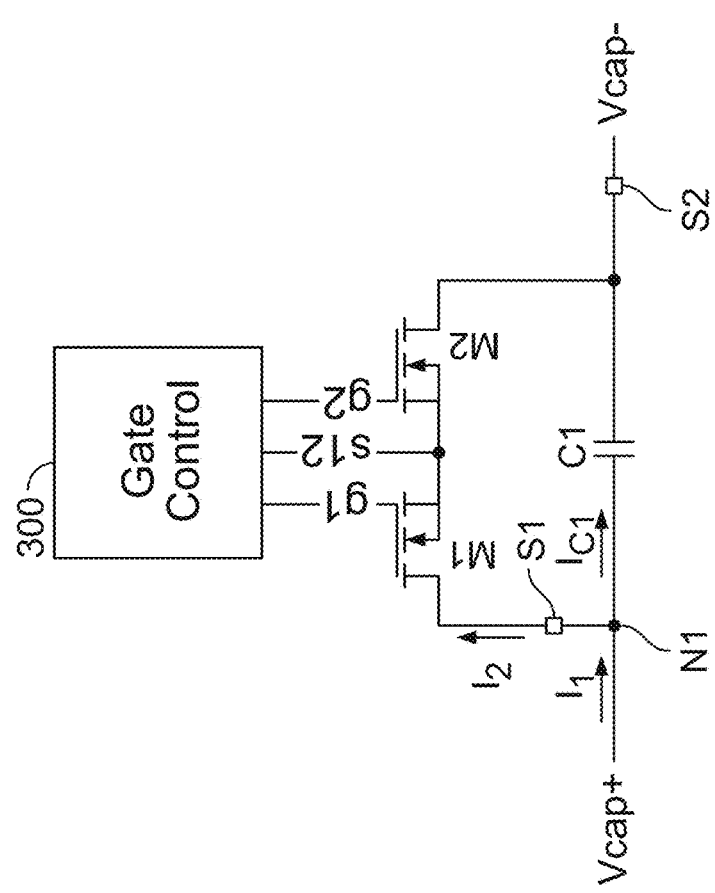

FIG. 3A shows an illustrative circuit implementation of a PWM-switched capacitor C1. In some implementations, an equivalent capacitance can be determined as $$Ceq = C1 \frac{1}{2 - (2\varphi - \sin 2\varphi)/\pi},$$

where C1 is an impedance value of the capacitor and $\varphi$ is an input phase delay, as described more fully below.

First and second switching elements M1, M2 are coupled back-to-back across or in parallel to capacitor C1. The first and second switching elements M1, M2 can be MOSFET devices. A gate control circuitry 300 provides a first gate control signal g1 for the first switching element M1 and a second gate control signal g2 for the second switching element M2. In some implementations, gate control circuitry 300 provides a reference potential s12 for a node between the gates of the first and second switching elements M1, M2.

Input current $I_1$ flows into a first node N1 and current $I_{C1}$ flows out of the first node to capacitor C1. Current $I_2$ flows out of the first node N1 into the drain terminal of the first switching element M1. The capacitor C1 is coupled between the $V_{cap+}$ and $V_{cap-}$ nodes to define the voltage across the capacitor. In some implementations, the circuit can include a first sensor S1 to sense MOSFET body diode conduction and a second sensor S2 to sense current through the switched capacitor, as described more fully below. In some implementations, the switching elements M1, M2 may be silicon MOSFETs. FIG. 3B shows the circuit of FIG. 3A with external diodes D1, D2 positioned in antiparallel configuration relative to M1, M2. These diodes D1, D2 can be external diodes or the body diodes of switching elements M1, M2, as such the term "body-diodes" is used herein to refer collectively to both a power transistor body-diode or an external antiparallel diode associated with a transistor as shown in FIGS. 3A and 3B. The switching elements can include, but are not limited to silicon transistors, silicon carbide transistors, gallium nitride transistors, MOSFET (metal oxide semiconductor field-effect transistors), IGBT (insulated-gate bipolar transistors), JFET (junction gate field-effect transistor), or BJT (bipolar junction transistors).

Mixed-Signal Implementation

Figure 4:
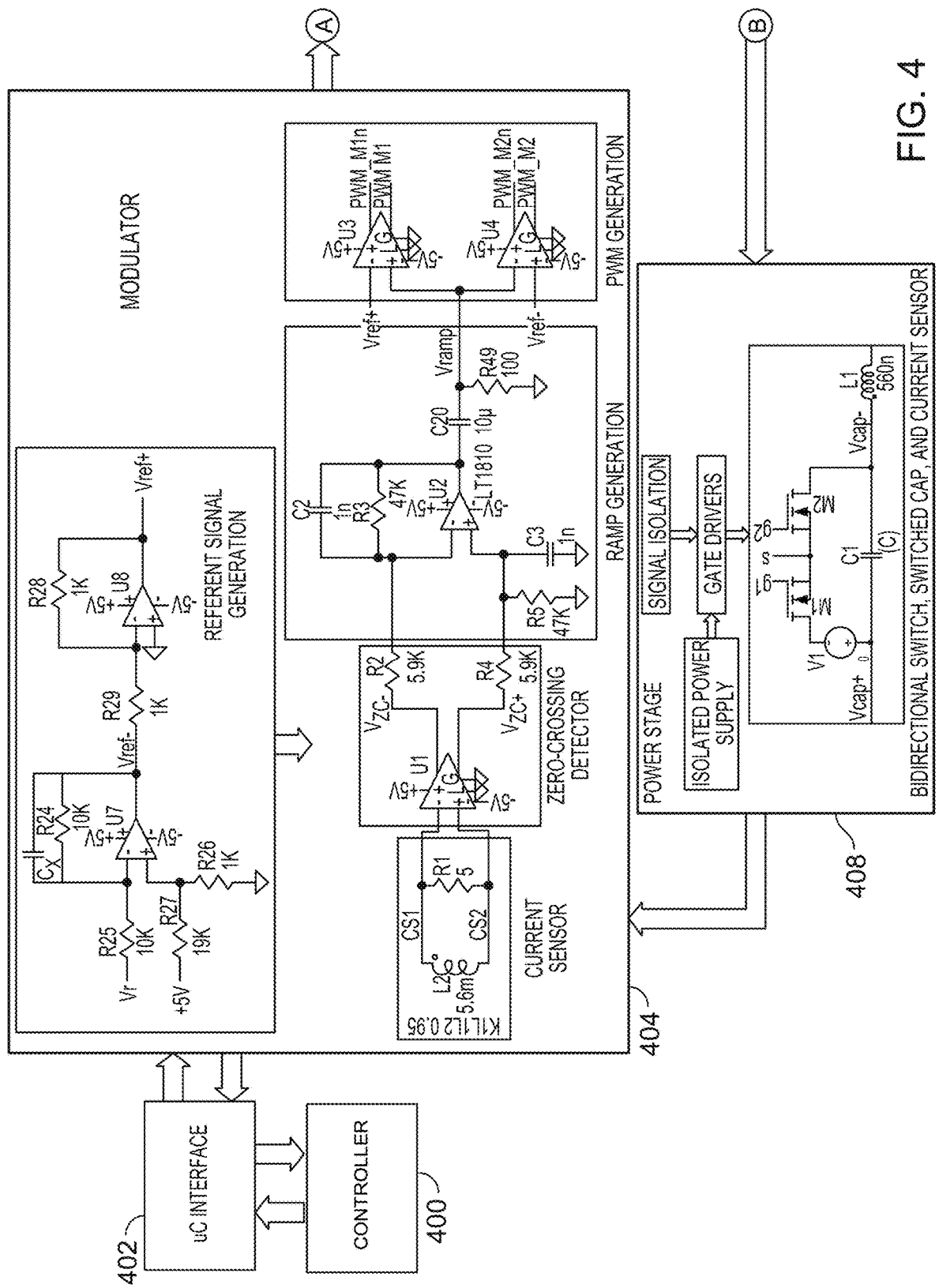
FIG. 4 is a diagrammatic representation of mixed signal implementation of the control of a PWM capacitor.
Figure 4:
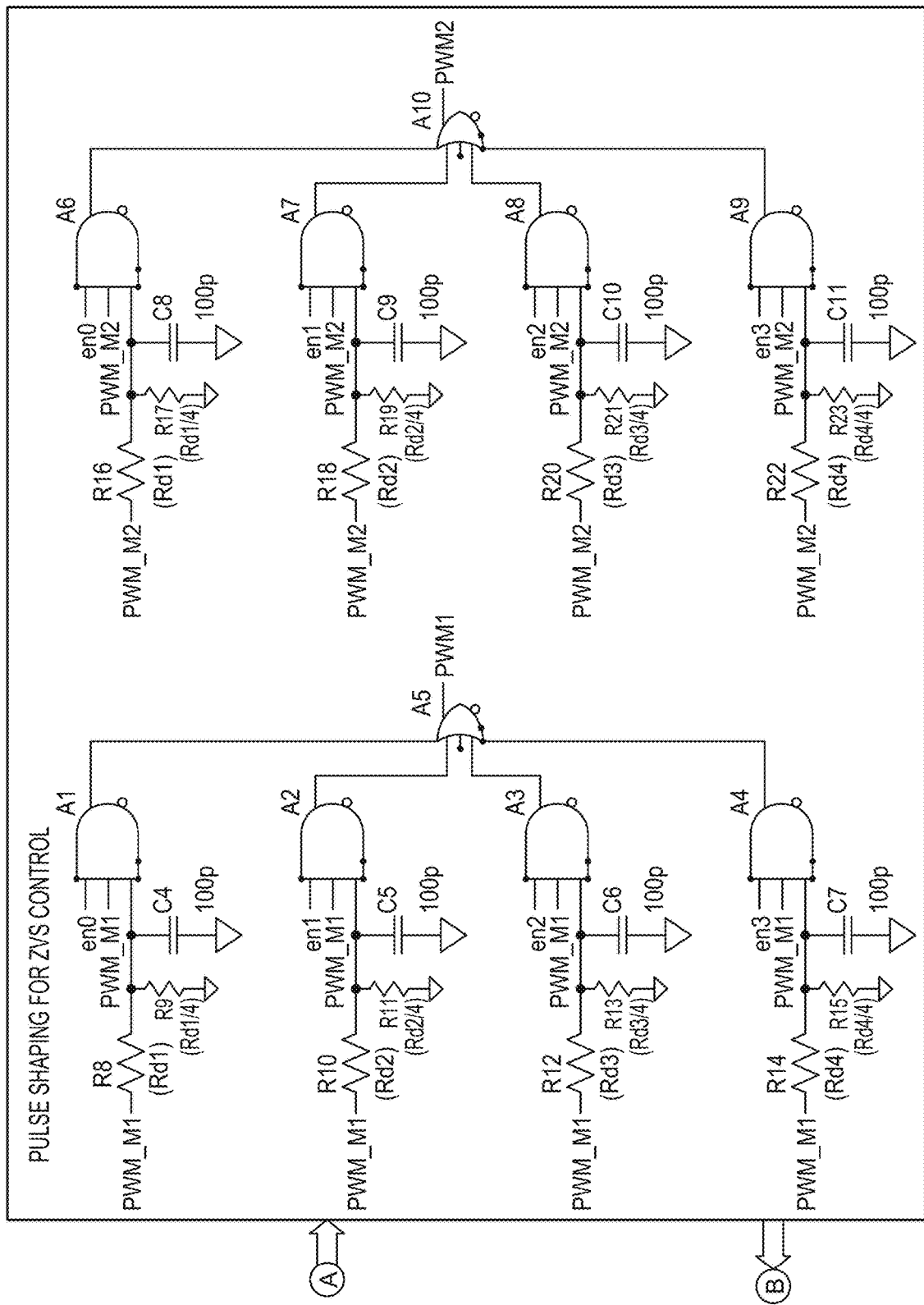

FIG. 4 shows a diagram of an exemplary embodiment of a mixed-signal implementation of the control of a PWM capacitor. This implementation includes a controller 400 in communication with a controller interface 402, which is in communication with modulator 404. The modulator 404 communicates with pulse shaping circuit 406 for zero voltage switching (ZVS) control. The pulse shaping circuit 406 communicates with power stage 408, which communicates with the modulator 404. These blocks are described further below.

Figure 5A:
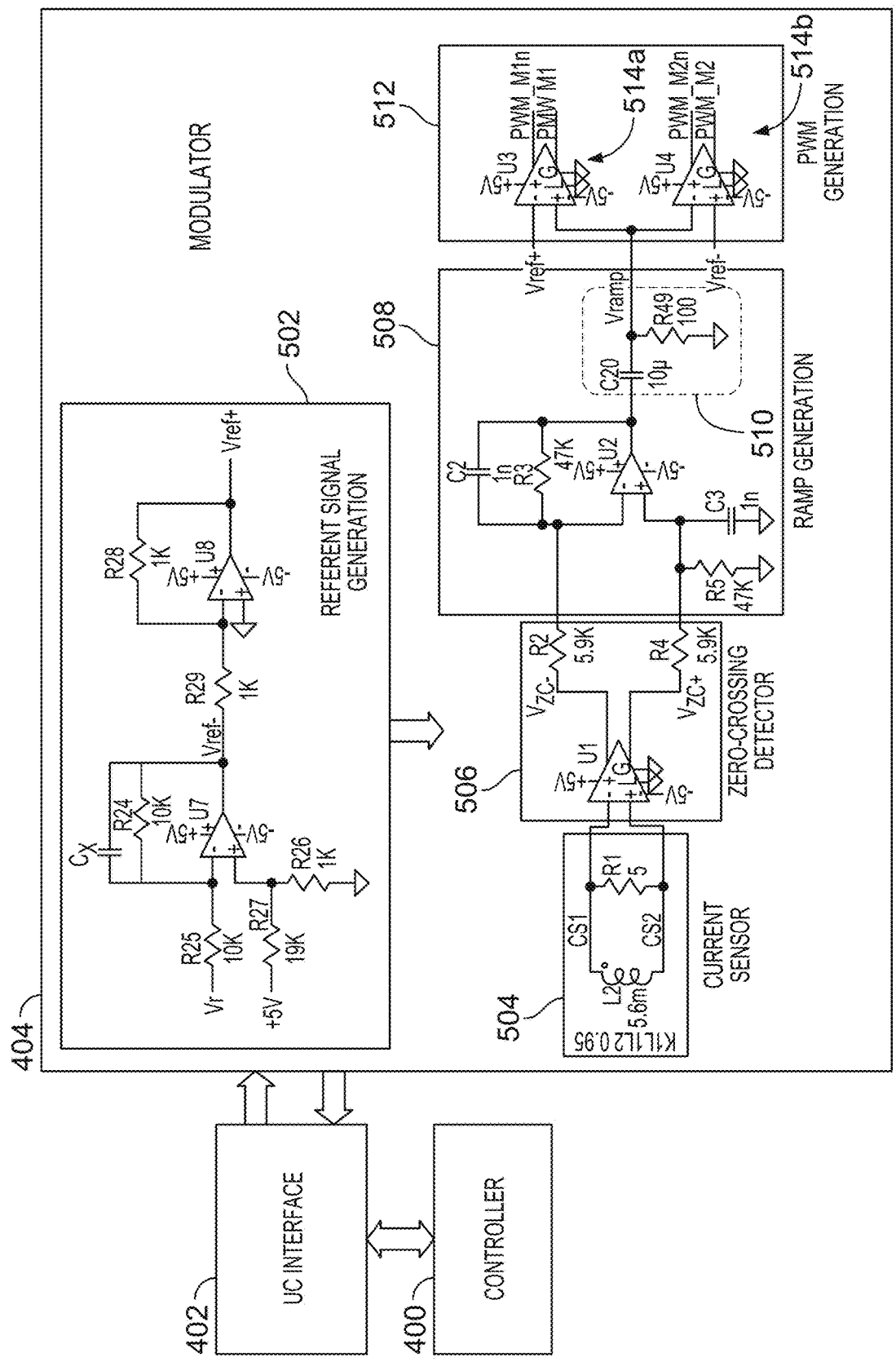
FIG. 5A is a diagrammatic representation of a modulator of the mixed signal implementation of FIG. 4.

FIG. 5A shows a diagram of an exemplary embodiment of the controller interface 402 and modulator 404 of FIG. 4. The modulator stage can include reference signal generation, current sensor output, zero-crossing detection, ramp generation, and PWM generation. A microcontroller (μC) sets control signal $V_r$ which is used to control the equivalent capacitance of the PWM capacitor. Control signal $V_r$ can be a DC voltage signal or pulse-width of modulated signal with average voltage $V_{ref}$. Reference signal generator 502 creates $V_{ref+}$ and $V_{ref-}$ voltages that have approximately the same absolute value but opposing sign. The output of current sensor 504 is provided to the zero-crossing detector 506. The output of the current sensor 504 is a generally sinusoidal signal that represents input current $I_1$ to the PWM capacitor. In some implementations, $I_1$ can have significant harmonic content. Zero-crossing detector 506 detects zero-crossings of the current $I_1$.

Zero-crossing detector 506 outputs a square-wave signal $V_{zc}=V_{zc-}-V_{zc+}$. In other words, the output of the zero-crossing detector 506 can be, for example, a signal with +5V amplitude when $I_1$ is negative and −5V amplitude when $I_1$ is positive. Ramp generator 508 converts square-wave signal $V_{zc}$ to a ramp signal $V_{ramp}$ using, for example, an integrator circuit. Ramp generator 508 provides a ramp signal that a positive slope when the current $I_1$ is positive and a negative slope when the current $I_1$ is negative. In addition, the peaks of the ramp signal may correspond to zero-crossings of current $I_1$, as shown in subplot III of FIG. 5B.

High-frequency filter 510, composed of C20 and R49, eliminates any DC bias that may exist at the output of operational amplifier U2. PWM generation 512 creates switching functions PWM_M1 and PWM_M2 that control the switching elements M1 and M2. Two comparators 514a, 514b are used to produce these signals from $V_{ramp}$, $V_{ref+}$, and $V_{ref-}$.

Figure 5B:
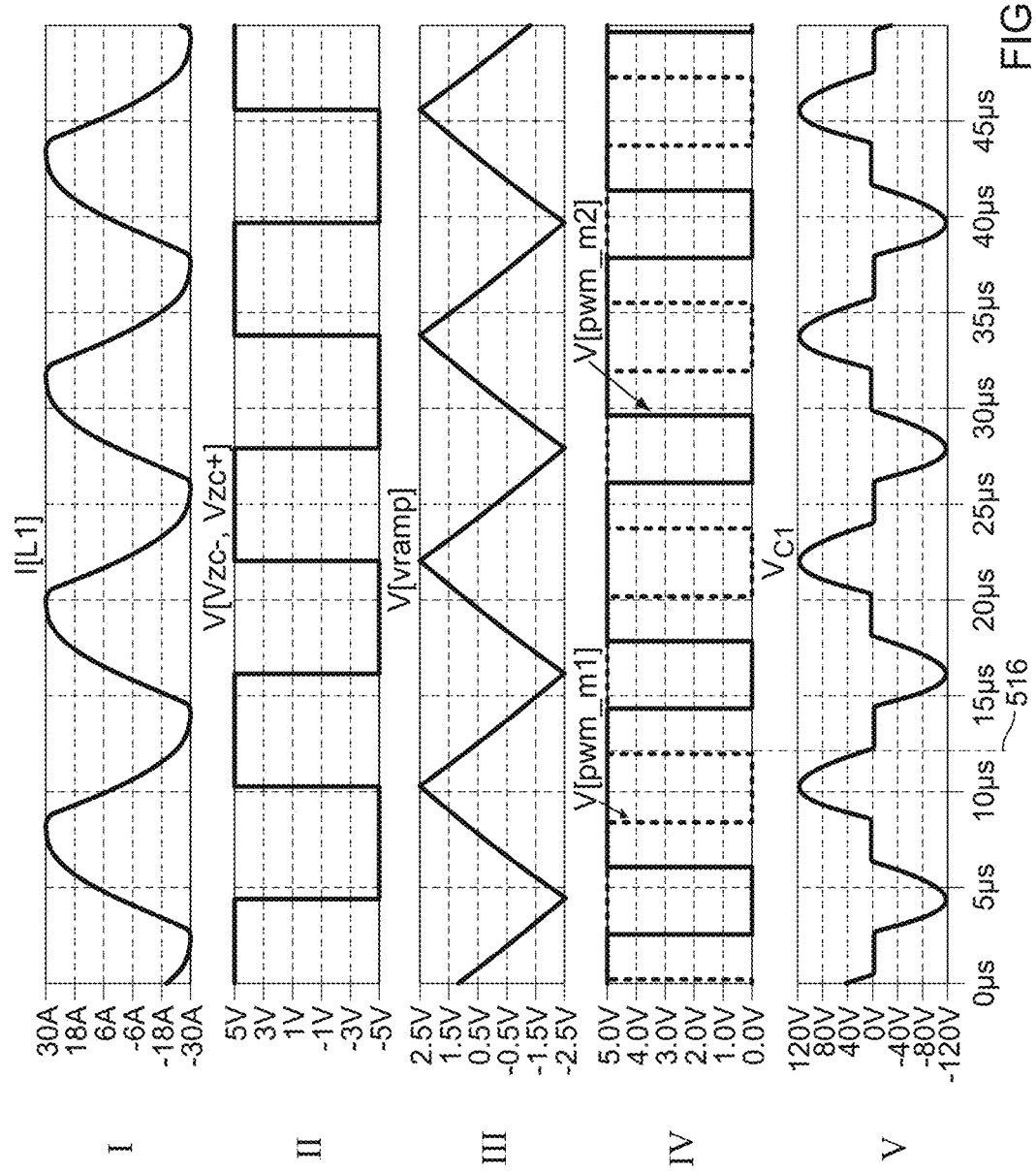
FIG. 5B is a graphical representation showing waveforms associated with the modulator of FIG. 5A.

FIG. 5B shows plots of waveforms of modulator 404 as described in FIG. 5A. Subplot I shows current measurement I(L1) at current sense transformer L1 in the power stage 408, further described below. Note that this current is not purely sinusoidal and has some harmonic content. In some embodiments, the current may be stepped down using a transformer (as indicated by L1:L2 in FIG. 5A) with a ratio of 1:100 (or similar), so that the current can be handled by the components in the modulator circuit. Subplot II shows a voltage measurement $V(V_{zc-}, V_{zc+})$ between nodes $V_{zc-}$ and $V_{zc+}$ at the zero-crossing detector 506. Subplot III shows voltage measurement V(Vramp), having a triangular waveform, at the output of the ramp generator 508. Subplot IV shows voltage measurement V(PWM_M1), in a dashed line, at the output of the PWM generation comparator 514a and V(PWM_M2), in a solid line, at the output of the PWM generation comparator 514b. Subplot V shows voltage waveform $V_{c1}$ of a voltage measurement between nodes $V_{cap+}$ and $V_{cap-}$ and thus, the effective capacitance measured between nodes $V_{cap+}$ and $V_{cap-}$. This effective capacitance includes the contributions of capacitance C1 and switching elements M1 and M2. Line 516 shows that, in some implementations, the rising edge of switching element M1 turn-on signal has to be delayed for ZVS operation of switching element M1.

Figure 6A:
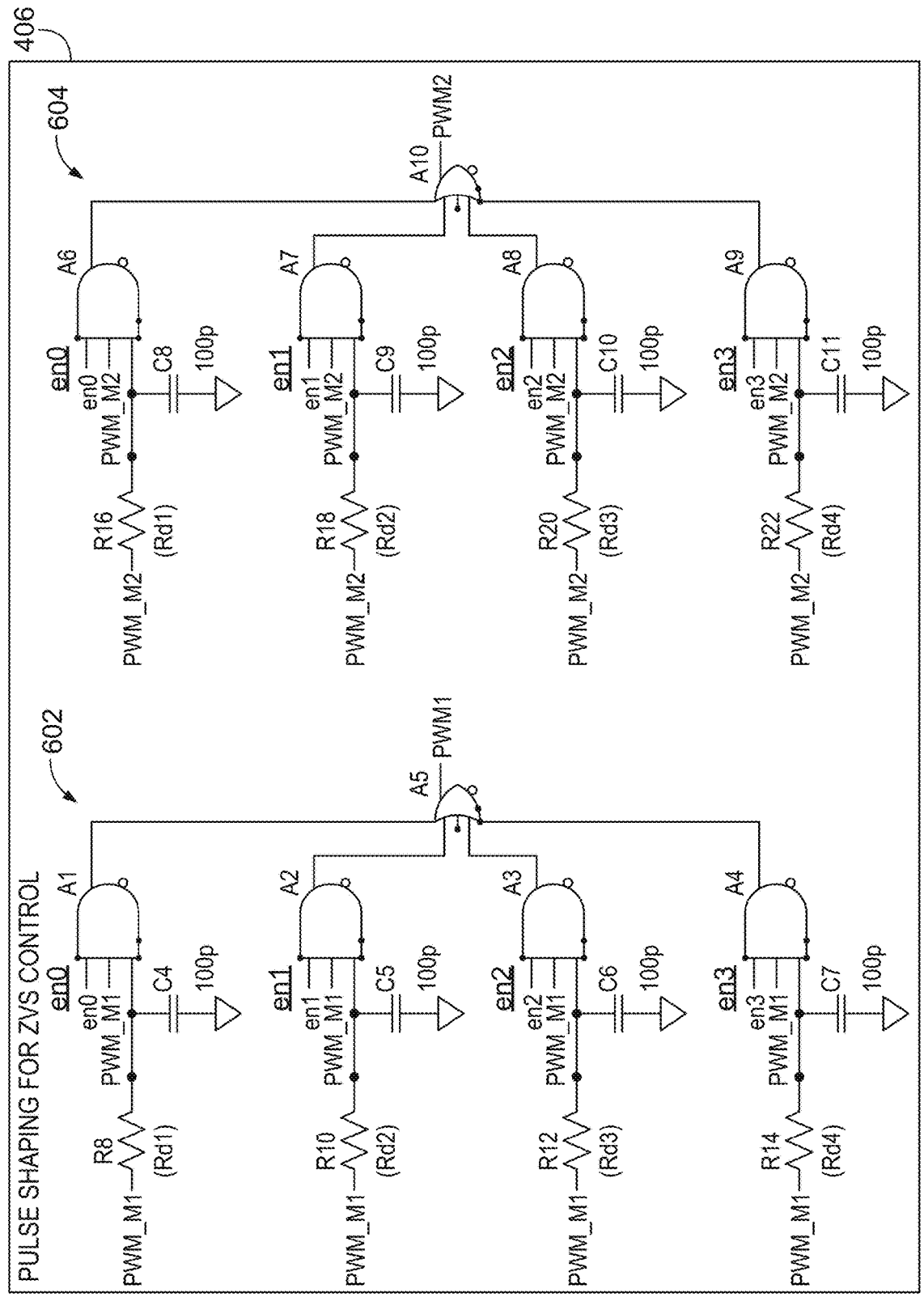
FIG. 6A is a diagrammatic representation of a pulse shaping circuitry of the mixed signal implementation of FIG. 4.

FIG. 6A shows a diagram of an exemplary embodiment of pulse shaping circuitry 406 for ZVS control of FIG. 4. The pulse shaping circuitry 406 includes subcircuit 602 with output PWM1 and subcircuit 604 with output PWM2. In some implementations, inputs PWM_M1 and PWM_M2 may not be used to directly drive switching elements M1 and M2 due to a possible non-zero voltage condition at turn-on on capacitor C1. Thus, signals PWM_M1 and PWM_M2 may be conditioned by subcircuits 602 and 604 to create desirable signals PWM1 and PWM2, respectively, which are then used to drive switching elements, M1, M2. In some implementations, subcircuits 602, 604 act as multiplexers with selection signals en0 to en3.

For example, turning on switching elements M1, M2 at non-zero voltage of capacitor C1 may lead to excessive losses, physical damage to switching elements, or both. Pulse shaping circuit 406 can condition signals PWM_M1 and PWM_M2 by delaying turn-on edge of PWM_M1 and PWM_M2 such that zero-voltage turn-on of M1 and M2 can be achieved. Manually adjustable pulse shaping circuit can be configured adjust the ZVS condition on-the-fly for different input currents $I_1$. Note that ZVS can be manually adjustable by activating any of the selection signals en0 to en3. The body diode of a MOSFET is on before ZVS turn-on. The conduction time of body-diode is greatly reduced from conventional operation but it is not minimal. As shown, pulse shaping circuit 406 is implemented using logic gates, however, in some implementations, a digital multiplexer circuit can also be used to achieve similar results.

Figure 6B:
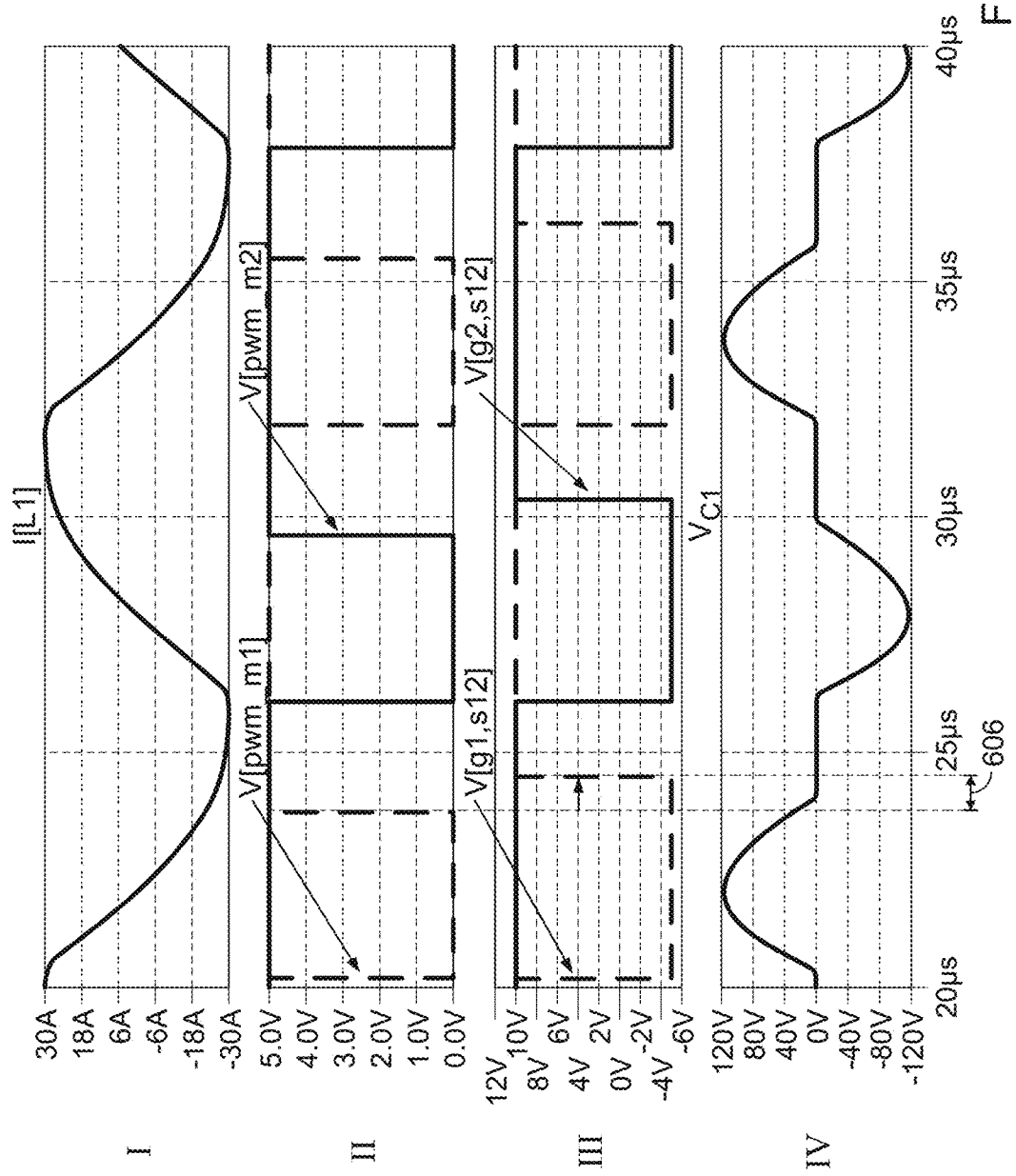
FIG. 6B is a graphical representation showing waveforms associated with the modulator of FIG. 6A.

FIG. 6B shows plots of waveforms of pulse shaping circuitry 406 as described in FIG. 6A. Subplot I shows current measurement I(L1) at L1 of the current transformer. The current sense transformer includes L1 (at the power stage 408) and L2 (at the modulator 404). Subpolt II shows voltage measurement V(PWM_M1), in a dashed line, at the input of subcircuit 602 and V(PWM_M2), in a solid line, at the input of subcircuit 604. Subplot III shows voltage waveforms of voltage measured V(g1,s12) between gate control signal g1 and reference potential s12 in a dashed line and voltage measured V(g2,s12) between gate control signal g1 and reference potential s12 in a solid line. Subplot IV shows voltage waveform $V_{C1}$ of a voltage measurement between nodes $V_{cap+}$ and $V_{cap-}$ and thus, the effective capacitance measured between nodes $V_{cap+}$ and $V_{cap-}$. Window 606 shows the delay in the turn-on of M1 such that ZVS is achieved for $I_1$ currents that differ from a purely sinusoidal signal.

Figure 7A:
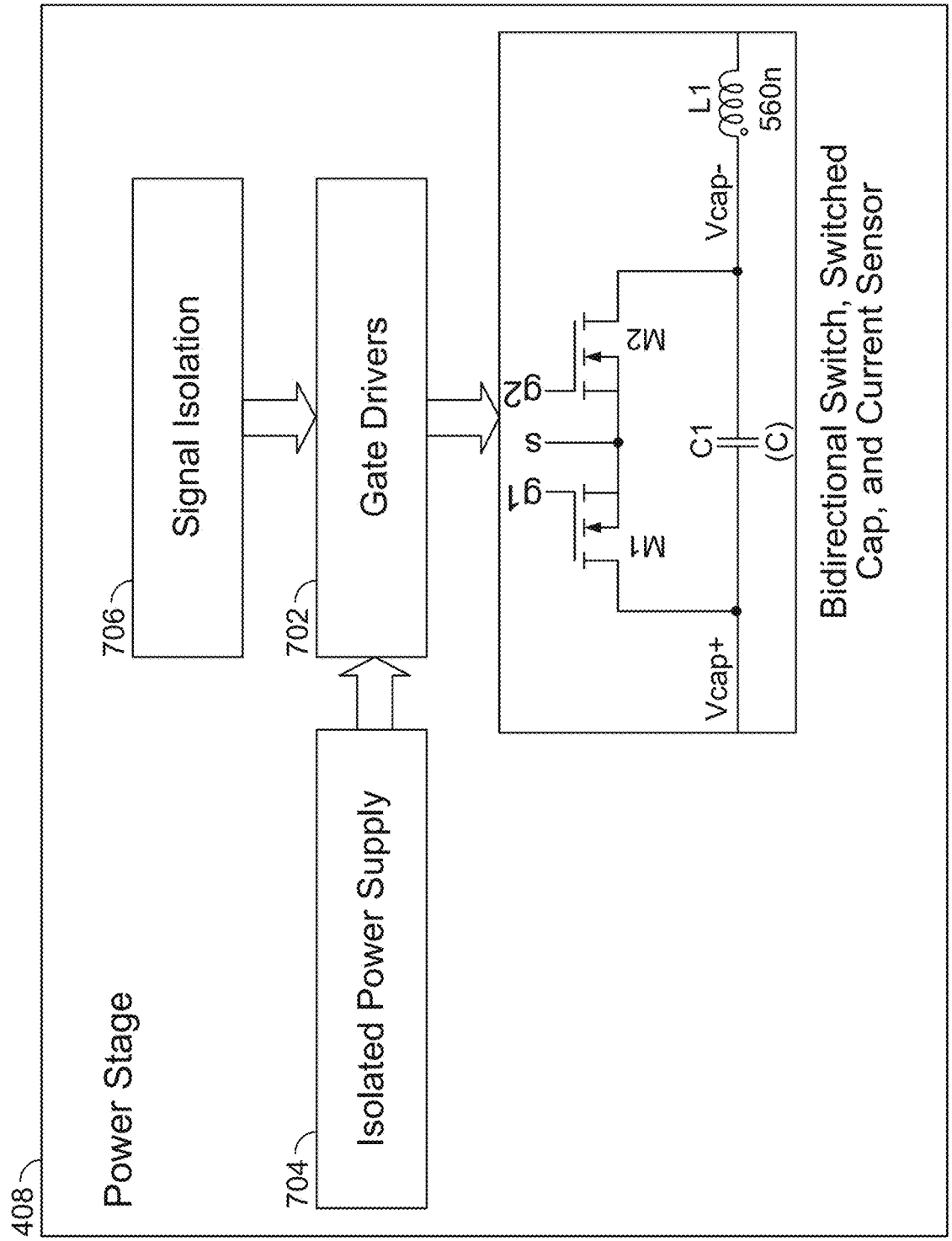
FIG. 7A is a diagrammatic representation of a power stage of the mixed signal implementation of FIG. 4.

FIG. 7A shows a diagram of an exemplary embodiment of power stage 408 of FIG. 4. The power stage 408 contains capacitor C1, back-to-back switching element pair M1 and M2, current sensor (current sense transformer) L1 that measures the current through PWM capacitor ($I_1$), gate drivers 702 that drive M1 and M2, isolated power supply 704 for gate drivers, signal isolation 706 for gate driver input signal. The input signals are generated by the modulator 404 and pulse shaping 406 stages. In some implementations, the current sense signal form L1 is supplied to modulator 404.

Figure 7B:
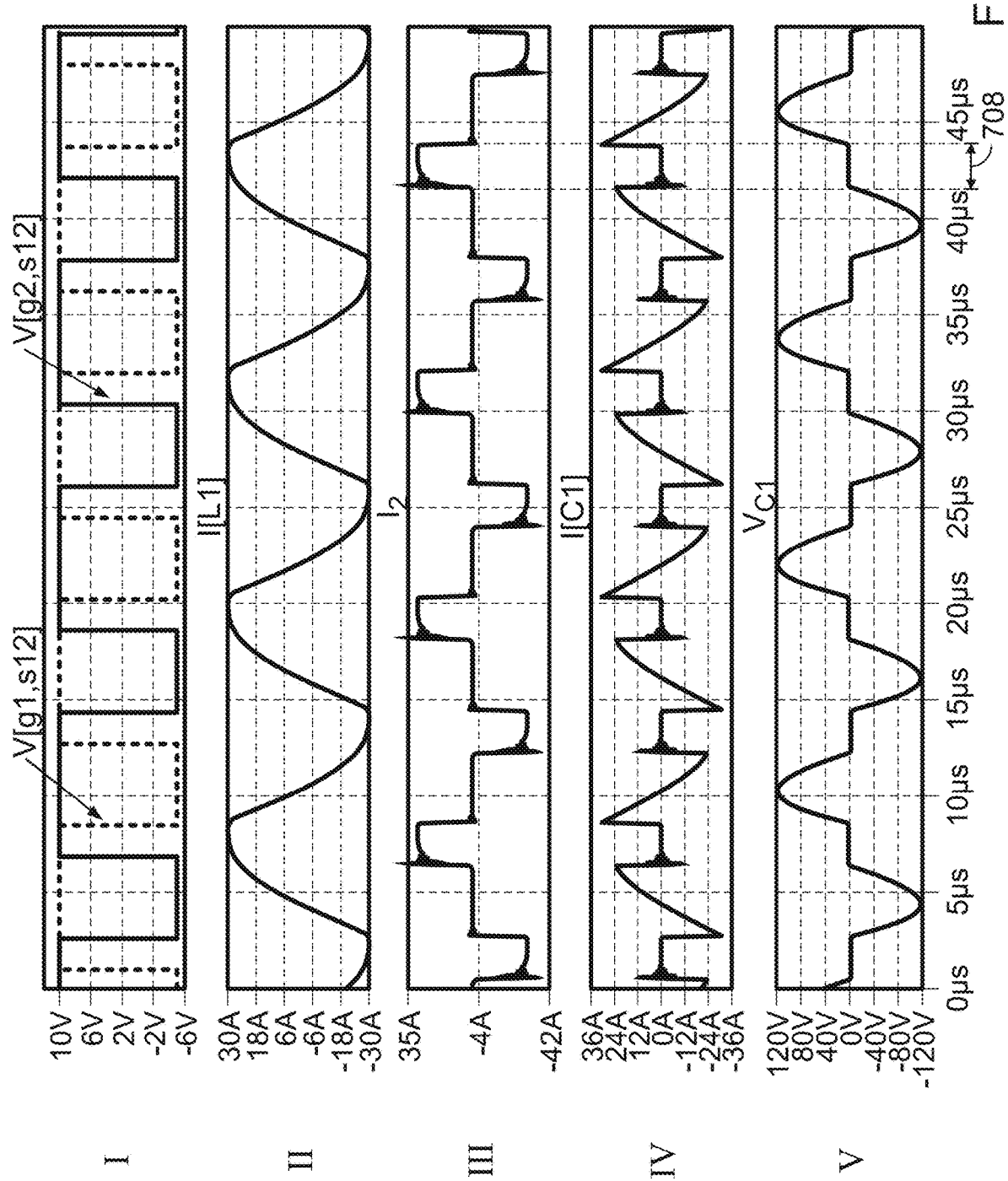
FIG. 7B is a graphical representation showing waveforms associated with the modulator of FIG. 6A.

FIG. 7B shows plots of waveforms of power stage 408 as described in FIG. 7A. Subplot I shows voltage waveforms of voltage simulated V(g1,s12) between gate control signal g1 and reference potential s12 in a dashed line and voltage measured V(g2,s12) between gate control signal g2 and reference potential s12 in a solid line. Voltage waveforms V(g1,s12) and V(g2,s12) overlap in amplitude but are shifted by 180 degrees or a half of the switching period relative to one another such that the positive half cycle of V(C1) is symmetrical to negative half cycle of V(C1). Subplot II shows a current waveform I(L1) at the current sense transformer L1 (see power stage 408 in FIG. 5C). This current is not purely sinusoidal and has some harmonic content. Subplot III shows a current waveform of $I_2$ that flows out of the first node N1 into the drain terminal of the first switching element M1. Subplot IV shows a current waveform I(C1) showing that input current flows through capacitor C1 and is then diverted to switching elements M1 and M2 when both switching elements are turned on. Subplot V shows voltage waveform $V_{C1}=V_{cap+}-V_{cap-}$ between nodes $V_{cap+}$ and $V_{cap-}$ and thus, the effective capacitance measured between nodes $V_{cap+}$ and $V_{cap-}$. This effective capacitance includes the contributions of capacitance C1 and switching elements M1 and M2.

In some implementations, the overlap of the gate signals, Vsg1 and Vgs2, can be controlled from zero overlap to complete overlap. When the overlap is zero, all of the input current $I_1$ flows through capacitor C1 such that the effective capacitance of the PWM capacitor is the value of C1. When the gate signal overlap is complete, all of the input current $I_1$ flows through the switching elements M1, M2 only. The effective capacitance of the PWM capacitor equals infinity (due to the short circuit effect and thus having an infinitely large capacitance at the frequency of switching). Because the control circuit is able to control the overlap, effective PWM capacitor capacitances from the value of C1 to infinity can be generated.

Figure 7C:
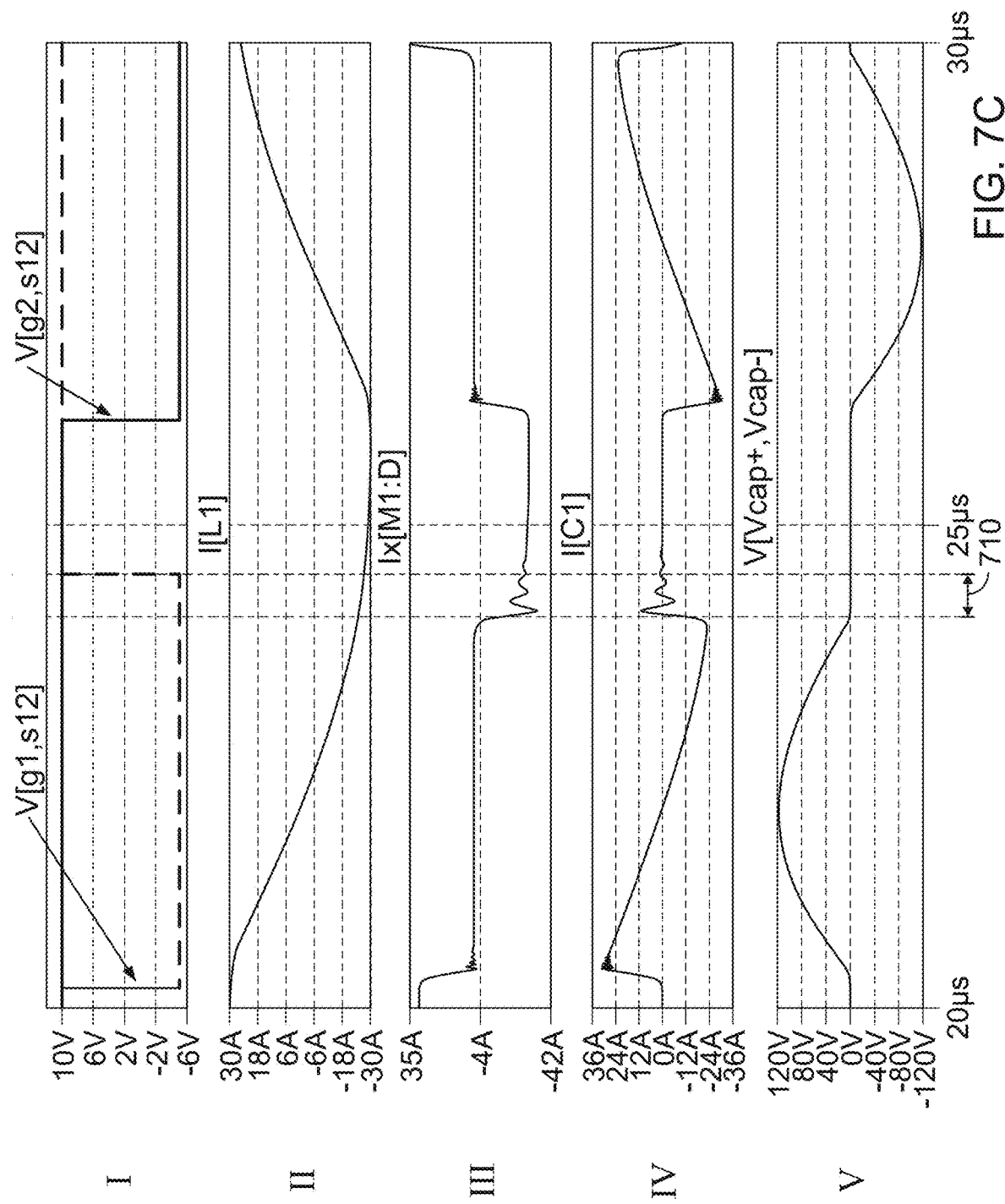
FIG. 7C is a zoomed in view of the graphical representation shown in FIG. 7B.

FIG. 7C shows a zoomed-in view of waveforms of FIG. 7A. Note that subplots I-V in FIG. 7C correspond to zoomed-out views of subplots I-V in FIG. 7B. Window 710 shows that body diode conduction time is greatly reduced.

Figure 8A:
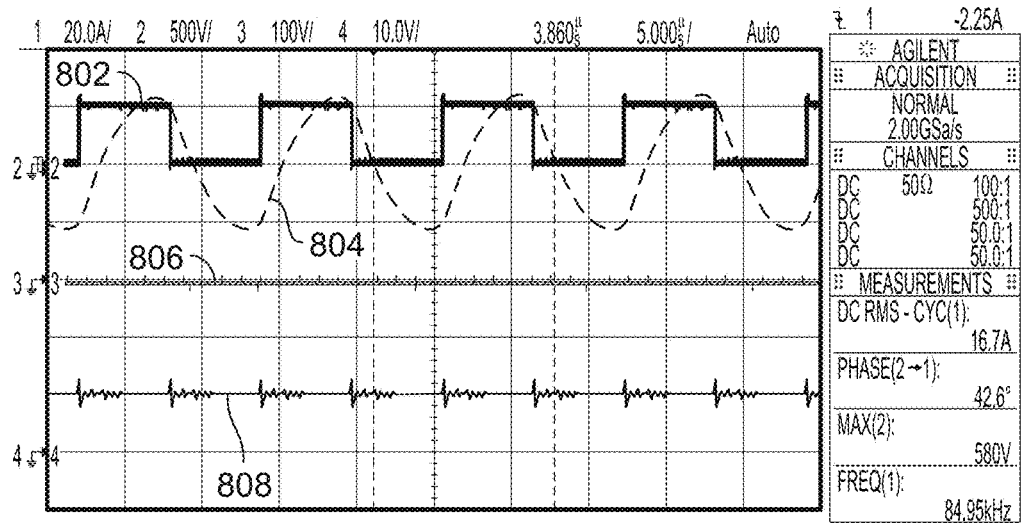
FIGS. 8A-8F are graphical representations of measured waveforms associated with a mixed signal implementation of the control of a PWM capacitor.
Figure 8B:
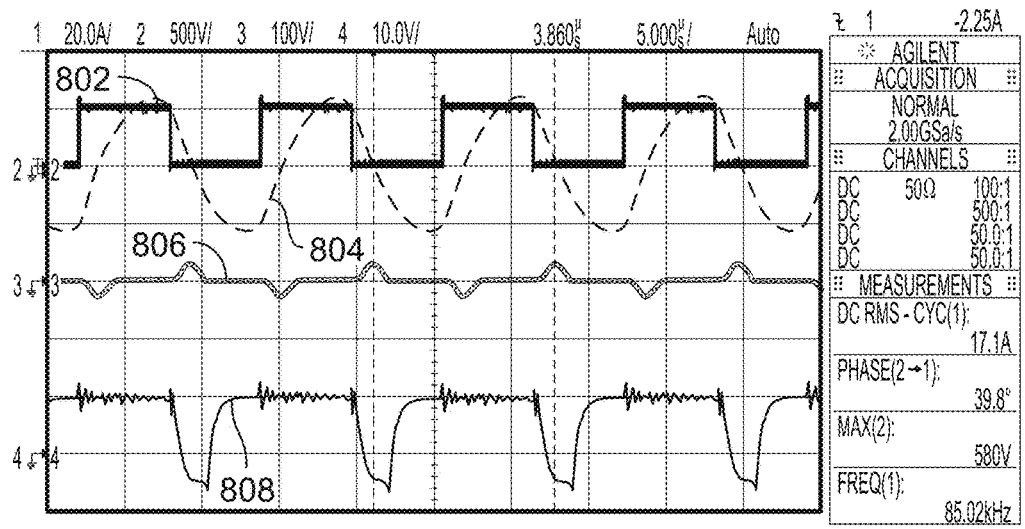
Figure 8C:
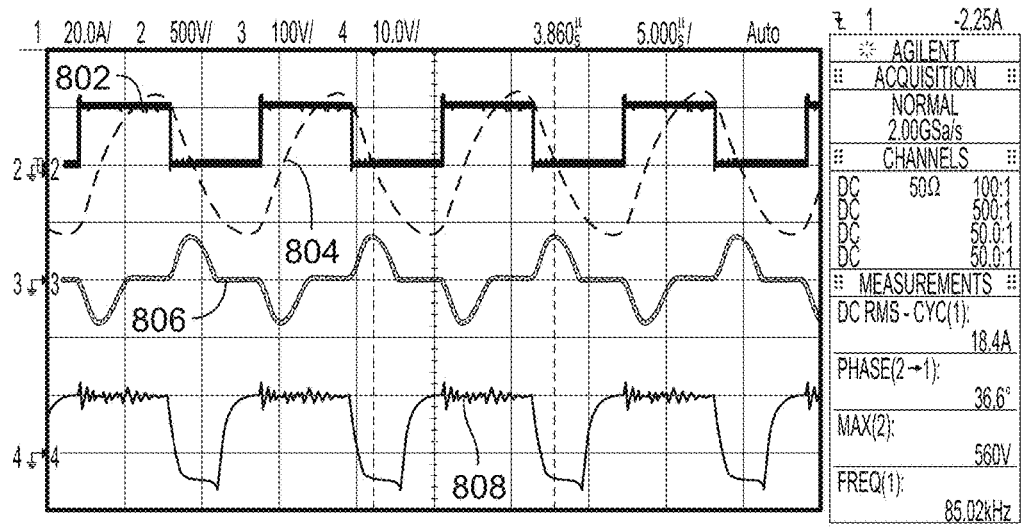

FIGS. 8A-8F show measurements made from an exemplary embodiment of a mixed signal implementation of the control of a PWM capacitor. The measurements include absolute voltage $V_{ab}$ 802 at the output of the inverter 202 of approximately 500 V/div, input current $I_1$ 804 of approximately 20 A/div, voltage $V_{C1}$ 806 of approximately 100 V/div at capacitor C1, and voltage measurement $V_{gs1}$ 808 of 10 V/div between gate g1 and reference s. In this embodiment, the power level is maintained approximately between 6 kW and 12 kW. As reference voltage $V_{ref}$ is adjusted, the effective capacitance changes (as indicated by $V_{C1}$). FIG. 8A shows a $V_{ref}$ of 2.5 V. FIG. 8B shows a $V_{ref}$ of 1.4 V. FIG.

Figure 8D:
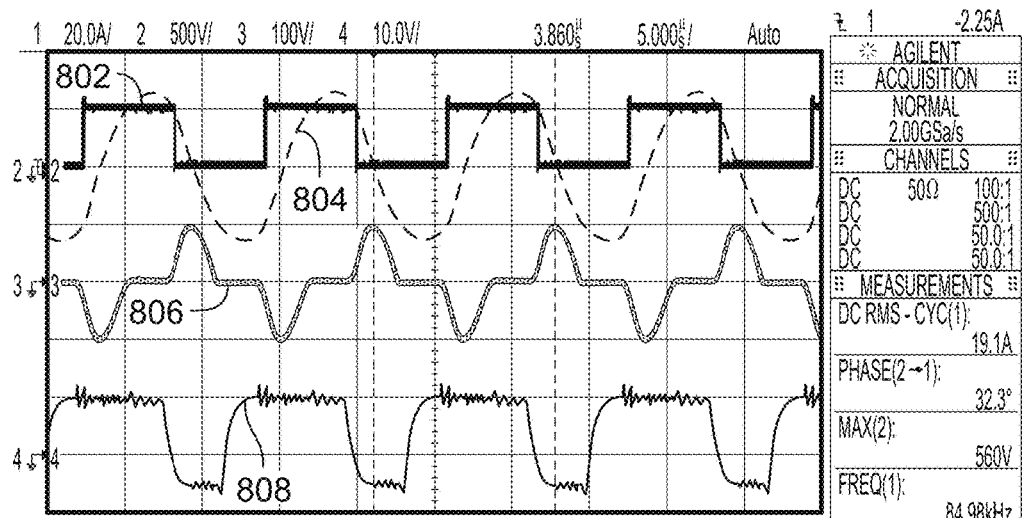
Figure 8E:
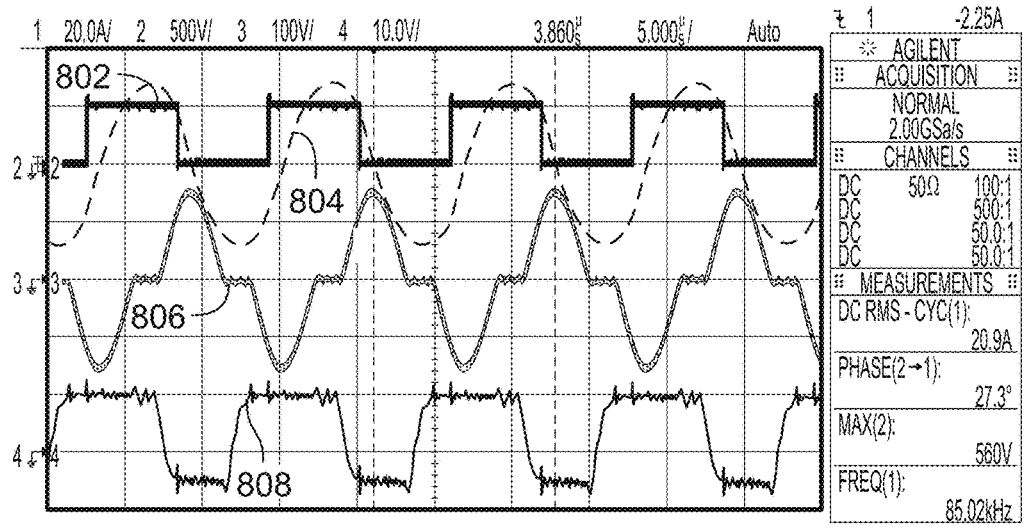
Figure 8F:
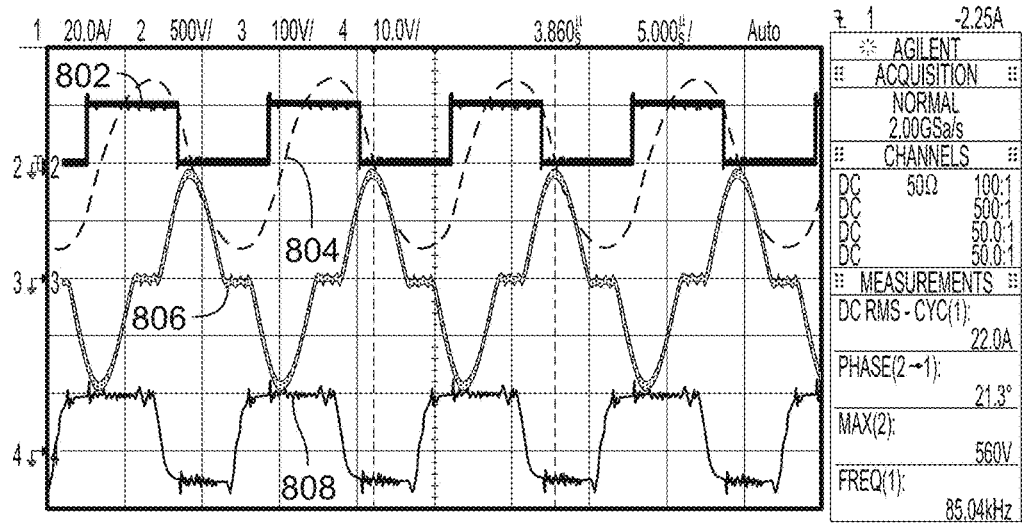

8C shows a $V_{ref}$ of 1 V. FIG. 8D shows a $V_{ref}$ of 0.8 V. FIG. 8E shows a $V_{ref}$ 0.5 V. FIG. 8F shows a $V_{ref}$ of 0.3 V.

Digital Implementation

Figure 9:
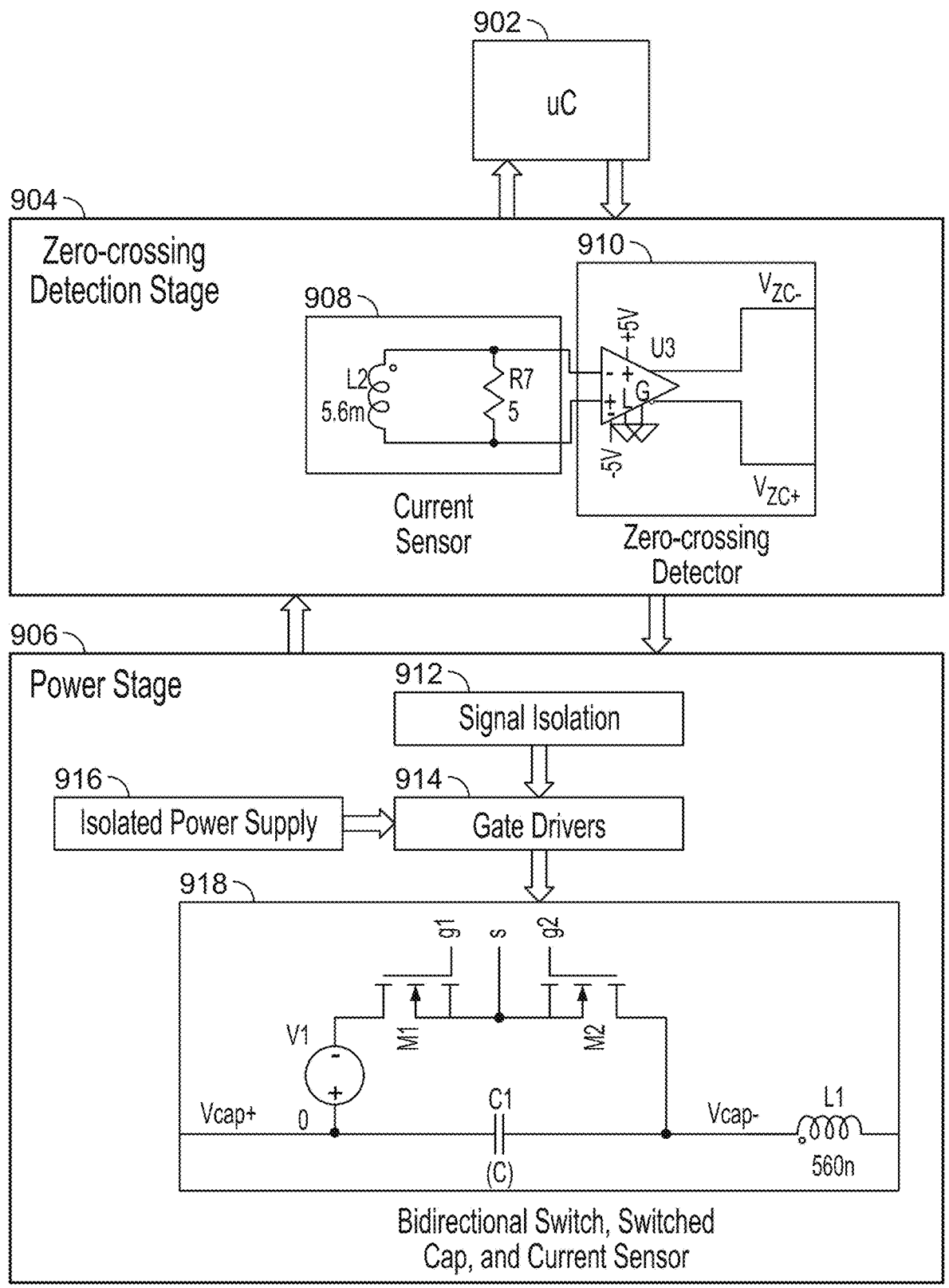
FIG. 9 is a diagrammatic representation of a digital implementation of the control of a PWM capacitor.

FIG. 9 shows a diagram of an exemplary embodiment of an example digital implementation of a controller for PWM capacitor. This implementation includes a controller 902, zero-crossing detection stage 904, and a power stage 906. The controller 902 communicates with the zero-crossing detection stage 904, which includes a current sensor 908 that produces a voltage signal for the comparator in the zero-crossing detector 910. The zero-crossing detector 910 provides a zero-crossing signal to the controller 902 to indicate when the current crosses zero (e.g., changes polarity). The zero-crossing detection stage 904 is coupled to power stage 906. The power stage 906 includes signal isolation circuitry 912 for the gate driver 914 input signals. The controller 902 provides the input signals for the gate driver 914. Gate drivers 914 drive switching elements M1 and M2 coupled in parallel with capacitor C1. The current sensors 908 provides a current sense signal to the zero-crossing detector 910. An output of the zero-crossing detector 910 is provided to controller 902 which generates driving signals for transistors M1 and M2. The controller 902 can be implemented as one or more processors or microcontrollers. In some implementations, controller 902 can be implemented as an ASIC or FPGA controller.

In operation, controller 902 controls the effective capacitance of capacitor C1 by alternately switching transistors M1 and M2 in order to bypass or short capacitor C1 for a portion of both the positive and negative half of an AC input voltage signal. An input signal is provided to the controller 902 that indicates a desired effective capacitance for capacitor C1. The controller 902 determines on and off times for the transistors M1 and M2 based on the input signal. In some implementations, the input signal is a phase delay φ ranging between 90 and 180 degrees. The controller 902 determines first and second delay periods from a trigger point of an input current based on the phase delay φ. The controller 902 controls the gate drivers 914 to generate PWM signals for driving the transistors M1 and M2 based on the delay times. For purposes of explanation, the input current zero-crossing is used as a trigger point. However, in some implementations, a current peak can be used as a trigger point. For instance, zero-crossing detector can be modified to detect current peaks by, for example, incorporating a differentiator circuit. In such n implementations, the range for the phase delay φ input may be shifted by 90 degrees to account for the shift in the trigger point.

In general, the controller 902 calculates a transistor turn off delay period and a transistor turn on delay period. The controller 902 receives a zero-crossing signal from the zero-crossing detector 910 and waits for the transistor turn off delay time before turning off the first transistor (e.g., M1). The controller 902 then waits until after the turn on delay period from the zero-crossing to turn the first transistor back on. Another zero-crossing of the current will occur while the first transistor is turned off. In some implementations, the transistor turn on delay period can be measured from the same zero-crossing as the transistor turn off delay period, or, in some implementations, the transistor turn on delay period can be measured from the zero-crossing that occurs while the transistor is turned off. The process is repeated for the second transistor, during the next half cycle of the input current signal.

The transistor turns off and turn on delay times may be the same for both transistors, but triggered from different zero-crossing points (e.g., zero-crossing points occurring at opposite phases of the input current). In some implementations, the turn off and turn and turn on delay times can be different for each transistor. In some implementations, ensuring that the transistors are switched at zero voltage is more critical for turning the transistors on than for turning the transistors off. Therefore, the controller 902 can estimate a theoretical transistor turn on delay based on the phase delay value, as discussed below. In order to ensure that the transistors are turned on when the voltage across capacitor C1 is zero, the controller 902 can wait for an additional period of time after the estimated transistor turn on delay period. In some implementations, the additional period of time is a predetermined delay period (e.g., ≤300 ns, ≤500 ns, ≤800 ns, or ≤1000 ns), for example, to ensure that a body-diode current of a power transistor (or current through an anti-parallel diode) occurs to briefly clamp the voltage across C1 at zero before turning on a transistor. In some implementations, the controller 902 turns the transistor on after the estimated transistor turn on delay period and after detecting body-diode conduction through the transistor (or through an anti-parallel diode). In some implementations, the controller 902 does not estimate a transistor turn on time, but turns on the transistor after detecting body-diode conduction through the transistor (or through an anti-parallel diode). For example, the controller 902 can receive a body-diode conduction signal from a body-diode conduction sensor, such as that discussed in more detail below in reference to FIG. 22.

Figure 10A:
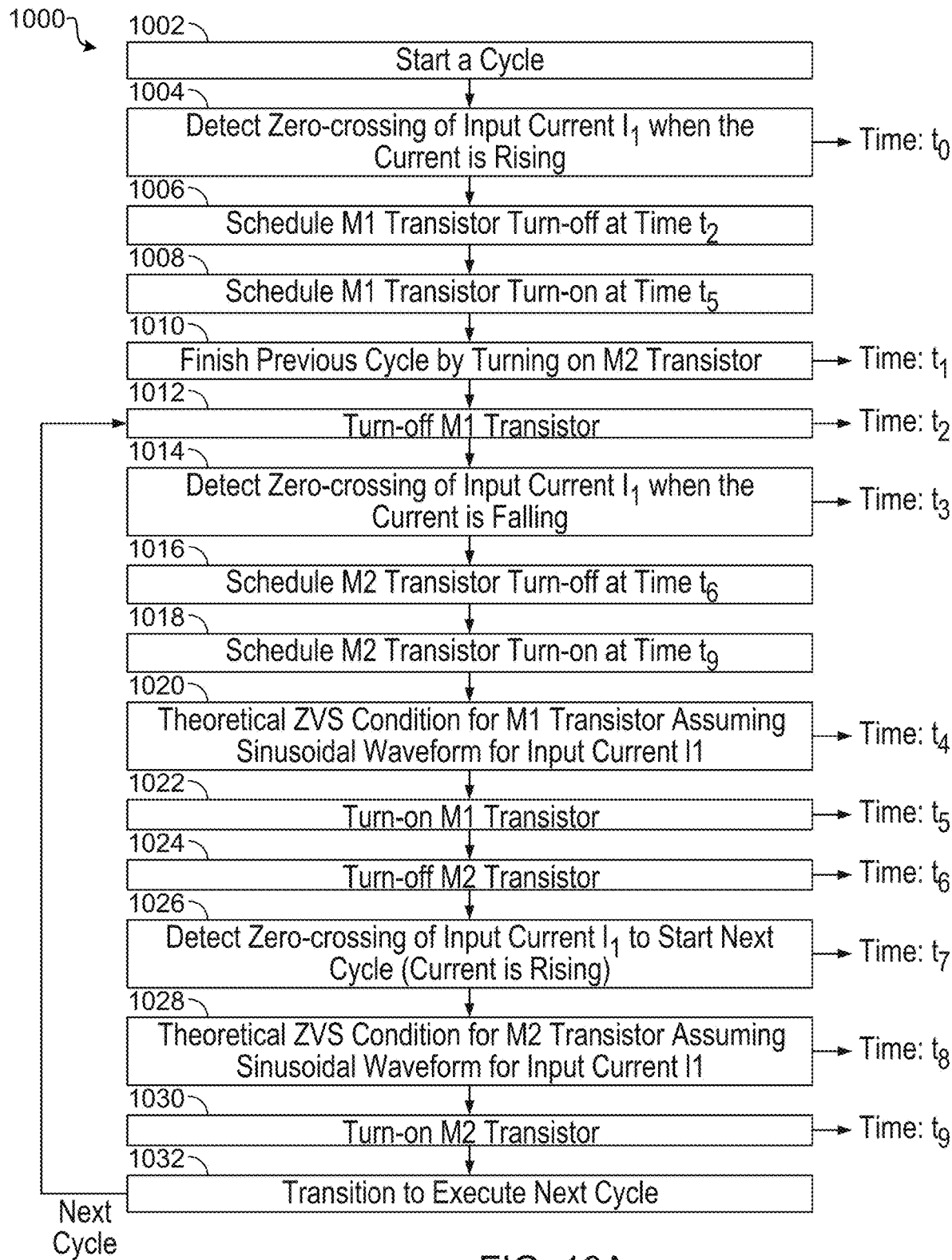
FIG. 10A is a flowchart of an exemplary process for the control of a PWM capacitor.

FIG. 10A shows a flowchart of an exemplary process 1000 for the control of a PWM capacitor. In some examples, the example process 1000 can be provided as computer-executable instructions executed using one or more processing devices (e.g., processors or microcontrollers) or computing devices. In some examples, the process 1000 may be executed by hardwired electrical circuitry, for example, as an ASIC or an FPGA controller. Process 1000 can be executed by, for example, controller 902.

Step 1002 starts a cycle of a switching period. At step 1004 (time t0), the zero-crossing of input current $I_1$ is detected by the zero-crossing detector 910 when the current $I_1$ is rising. At step 1006, transistor M1 is scheduled to turn off at time $t_2$, a turn off delay period after the zero-crossing. For example, a first delay period is calculated based on the input phase φ, where:

$$t_2 = \frac{\varphi}{360°} \cdot T$$

and where T is the period of the input current $I_1$ and the input phase φ sets equivalent capacitance to approximately:

$$C_{eq} = C1 \cdot \frac{1}{2 - (2\varphi - \sin 2\varphi)/\pi}.$$

At step 1008, transistor M1 is scheduled to turn on at time $t_5$, a turn on delay period after the zero-crossing and which can be represented by, for example:

$$t_5 = \frac{360° - \varphi}{360°} \cdot T + T_{delay}$$

where predetermined delay $T_{delay}$ is adjusted so zero-voltage switching is ensured. In some implementations, predetermined delay $T_{delay}$ is a fixed delay (e.g., $T_{delay} \leq 300$ ns, $\leq 500$ ns, $\leq 800$ ns, or $\leq 1000$ ns). At step 1010 (time $t_1$), the previous cycle is finished by turning on switching element M2. At step 1012 (time $t_2$), the transistor M1 is turned off after the turn off delay period. At step 1014 (time $t_3$), zero-crossing of the input current $I_1$ is detected when the current is falling. In some implementations, time $t_3$ is equal to T/2. At step 1016, the transistor M2 is scheduled to turn off at time $t_6$, a second turn off delay period after the first zero-crossing at $t_0$ and which can be represented by, for example:

$$t_6 = T/2 + \varphi/360° \cdot T.$$

In some implementations, transistor M2 is scheduled to turn off at time $t_6$ by using the first turn off delay period (calculated above as $t_2$) but measured from the second zero-crossing of input current $I_1$ at time $t_3$.

At step 1018, the transistor M2 is scheduled to turn on at time $t_9$, a second turn on delay period after the zero-crossing and which can be represented by, for example:

$$t_9 = \frac{480° - \varphi}{360°} \cdot T + T_{delay}.$$

In some implementations, transistor M2 is scheduled to turn on at time $t_9$ by using the first turn on delay period (calculated above as $t_5$) but measured from the second zero-crossing of input current $I_1$ at time $t_3$.

At step 1020 (time $t_4$), ZVS condition is theoretically achieved for switching element M1 assuming a periodic waveform, such as a sinusoid, for input $I_1$. In some implementations, time $t_4$ is estimated by:

$$t_4 = \frac{360° - \varphi}{360°} \cdot T.$$

At step 1022 (time $t_5$), transistor M1 is turned on after the turn on delay period. At step 1024 (time $t_6$), transistor M2 is turned off after the second turn off delay period. At step 1026 (time $t_7$), zero-crossing of input current $I_1$ is detected to start the next cycle when the current $I_1$ is rising. Transistor M1 is scheduled to turn off after $$t = \varphi/360° \cdot T.$$

At step 1028 (time $t_8$), ZVS condition is theoretically achieved for transistor M2 assuming a periodic waveform, such as a sinusoid, for input current $I_1$. At step 1030 (time $t_9$), transistor M2 is turned on after the second turn on delay period. Step 1032 is the transition to start the next cycle which leads to step 1012.

Figure 10B:
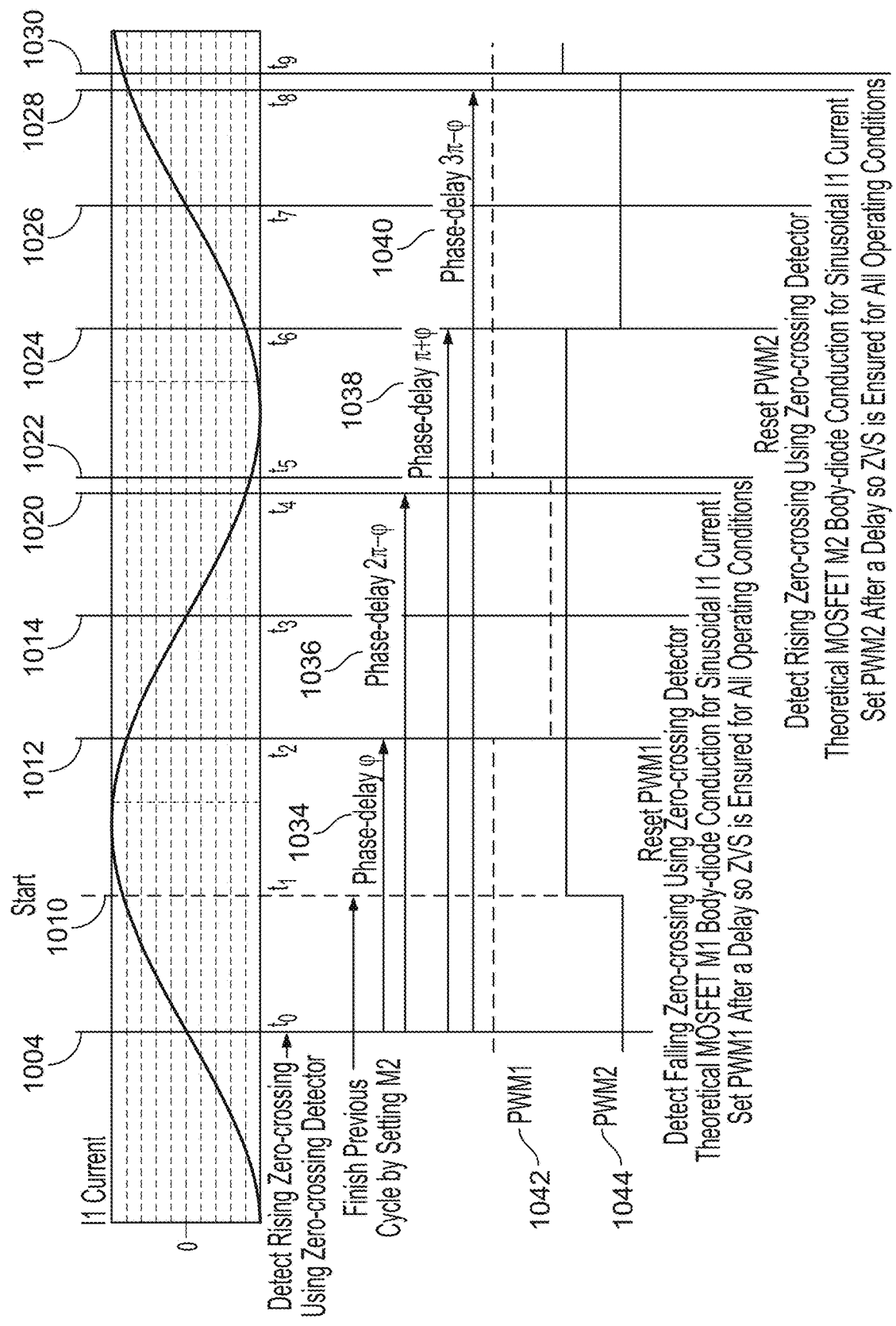
FIG. 10B is a timing diagram of process described in FIGS. 10A and 10C.

FIG. 10B shows a timing diagram of process 1000 described in FIG. 10A. The diagram shows a current $I_1$ waveform that is marked by vertical lines indicating events. These vertical lines are marked to correspond to steps described in FIG. 10A. Additionally, phase-delay markers 1034, 1036, 1038, 1040 are shown and calculated. At time $t_0$, the zero-crossing of rising current $I_1$ is detected using the zero-crossing detector 910. At time $t_1$, switching element M2 is switching on (logic 1) and a previous cycle is finished. At time $t_2$, phase delay 1034 is approximately $\varphi$ and PWM1 is switched off (logic 0). At time $t_3$, the zero-crossing of falling current $I_1$ is detected using zero-crossing detector 910. Time $t_4$ marks the theoretical M1 body-diode conduction for $I_1$ current and here phase delay 1036 is approximately $2\pi + \varphi$. At time $t_5$, PWM1 is switched on (logic 1) after a delay $T_{delay}$ (between $t_4$ and $t_5$) such that ZVS is ensured for all operating conditions. At time $t_6$, phase delay 1038 is approximately $\pi + \varphi$ and PWM2 is switched off (logic 0). At time $t_7$, the zero-crossing of falling current $I_1$ is detected using zero-crossing detector 910. Time $t_8$ marks the theoretical M2 body-diode conduction for sinusoidal $I_1$ current. At time $t_9$, PWM1 is switched on after a delay $T_{delay}$ (between $t_8$ and $t_9$) such that ZVS is ensured for all operating conditions. Switching on (setting) and switching off (resetting) of signals PWM1 1042 and PWM2 1044 are shown coinciding with time stamps $t_0$ through $t_9$.

Figure 10C:
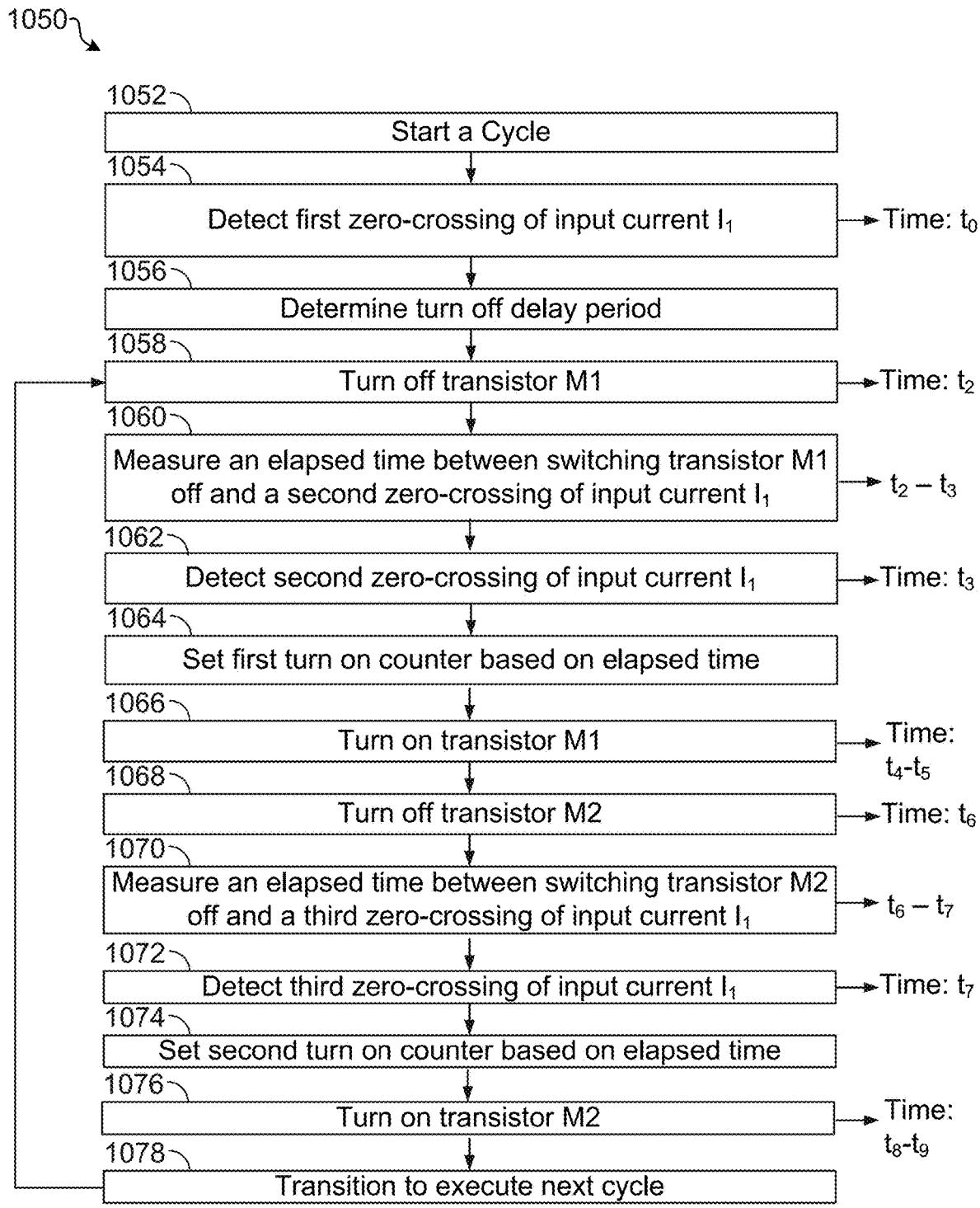
FIG. 10C is a flowchart of another exemplary process for the control of a PWM capacitor.

FIG. 10C shows a flowchart of another exemplary process 1050 for the control of a PWM capacitor. In some examples, the example process 1050 can be provided as computer-executable instructions executed using one or more processing devices (e.g., processors or microcontrollers) or computing devices. In some examples, the process 1050 may be executed by hardwired electrical circuitry, for example, as an ASIC or an FPGA controller. Process 1050 can be executed by, for example, controller 902. Process 1050 is described in reference to the times and events shown in FIG. 10B.

Step 1052 starts a cycle of a switching period. At step 1054 (time to), the controller 902 detects a first zero-crossing of input current $I_1$, for example, by receiving a zero-crossing detection signal from the zero-crossing detector 910. At step 1056, the controller 902 determines a turn off delay period. For example, the turn of delay period can be determined based on in input value such as an input phase $\varphi$. In other words, the input value controls the length of the turn off delay period. For example, the turn off delay can be calculated by:

$$t_{off} = \varphi/360° \cdot T.$$

The turn off delay period represents a period of time that the controller waits from each zero-crossing detection until switching off one of the transistors M1 or M2. In some implementations, the turn off delay period determines the effective impedance of the capacitor C1.

At step 1058 (time $t_2$), the first transistor M1 is turned off after the turn off delay period from the first zero-crossing of the input current $I_1$. This is represented in FIG. 10B by the PWM1 signal falling to logic zero. At step 1060, the controller 902 measures an elapsed time between switching transistor M1 off and detecting a subsequent (second) zero-crossing of input current $I_1$ (time $t_3$). The elapsed time is represented in FIG. 10B by the interval between times $t_2$ and $t_3$. For example, the controller 902 can start a counter or timer when transistor M1 is switched off and measure the elapsed time when the next zero-crossing is detected.

At step 1062 (time $t_3$), the controller 902 detects a second zero-crossing of input current $I_1$, for example, by receiving a zero-crossing detection signal from the zero-crossing detector 910. At step 1064 controller 902 sets a first turn-on counter based on the elapsed time. For example, the turn-on counter can be set to count down from the elapsed time or the counter that measured the elapsed time can be reversed to count down to zero. The controller 902 uses the turn-on timer to estimate when the voltage across capacitor C1 will return to zero. For instance, as shown in the following FIGS. 11A-11F, the voltage rise and fall across capacitor C1 is genially symmetric about the zero-crossing point of input current $I_1$. Accordingly, the controller 902 can estimate the theoretical ZVS time (e.g., time $t_4$) for turning on a transistor (e.g., transistor M1) by counting symmetric times intervals between shutting off the transistor (when the voltage increases in magnitude) and a subsequent zero current crossing (when the voltage reaches a peak) (e.g., $t_2$-$t_3$), and between the subsequent zero current crossing and an estimated ZVS time (e.g., $t_3$-$t_4$).

At step 1066, the controller 902 turns the first transistor M1 back on after the turn-on counter expires (e.g., after a second delay period measured by the turn-on counter). This is represented in FIG. 10B by the PWM1 signal rising to logic one. Because the turn-on counter is used to estimate a theoretical ZVS time, the controller 902 can incorporate an additional delay $T_{delay}$ before turning on the transistor M1 back on to ensure that zero voltage is achieved. The additional delay $T_{delay}$ is represented in FIG. 10B by the interval between times $t_4$ and $t_5$. The additional delay $T_{delay}$ can be a predetermined fixed delay period (e.g., $T_{delay} \leq 300$ ns, $\leq 500$ ns, $\leq 800$ ns, or $\leq 1000$ ns). In some implementations, the additional delay $T_{delay}$ can be a delay between the estimated ZVS time and detecting a zero-voltage condition using a sensor such as a body-diode conduction sensor. For example, the controller 902 can turn the transistor M1 back on in response to a signal from a body-diode conduction sensor (such as that described below in reference to FIG. 22). For example, a body-diode conduction sensor can be used to detect detecting body-diode conduction through the transistor (or an associated anti-parallel diode). The controller 902 can use the body-diode conduction as an indication of that a zero voltage condition across the capacitor has been achieved.

At step 1068 (time $t_6$), the second transistor M2 is turned off after the turn off delay period from the second zero-crossing of the input current $I_1$ (e.g., at time $t_3$). This is represented in FIG. 10B by the PWM2 signal falling to logic zero. At step 1070, the controller 902 measures an elapsed time between switching transistor M2 off and detecting a subsequent (third) zero-crossing of input current I1 (time $t_7$). The elapsed time is represented in FIG. 10B by the interval between times $t_6$ and $t_7$. For example, the controller 902 can start a counter or timer when transistor M2 is switched off and measure the elapsed time when the next zero-crossing is detected.

At step 1072 (time $t_7$), the controller 902 detects a third zero-crossing of input current $I_1$, for example, by receiving a zero-crossing detection signal from the zero-crossing detector 910. At step 1074 controller 902 sets a second turn-on counter based on the elapsed time. For example, the second turn-on counter can be set to count down from the elapsed time or the counter that measured the elapsed time can be reversed to count down to zero. The controller 902 uses the turn-on timer to estimate when the voltage across capacitor C1 will return to zero. Accordingly, the controller 902 can estimate the theoretical ZVS time (e.g., time $t_8$) for turning on a transistor (e.g., transistor M2) by counting symmetric times intervals between shutting off the transistor (when the voltage increases in magnitude) and a subsequent zero current crossing (when the voltage reaches a peak) (e.g., $t_6$-$t_7$), and between the subsequent zero current crossing and an estimated ZVS time (e.g., $t_7$-$t_8$).

At step 1076, the controller 902 turns the second transistor M2 back on after the second turn-on counter expires (e.g., after a second delay period measured by the turn-on counter). This is represented in FIG. 10B by the PWM2 signal rising to logic one. Because the turn-on counter is used to estimate a theoretical ZVS time, the controller 902 can incorporate an additional delay $T_{delay}$ before turning on the transistor M2 back on to ensure that zero voltage is achieved. The additional delay $T_{delay}$ is represented in FIG. 10B by the interval between times $t_8$ and $t_9$. As discussed above, the additional delay $T_{delay}$ can be a predetermined fixed delay period (e.g., $T_{delay} \leq 300$ ns, $\leq 500$ ns, $\leq 800$ ns, or $\leq 1000$ ns). In some implementations, the additional delay $T_{delay}$ can be a delay between the estimated ZVS time and detecting a zero-voltage condition using a sensor such as a body-diode conduction sensor. Step 1078 is the transition to start the next cycle which leads to step 1058.

Figure 11A:
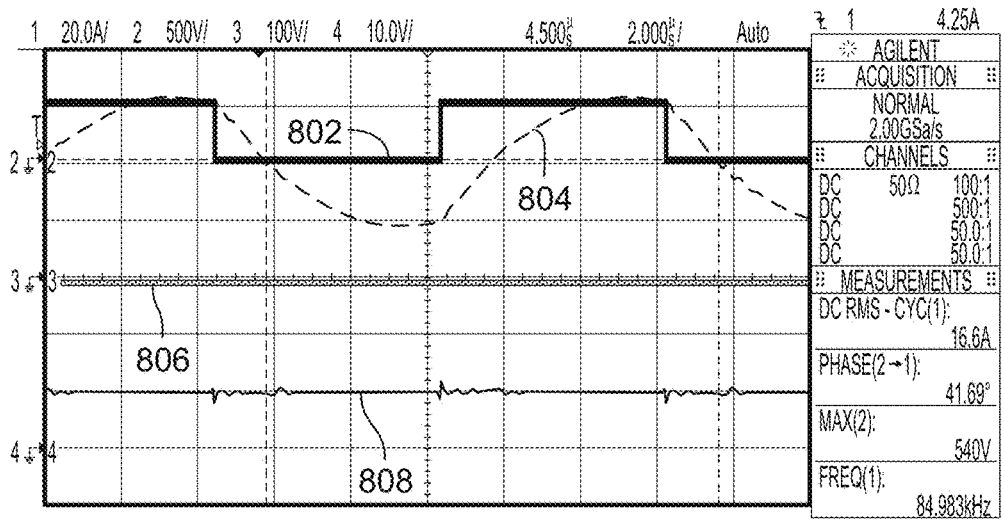
FIGS. 11A-11F are graphical representations of measured waveforms associated with a digital implementation of the control of a PWM capacitor.
Figure 11B:
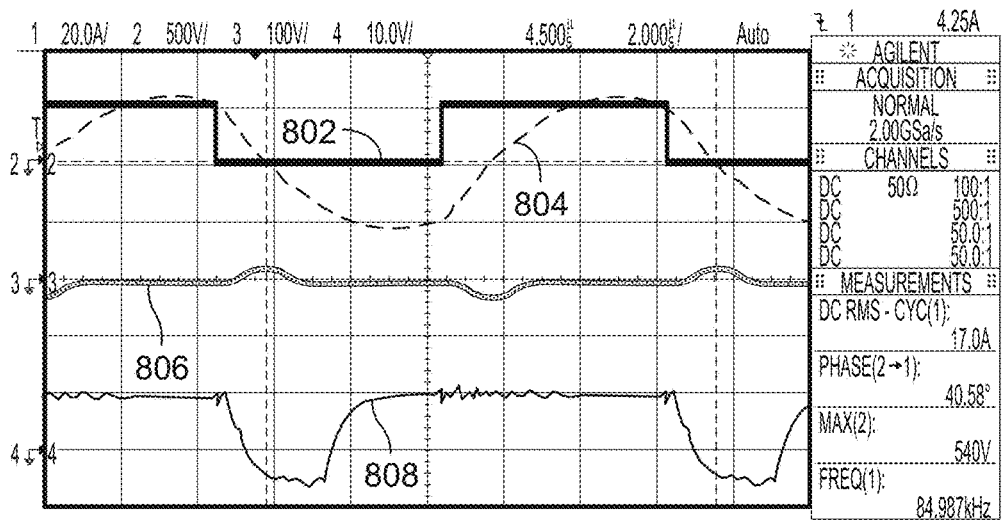
Figure 11C:
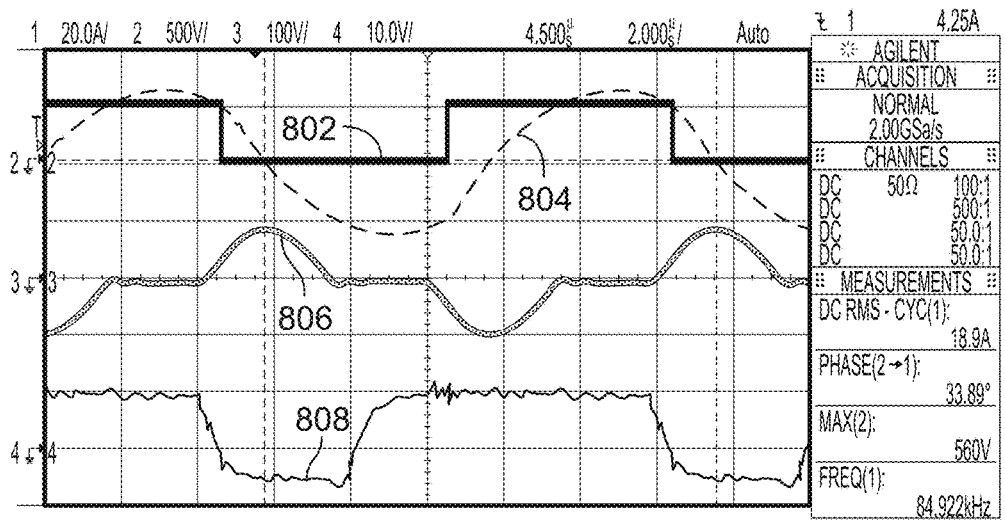
Figure 11D:
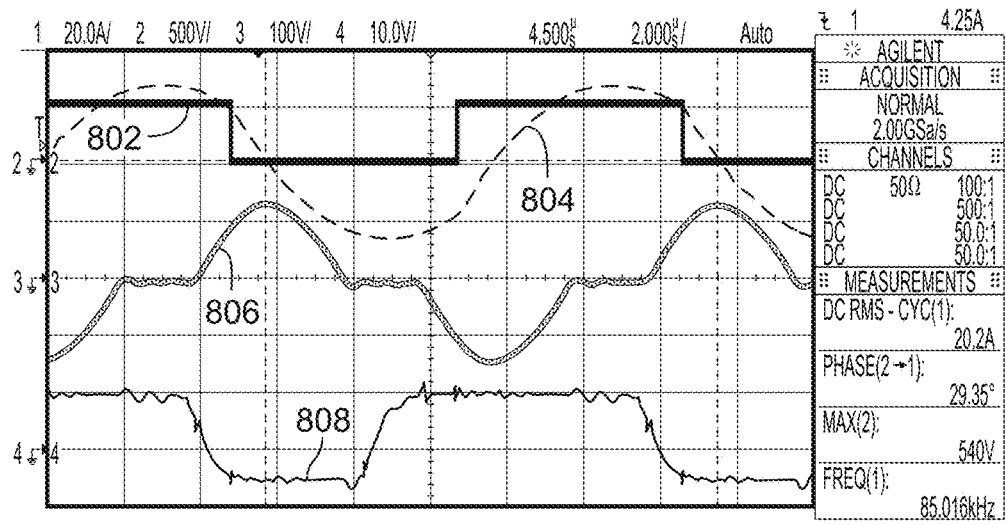
Figure 11E:
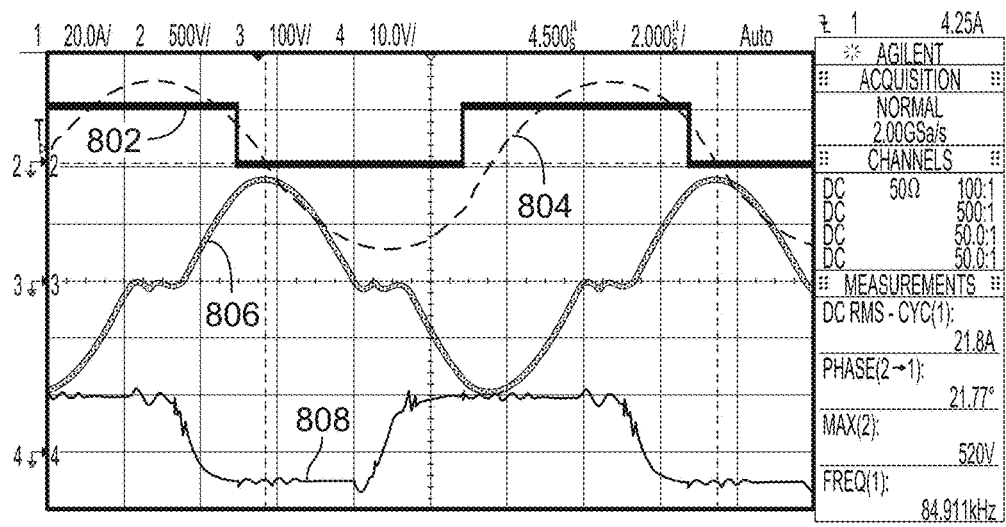
Figure 11F:
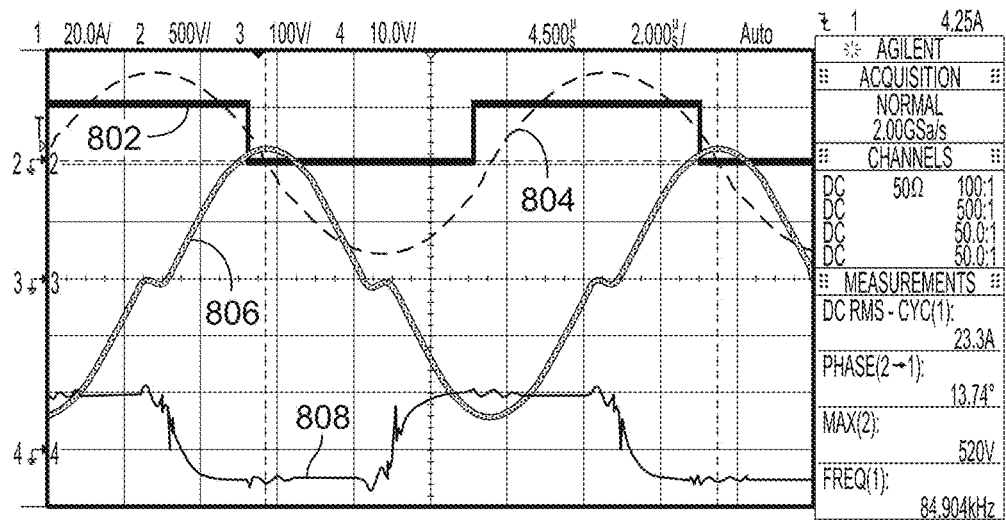

FIGS. 11A-11F show measurements made from an exemplary embodiment of a digital implementation of the control of a PWM capacitor. The measurements include absolute voltage $V_{ab}$ 802 at the output of the inverter 202 of approximately 500 V/div, input current $I_1$ 804 of approximately 20 A/div, voltage $V_{C1}$ 806 of approximately 100 V/div at capacitor C1, and voltage measurement $V_{gs1}$ 808 10 V/div between gate g1 and reference s. In this embodiment, the power level is maintained approximately between 6 kW and 12 kW. As phase delay φ is adjusted, the effective capacitance changes (as indicated by $V_{C1}$). FIG. 11A shows a phase φ of 180 degrees. FIG. 11B shows a phase of φ of 140 degrees. FIG. 11C shows a phase φ of 120 degrees. FIG. 11D shows a phase φ of 110 degrees. FIG. 11E shows a phase φ of 100 degrees. FIG. 11F shows a phase φ of 90 degrees.

Protection and Diagnostics

Figure 12:
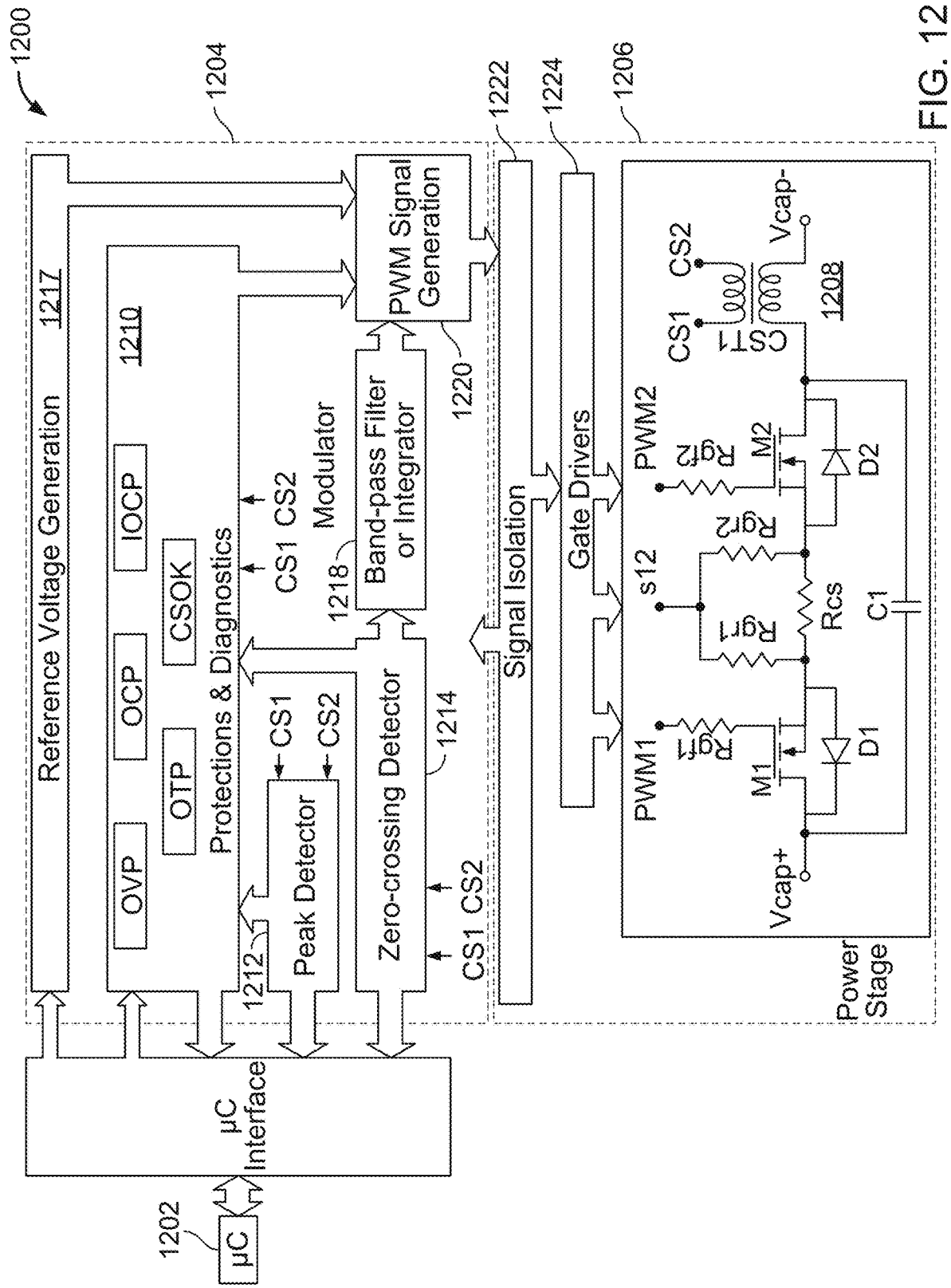
FIG. 12 is a schematic representation of a PWM capacitor switching system.

FIG. 12 shows an illustrative mixed-signal implementation 1200 of a PWM controlled capacitor C1 with equivalent capacitance controlled by switching elements M1, M2 and protection/diagnostic functionality. In some implementations, a controller 1202, modulator 1204, and power stage 1206 can have some commonality to the embodiments described above. The power stage 1206 includes a capacitor C1 and switching elements M1, M2 and a current sensor 1208 for sensing current through the capacitor C1. The current sensor 1208 provides capacitor current information CS1, CS2 that can be provided to one or more of a protection/diagnostic circuitry 1210, a peak detector 1212, and a zero-crossing detector 1214. Implementations can include all, none, or any combination of the circuitry receiving the current sensor information CS1, CS2.

The modulator 1204 can includes a reference voltage generator 1217 and a band-pass filter or integrator 1218, which can be similar to that described above. The power stage 1206 can include a signal isolation circuitry 1222 and gate driver 1224, which may be similar to that described above.

Figure 13A:
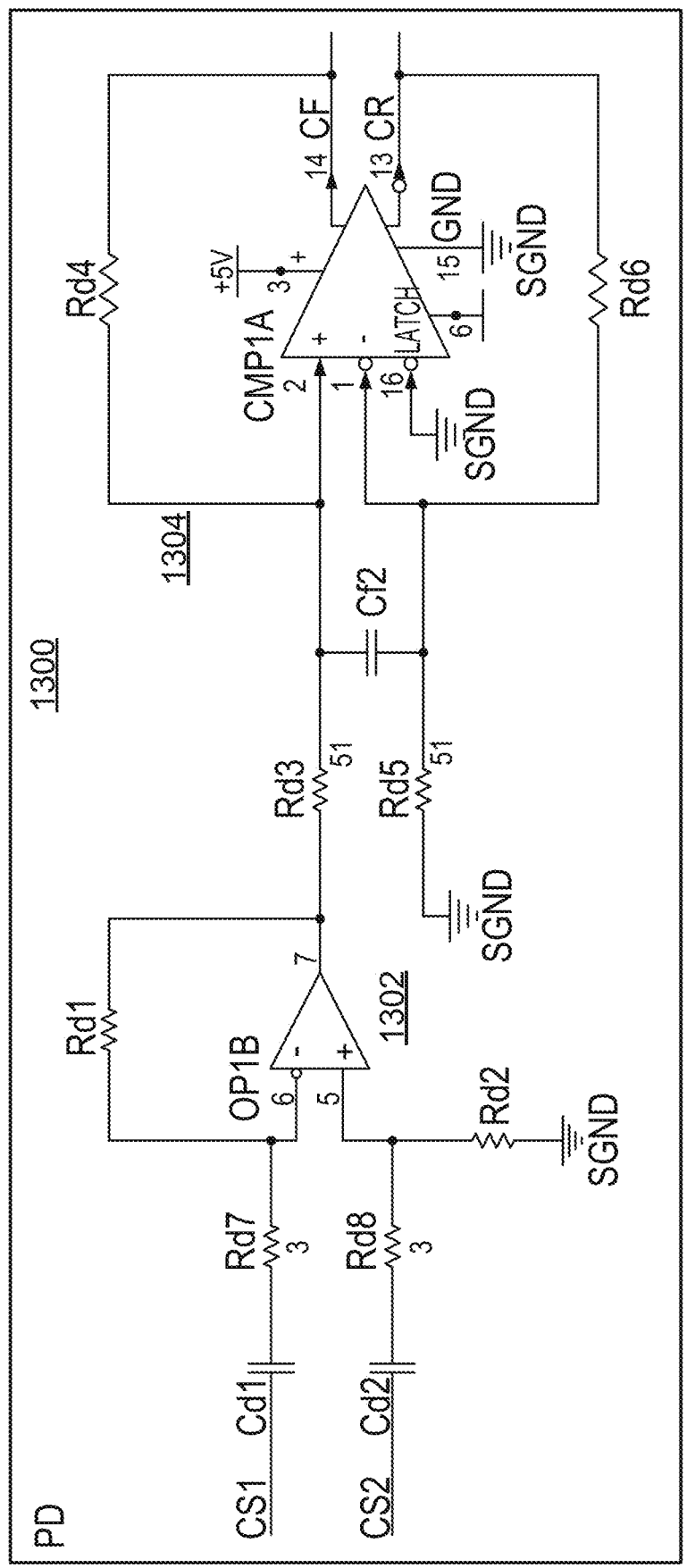
FIG. 13A is an example circuit implementation of a peak detector that can form a part of the system of FIG. 12.
Figure 13B:
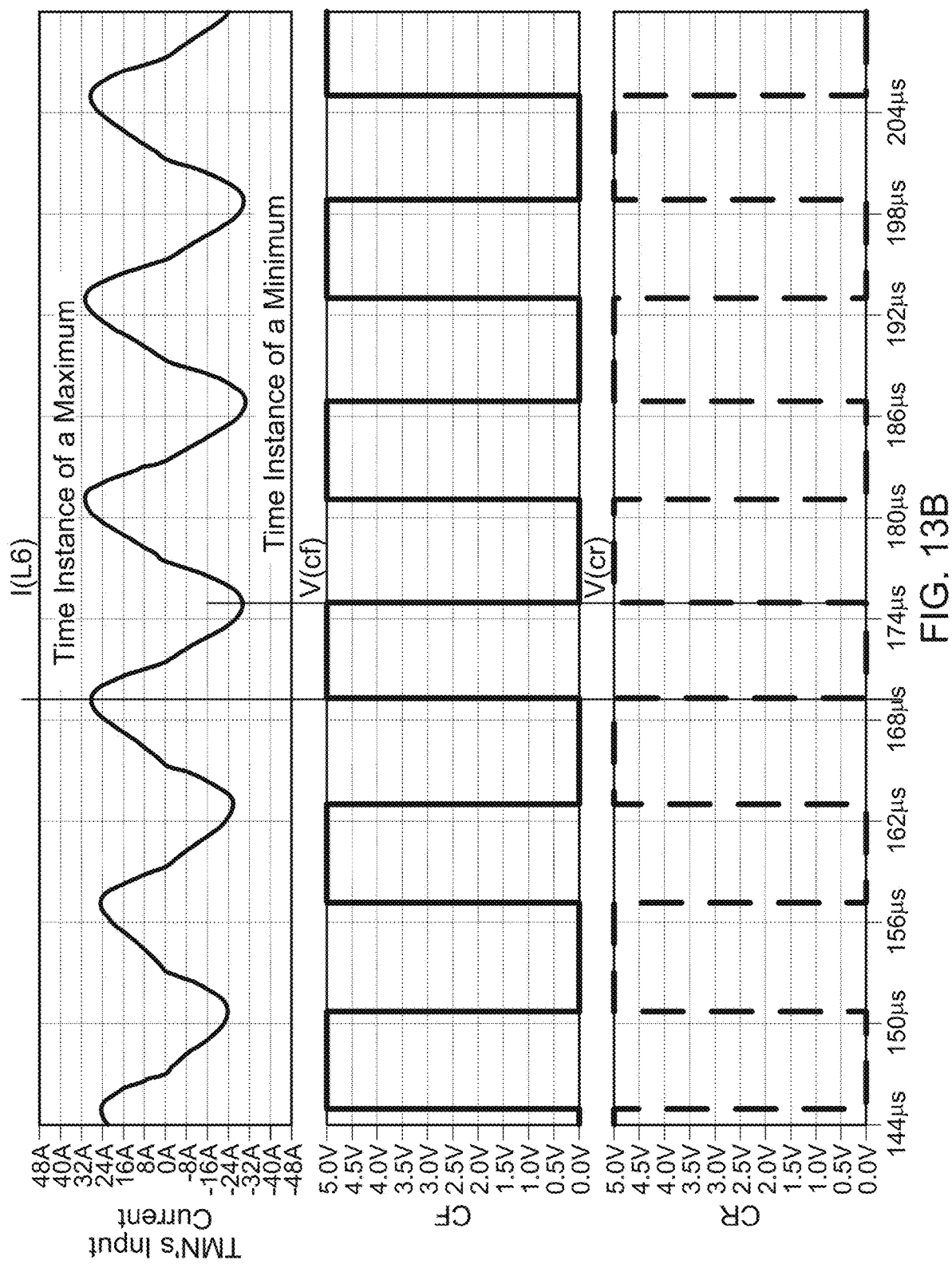
FIG. 13B is a waveform diagram showing illustrative waveforms for the circuit of FIG. 13.

FIG. 13A shows an illustrative peak detector 1300 which be provided as the peak detector 1212 of FIG. 12. The example peak detector 1300 as shown in FIG. 13A uses a bipolar (e.g., +5V and −5V) voltage supply. In the illustrated implementation, the peak detector 1300 includes an op-amp differentiator 1302 and zero-crossing circuit 1304 with low pass filtering and hysteresis. The peak detector 1300 receives capacitor current information CS1, CS2 from current sensor 1208 (FIG. 12) and outputs an input current maximum signal CF and minimum signal CR, as shown in FIG. 13B. In some implementations, the rising edge of CF corresponds to an input current maximum and a rising edge of CR corresponds to an input current minimum.

Figure 13C:
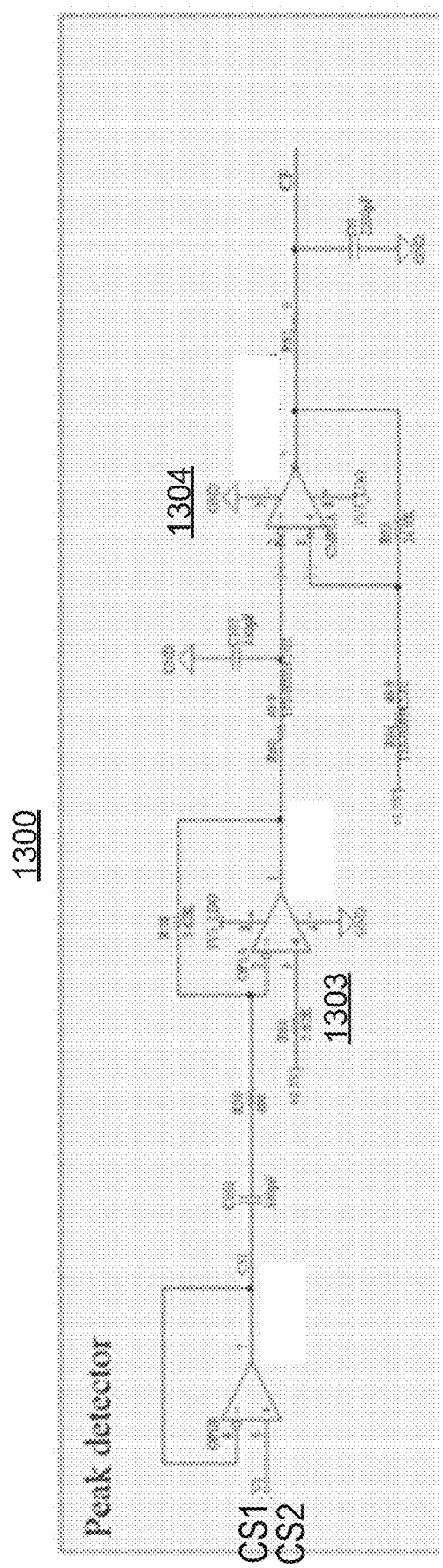
FIG. 13C is another example circuit implementation of a peak detector that can form a part of the system of FIG. 12.

FIG. 13C shows an illustrative peak detector 1300 which be provided as the peak detector 1212 of FIG. 12. The example peak detector 1300 as shown in FIG. 13C uses a unipolar (e.g., +3.3V) voltage supply. In the illustrated implementation, the peak detector 1300 includes a 1.5V DC bias circuit 1303 and zero-crossing circuit 1304 with low pass filtering and hysteresis. The peak detector 1300 receives capacitor current information CS1 (or CS2) from current sensor 1208 (FIG. 12) and outputs an input current maximum signal CF. In some implementations, the rising edge of CF corresponds to an input current maximum. In addition, AC waveforms such as CS1 current measurement are normalized to the +1.5 V dc voltage bias. DC voltage bias can be generated using, for example, resistive dividers, voltage references, shunts and regulators, operational amplifiers, dc-dc converters, or a combination thereof. The slope of the comparators' respective outputs can be controlled by load resistors and capacitors.

Figure 14A:
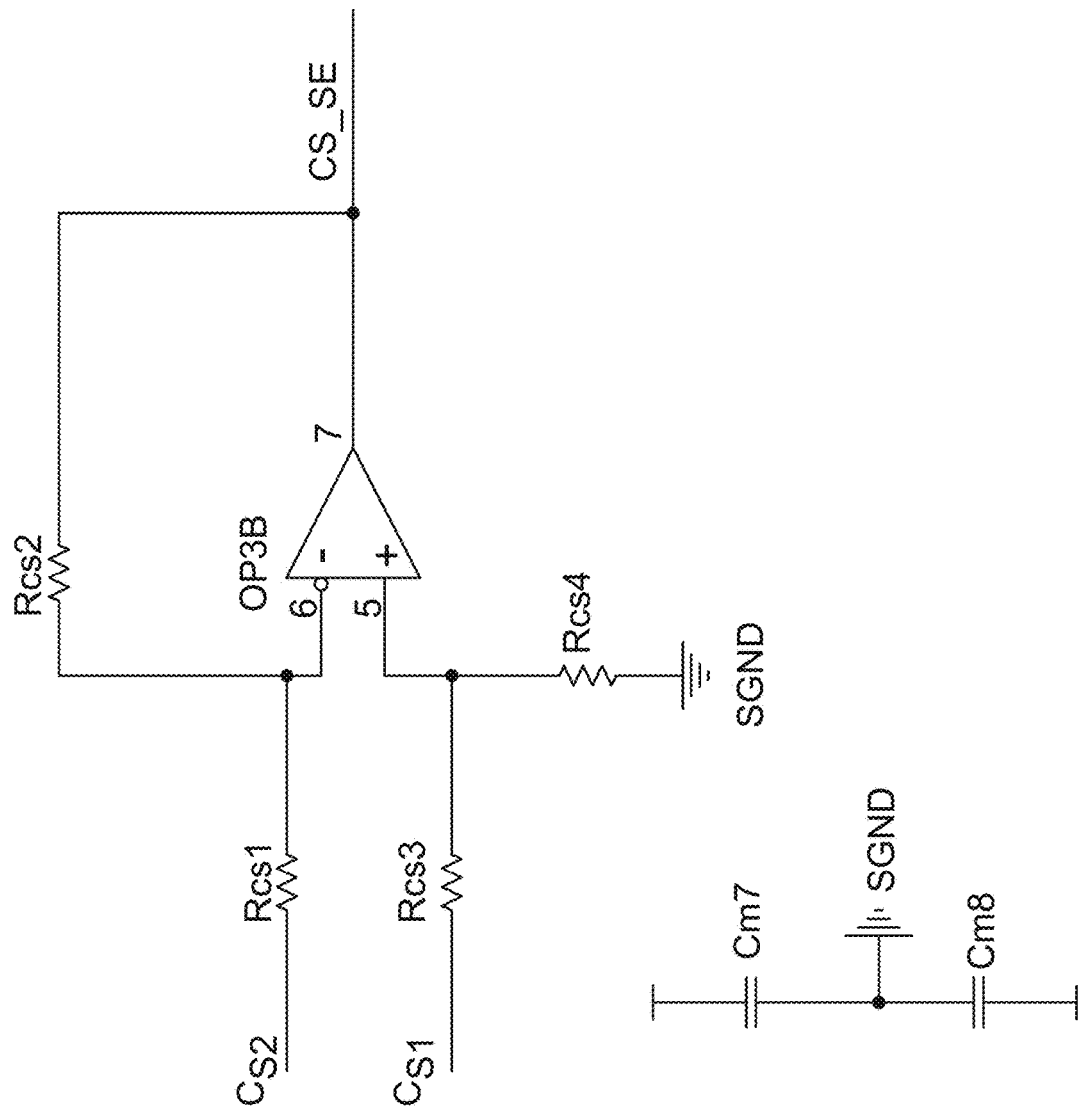
FIGS. 14A and 14B are example circuit implementation of current shape analysis that can form a part of the system of FIG. 12
Figure 14B:
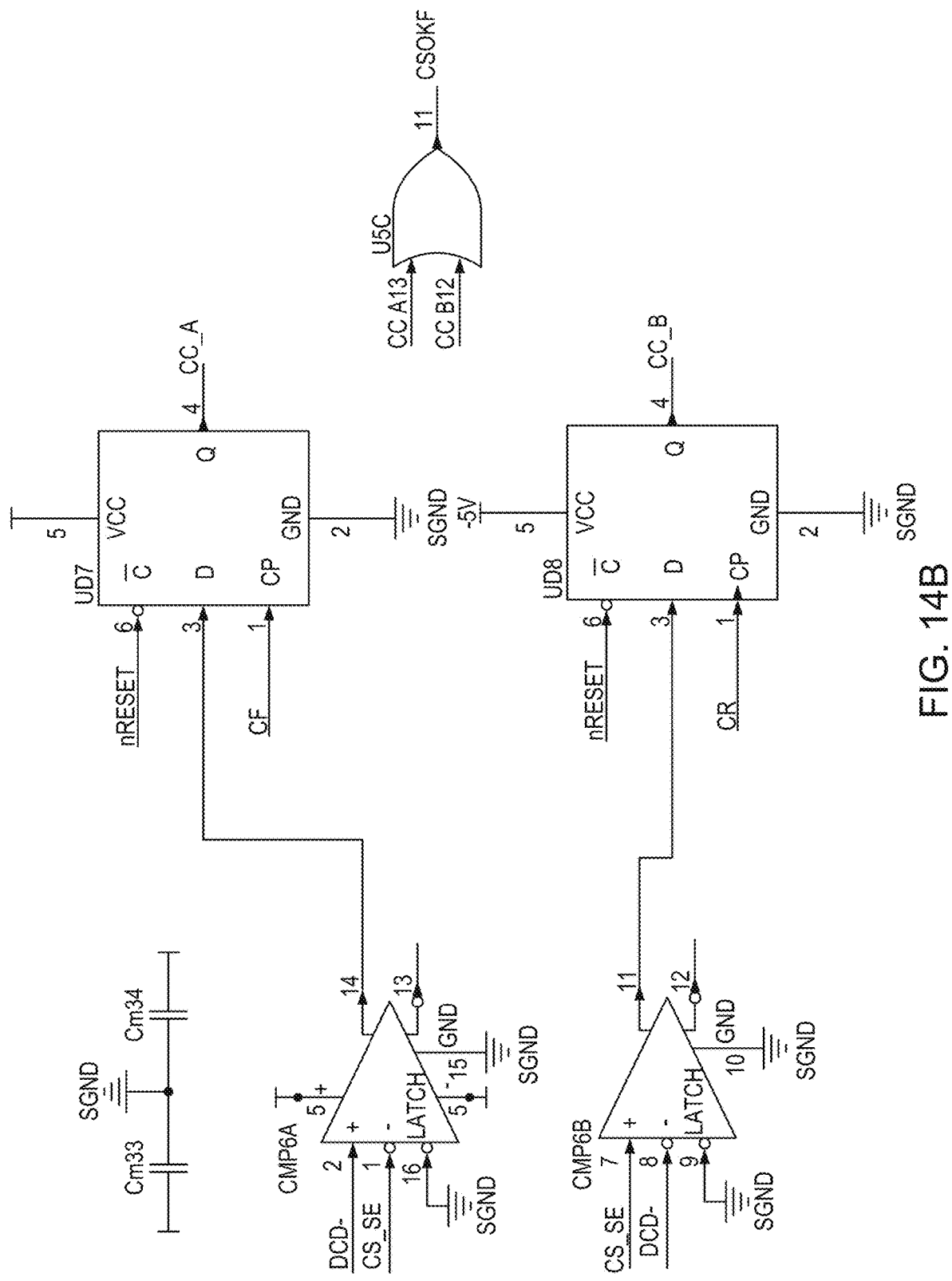

FIG. 14A and FIG. 14B show example circuit implementations for current shape OK (CSOK) diagnostics, which is represented in FIG. 12 as CSOK in the protection/diagnostic circuitry 1210. Implementations of a PWM capacitor system can include all, none or any combination of the protection/diagnostic functionality described herein. Furthermore, all, none, or any combination of the protection/diagnostic functionality described herein can be implemented in any combination of hardware and software, including any suitable programmable devices.

Figure 14C:
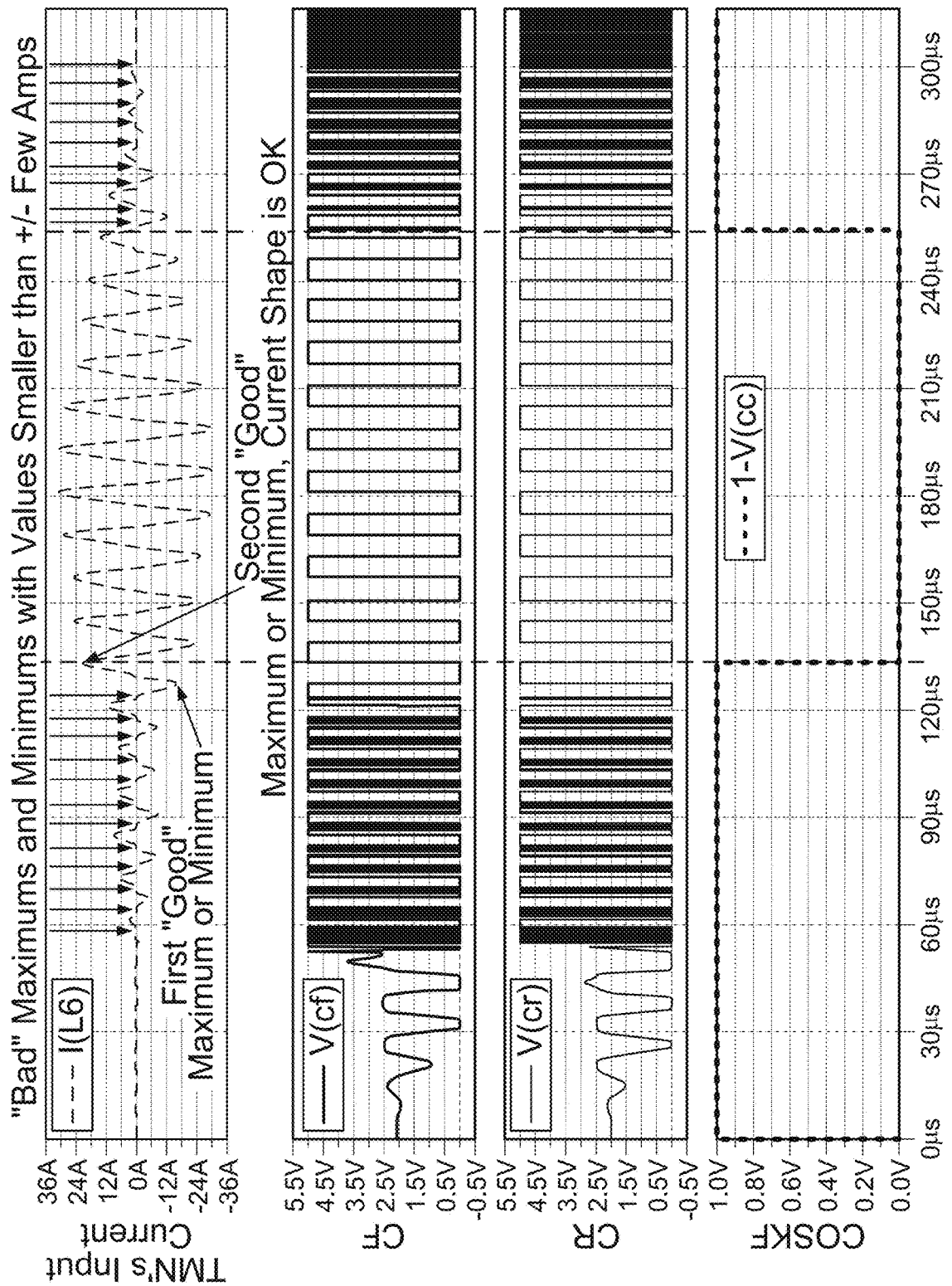
FIG. 14C is a waveform diagram showing illustrative waveforms for the circuits of FIGS. 14A and 14B

The CSOK circuitry checks if input current is "sinusoidal" without discontinuity at zero. In the illustrated embodiment, capacitor current information CS1, CS2 is provided to an op amp that outputs a current information signal CS_SE (FIG. 14A), which is compared to respective positive and negative thresholds (FIG. 14B) and latched by the CF and CR signals. The latch outputs are logically OR'd to provide a CSOKF signal, which is shown in the waveform diagram of FIG. 14C. The CSOK circuit checks on consecutive input current maximums and minimums to determine whether one of them is smaller than a specified threshold value, which can be set to about 0.5-10 A, for example. If any of the consecutive maximums and minimums are larger than respective threshold values, a CSOKF signal is pulled down as an indication that the input current has an acceptable shape.

Figure 15A:
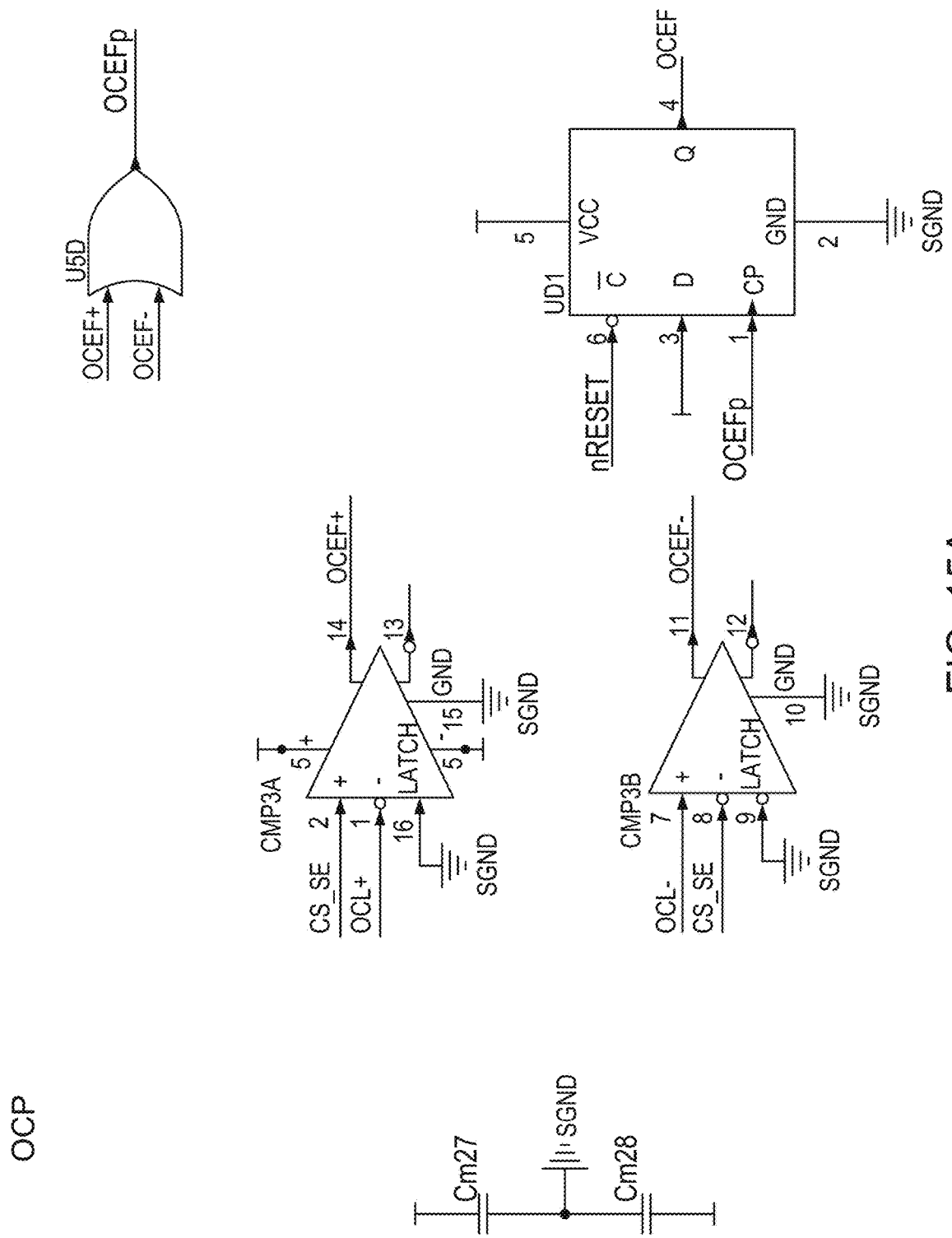
FIG. 15A is an example circuit implementation of an over current protection circuitry that can form a part of the system of FIG. 12.
Figure 15B:
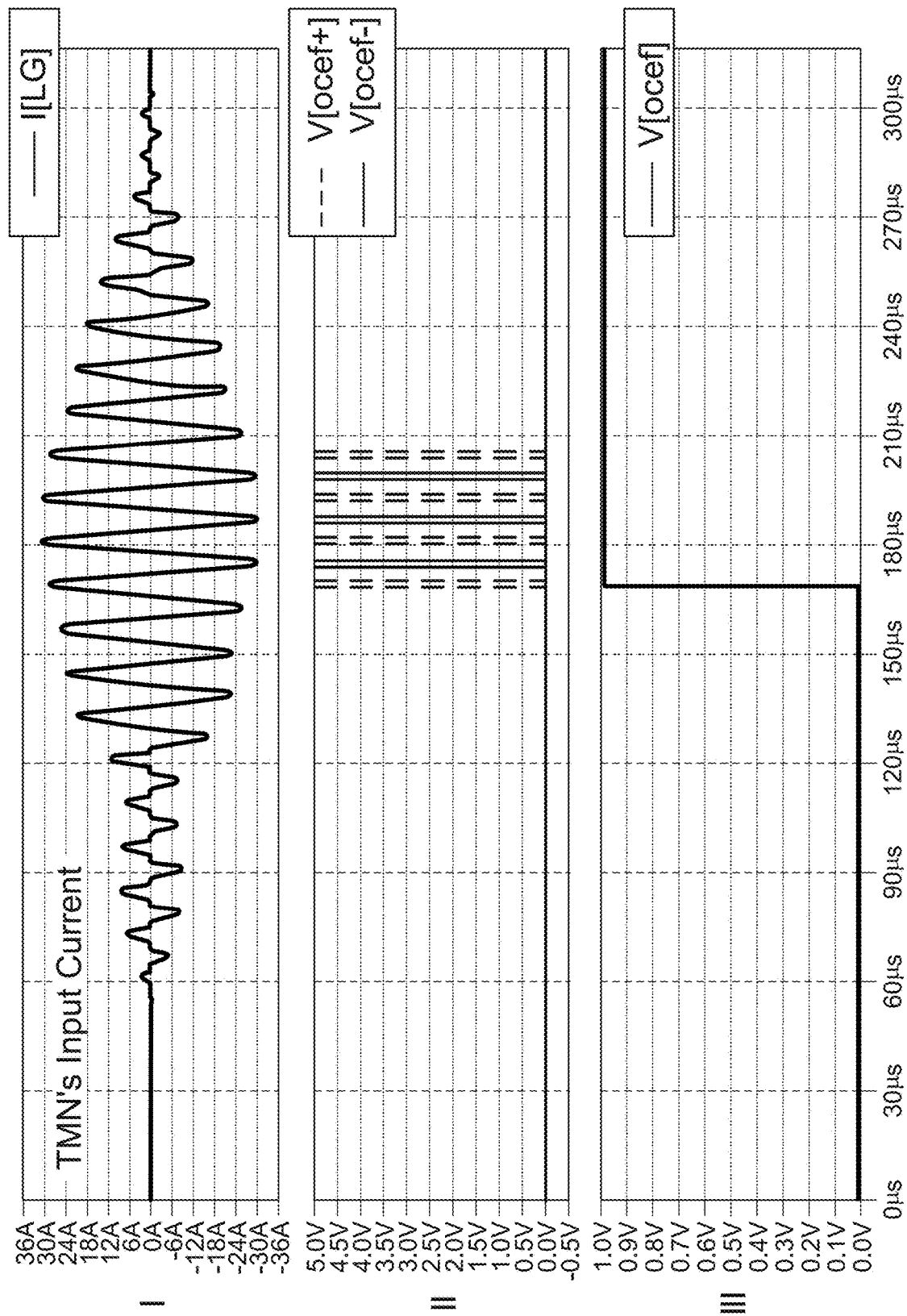
FIG. 15B is a waveform diagram showing illustrative waveforms for the circuit of FIG. 15A.

FIG. 15 shows an illustrative over current protection circuitry which can be seen in FIG. 12 as OCP in the protection/diagnostic circuitry 1210. In the illustrated embodiment, the OCP circuitry uses the CS_SE signal (FIG. 14A), which is provided to respective comparators that check if the input current is above respective positive and negative thresholds OCL+, OCL−. The comparator outputs are logically OR'd and the output is used to latch an error signal to enable a microcontroller to read the error signal (OCEF—over-current error flag).

FIG. 15A shows example waveforms where OCP+ is set to 26 A and OCP− is set to −26 A. As can be seen, subplot I shows the input current, subplot II shows the OECF+ and OECF− signals output from the comparators, and subplot III shows the OCEF signal which is set (latch output) when the input current exceeds about +/−26 A.

Figure 16A:
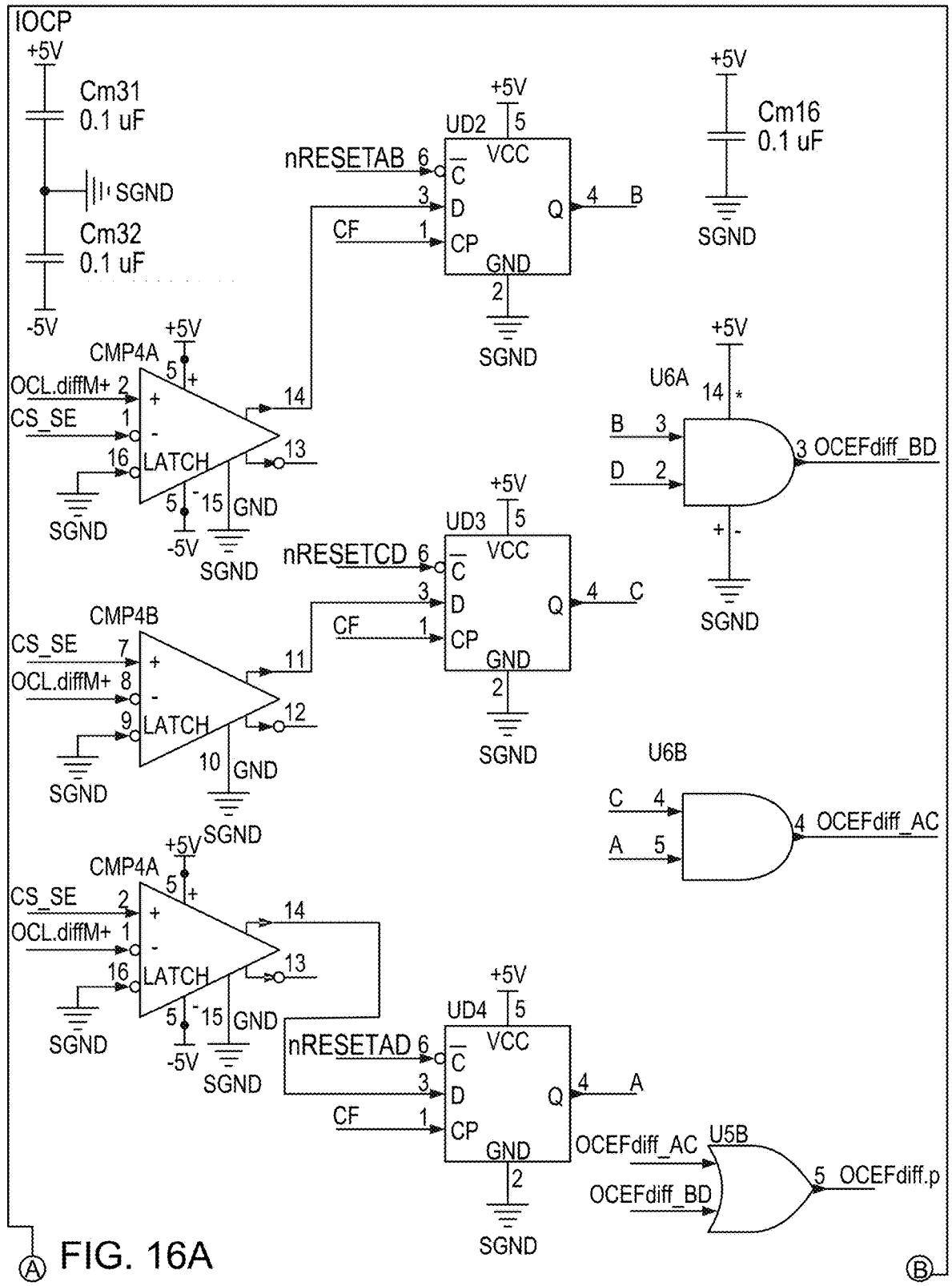
FIG. 16A is an example circuit implementation of an incremental over current protection circuitry that can form a part of the system of FIG. 12.
Figure 16A:
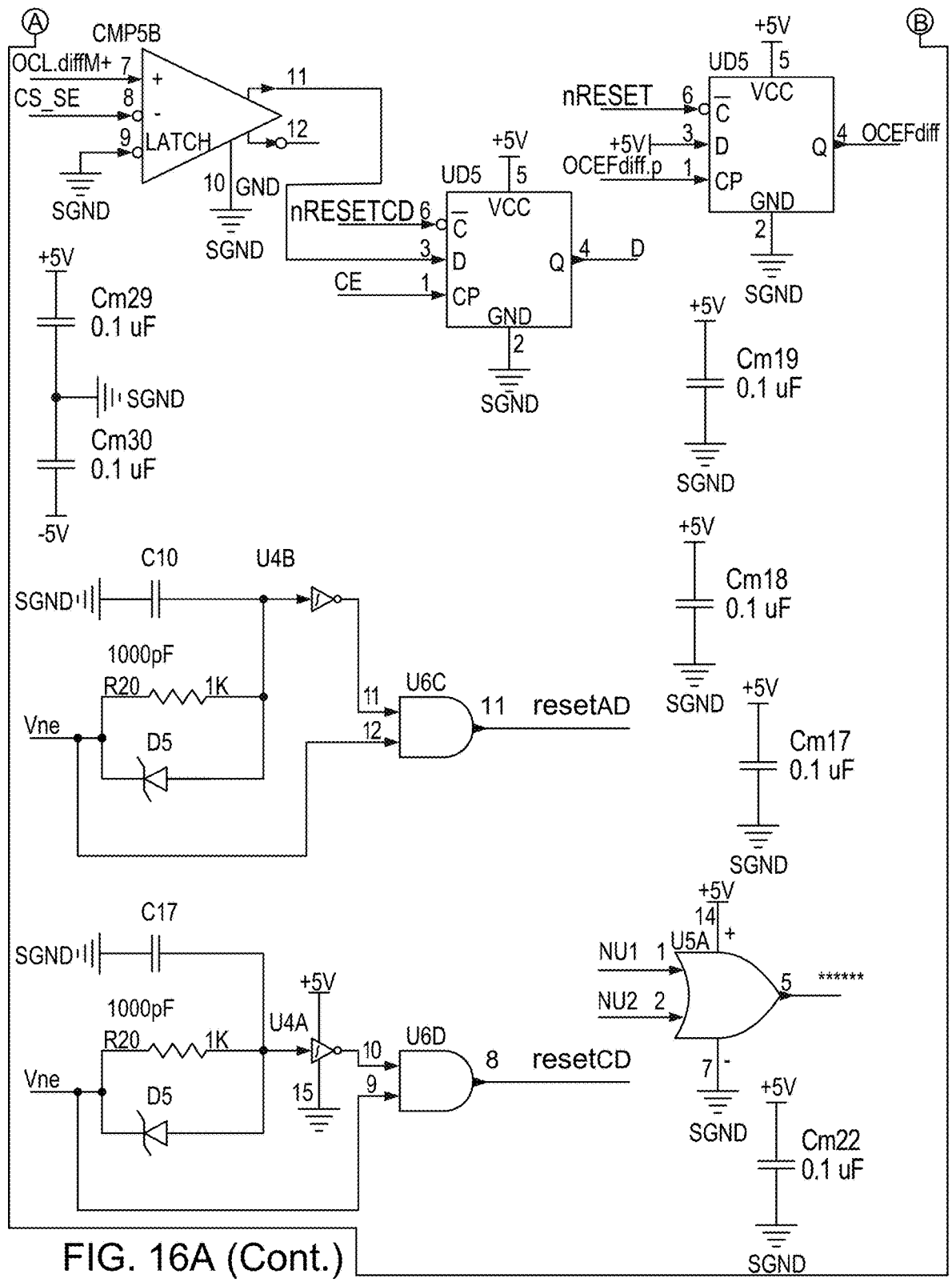
Figure 16B:
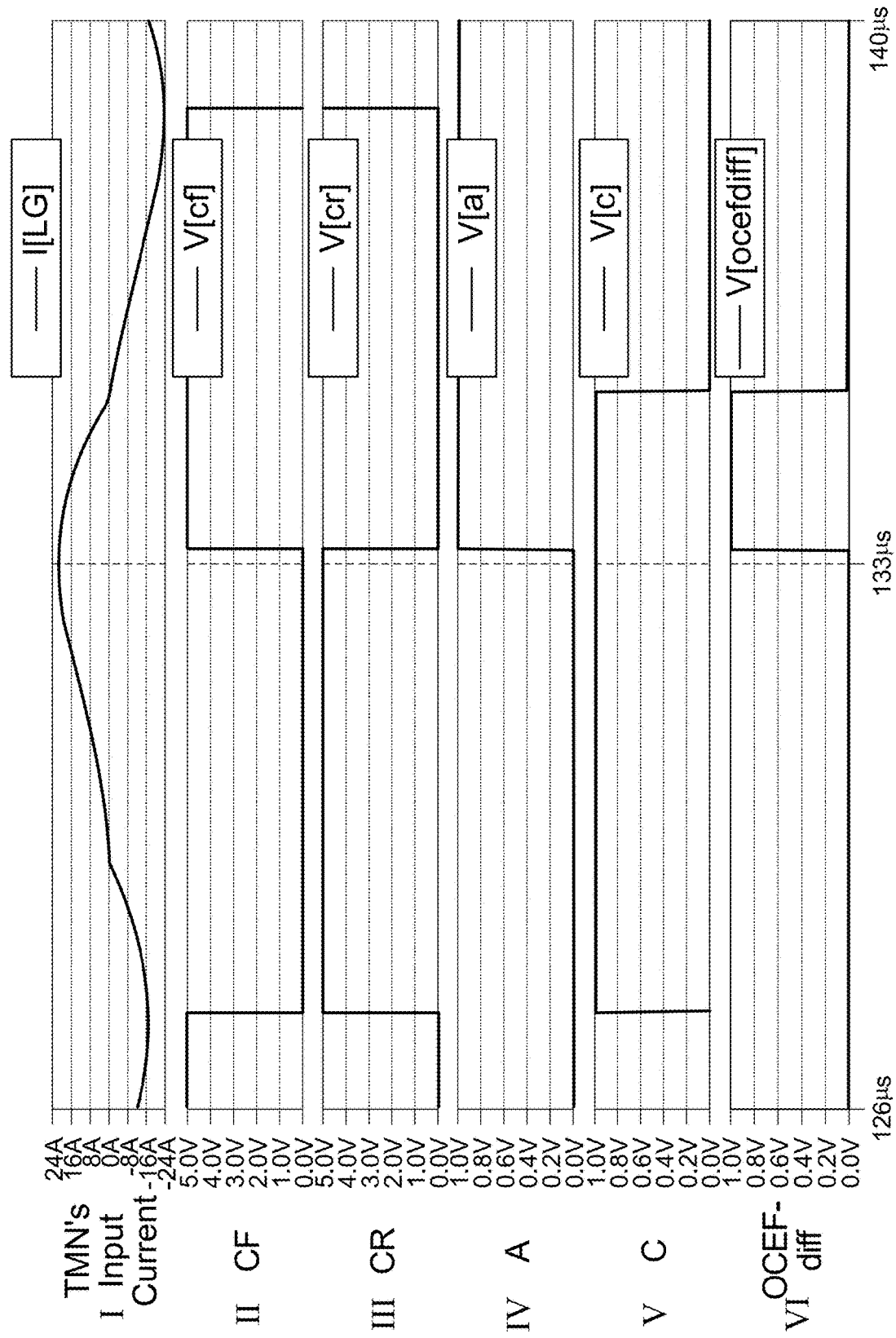
FIG. 16B is a waveform diagram showing illustrative waveforms for the circuit of FIG. 16A.

FIG. 16 shows an example incremental over-current protection circuit, which is represented as IOCP in the protection/diagnostic circuitry 1210 of FIG. 12. In some implementations, the IOCP circuit detects large transients where input current is increasing with an exponential envelope. As will be appreciated, such transients are typically caused by faults in the system.

In the illustrated embodiment, the above-described CS_SE is provided to a series of comparators with inputs of maximum and minimum current levels. The comparator outputs are latched with the CF, CR signals and the latch outputs are combined to identify over current conditions.

As shown in the waveform diagram of FIG. 16A, consecutive maximum and minimum current levels are monitored. If a difference in current level between consecutive maximum and minimum levels is greater than a threshold, error signal $OCEF_{diff}$ will be latched until reset by the controller. Subplots I, II, III show an illustrative input current, CF, and CR signal, respectively, as described above. Subplot IV shows an illustrative A signal, which is the value of a comparator output to detect a maximum current level latched in by the CF signal and subplot V shows an illustrative C signal, which is the value of a comparator output to detect a minimum current level latched in by the CR signal. Subplot VI shows an example $OCED_{diff}$ signal which can correspond to a logical AND of the A and C signals.

Figure 17A:
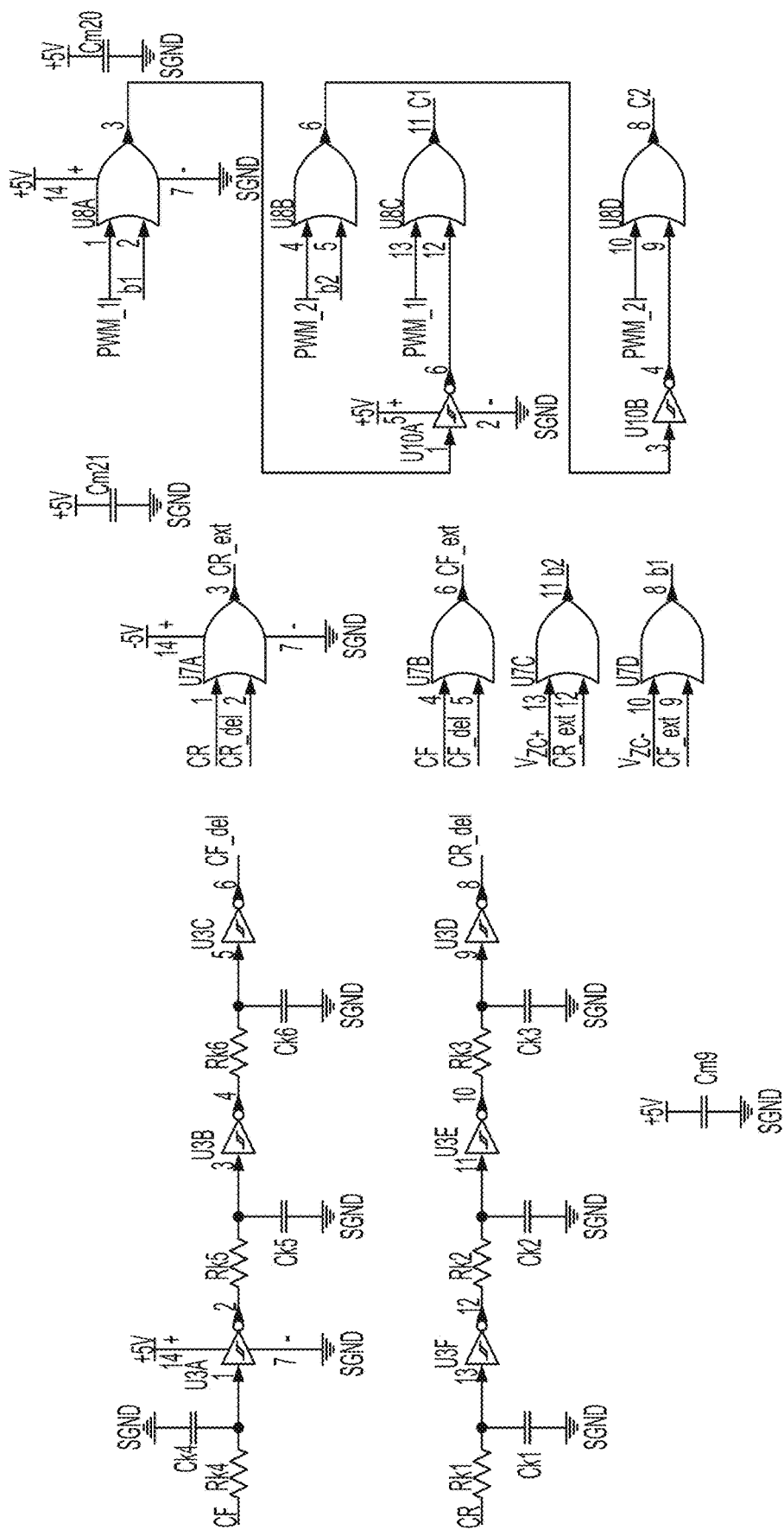
FIG. 17A is an example circuit implementation of an over voltage protection circuitry that can form a part of the system of FIG. 12.
Figure 17B:
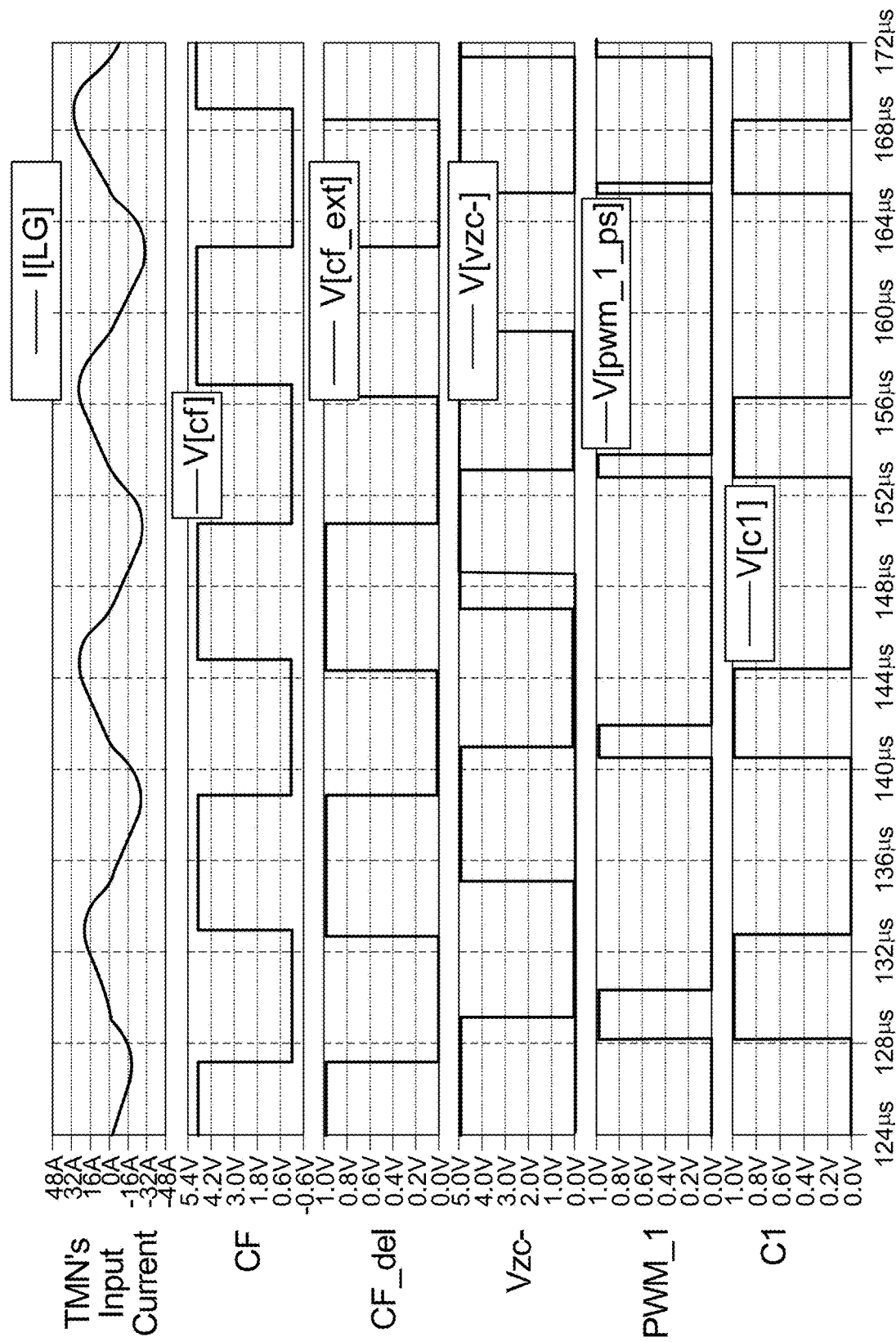
FIG. 17B is a waveform diagram showing illustrative waveforms for the circuit of FIG. 17A.

FIG. 17 shows an example over-voltage protection circuit, which is represented as OVP in the protection/diagnostic circuitry 1210 of FIG. 12. In general, the OVP circuit uses information from a previous cycle to protect from over-voltage conditions in the current cycle. In some implementations, a premature turn-off of the switching element, such as MOSFET, is prevented by delaying the turn-off edge of a driving PWM signal for a switching element.

FIG. 17A shows example waveforms including the input current, CF signal, delayed CF signal, and voltage zero cross signal, as shown. The PWM_1 is delayed to generate signal C1 that delays turning off switching elements to protect against over voltage conditions in the current cycle.

In some implementations, the protection/diagnostic circuitry 1210 can further include over temperature protection (OTP) having a temperature sensor that can generate an error signal if the measured temperature exceeds a given threshold.

FIG. 18A shows an example implementation of a zero-crossing detector which can correspond to zero-crossing detector 1214 in FIG. 12. This example implementation of the zero-crossing detector can be a modified or different version of the zero-crossing detector shown in FIG. 5A. The zero-crossing detector can generate differential output signal $V_{ZC+}$, $V_{ZC-}$.

Figure 19:
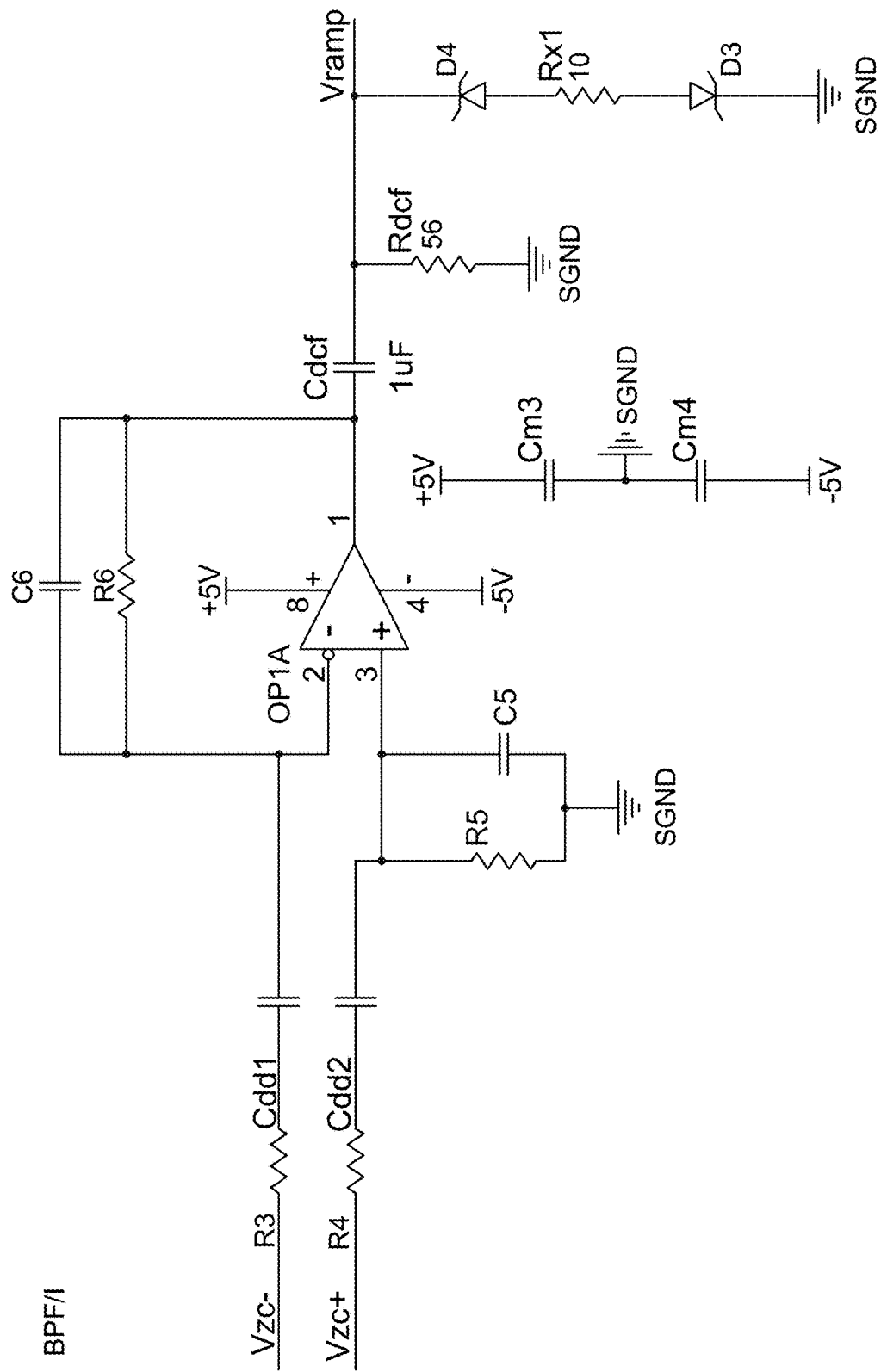
FIG. 19 is an example circuit implementation of a band-pass filter/integrator circuitry to generate a ramp signal that can form a part of the system of FIG. 12.

FIG. 19 shows an example implementation of a bandpass filter/integrator or ramp generation circuit which can correspond to band-pass filter or integrator 1618 in FIG. 16. This example implementation of the ramp generation circuit can be a modified or different version of the ramp generator 508 of FIG. 5A. The bandpass filter/integrator can generate a ramp signal, such as the ramp signal shown in FIG. 5B, subplot III.

Figure 20:
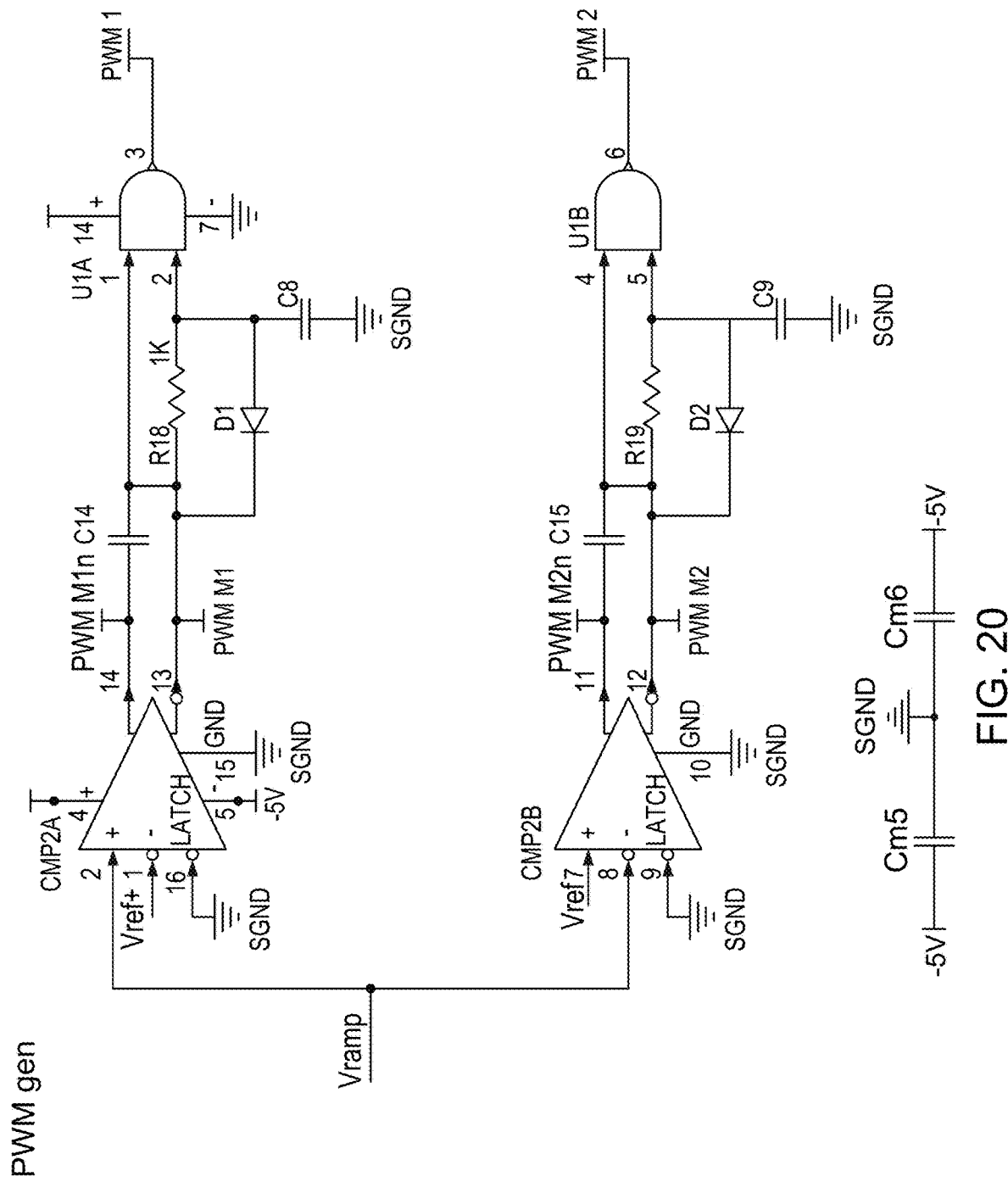
FIG. 20 is an example circuit implementation of a PWM signal generator that can form a part of the system of FIG. 12.

FIG. 20 shows an example implementation of a PWM signal generator which can correspond to PWM signal generation circuitry 1220 in FIG. 12. This example implementation of the PWM signal generator can be a modified or different version of the PWM generation circuit in the modulator 404 in FIG. 5A. As described above, the PWM signal generator can generate drive signals for the switching elements, such as M1, M2 in FIG. 12.

Figure 21:
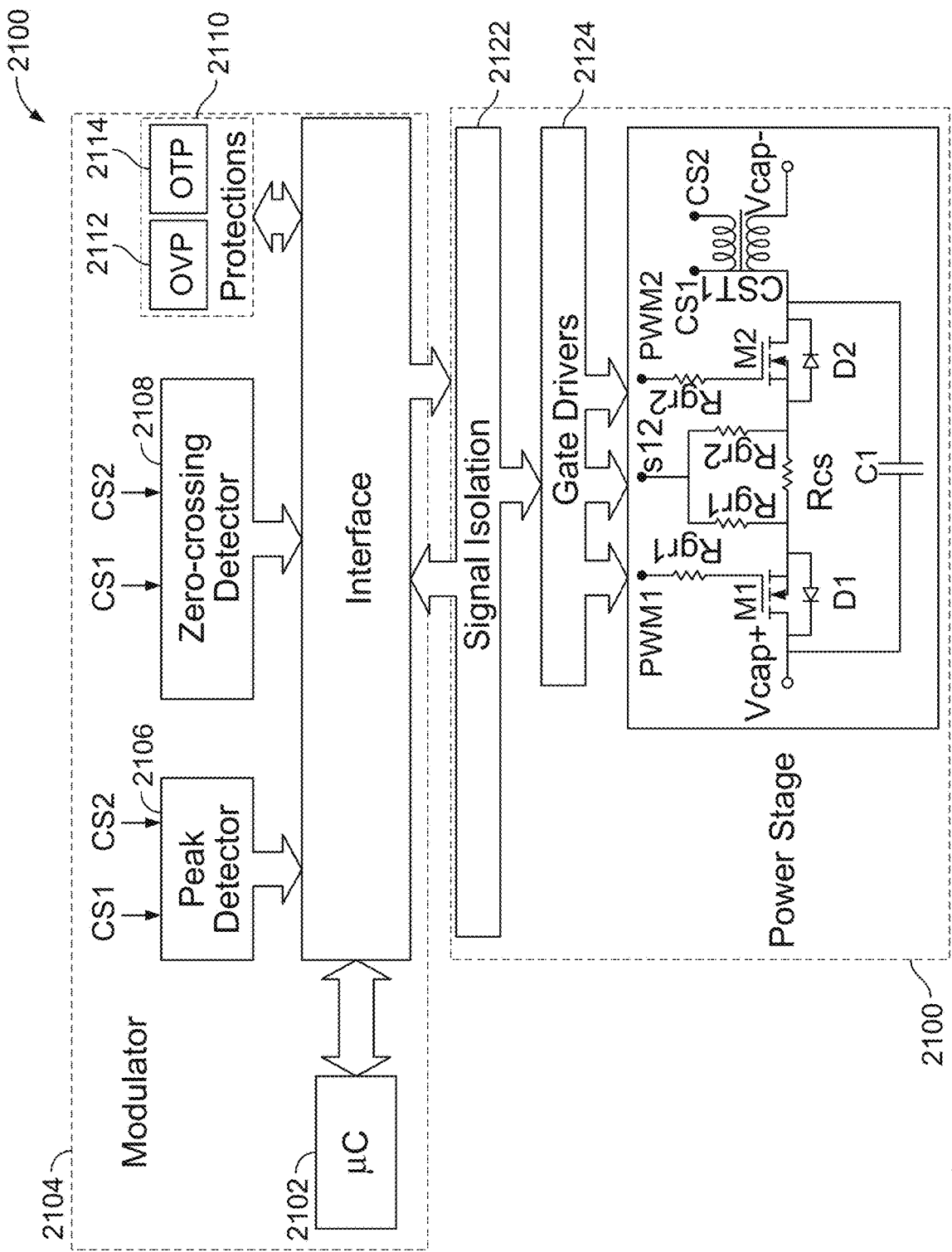
FIG. 21 is a schematic representation of a PWM capacitor switching system.

FIG. 21 shows an example digital implementation 2100 including protection/diagnostic functionality that may have some commonality with the system of FIG. 12. In the illustrated embodiment, a controller 2102 forms part of a modulator 2104, which includes a peak detector 2106 and zero-crossing detector 2108 that may be similar to that shown in conjunction with FIG. 12. The peak detector 2106 and zero-crossing detector 2108 may receive sensor output signals CS1, CS2 from the power stage 2120. The modulator 2104 may include all, none or any combination of protection/diagnostic circuitry 1210 functionality shown in FIG. 12 and/or FIGS. 13-20. In the illustrated embodiment, a protection circuitry 2110 can include over voltage protection (OVP) 2112 and over temperature protection (OTP) 2114. In some implementations, the OVP 2112 and OTP 2114 can be similar to the functionality shown and described above in conjunction with FIG. 12 and FIG. 17, for example. Note that, in some implementations, the microcontroller 2102 can be configured or programmed to perform some or all of the function of the mixed signal implementation. For some functionalities, additional hardware may be required to achieve similar functionality. Functionalities, for example, that can be programmed into the microcontroller 2102 can be the over current protection (OCP), incremental over current protection (iOCP), current shape OK (CSOK), and/or band-pass filter/integrator.

The power stage 2120 can include a signal isolation circuitry 1222 and gate driver 1224, which may be similar to that described above. The power stage 2120 can include a capacitor C1 and switching elements M1, M2 and a current sensor for sensing current through the capacitor C1 and providing current information signals, CS1, CS2, as described above, for example.

Automatic Zero-Voltage Switching Control

In some implementations, a system having a PWM-controlled capacitor includes enhanced circuit for zero-voltage switching of its switches (e.g. MOSFETs).). In some implementations, an automatic ZVS implementation provides ZVS in the presence of relatively significant signal transients to reduce or eliminate switching element, e.g., MOSFET, breakdown relating to the PWM-controlled capacitor. In some implementations, a body diode conduction sensor detects body diode conduction in the switching element and affects switching element control signals, as described more fully below.

Figure 22:
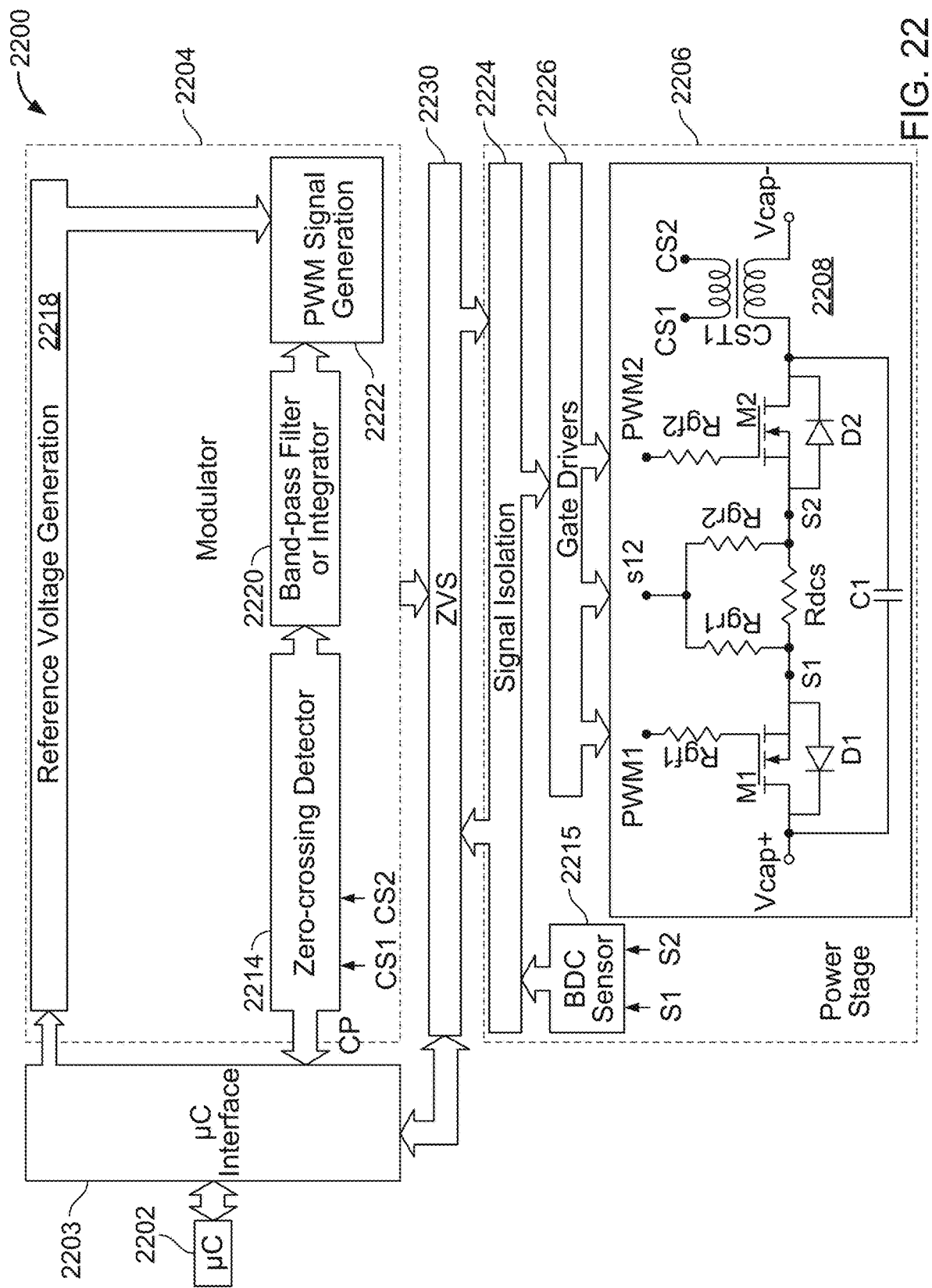
FIG. 22 is a schematic representation of a PWM capacitor switching system having ZVS.

FIG. 22 shows an illustrative mixed-signal implementation 2200 of a PWM-controlled capacitor C1 with equivalent capacitance controlled by switching elements M1, M2 and ZVS functionality. In some implementations, a controller 2202, modulator 2204, and power stage 2206 can have some commonality to the embodiments described above. The power stage 2206 includes a capacitor C1 and switching elements M1, M2, which can include internal or external body diodes D1, D2, and a current sensor 2208 for sensing current through the capacitor C1. The current sensor 2208 provides capacitor current information CS1, CS2 that can be provided to a zero-crossing detector 2214, for example, in the modulator 2204.

In some implementations, the power stage 2206 includes a body diode conduction sensor 2215 that can detect conduction of a body diode, e.g., D1, D2, of a switching element, such as M1 or M2 MOSFETS. As described more fully below, a voltage across a sense resistor Rdcs at nodes s1, s2 can be provided to the body diode conduction sensor 2215.

The modulator 2204 can include a reference voltage generator 2218, a band-pass filter or integrator 2220 coupled to the zero-crossing detector 2214, and a PWM signal generator 2222 to generate controls signals for the switching elements M1, M2 which can be similar to those described above. The power stage 2206 can include a signal isolation circuitry 2224 and gate driver 2226, which may be similar to that described above, as well as the body diode conduction sensor 2215. A ZVS circuitry 2230 can be provided between the modulator 2204 and the power stage 2206. In some implementations, the body diode conduction sensor 2215 can be coupled to the controller 2202 via a controller interface 2203.

Figure 18:
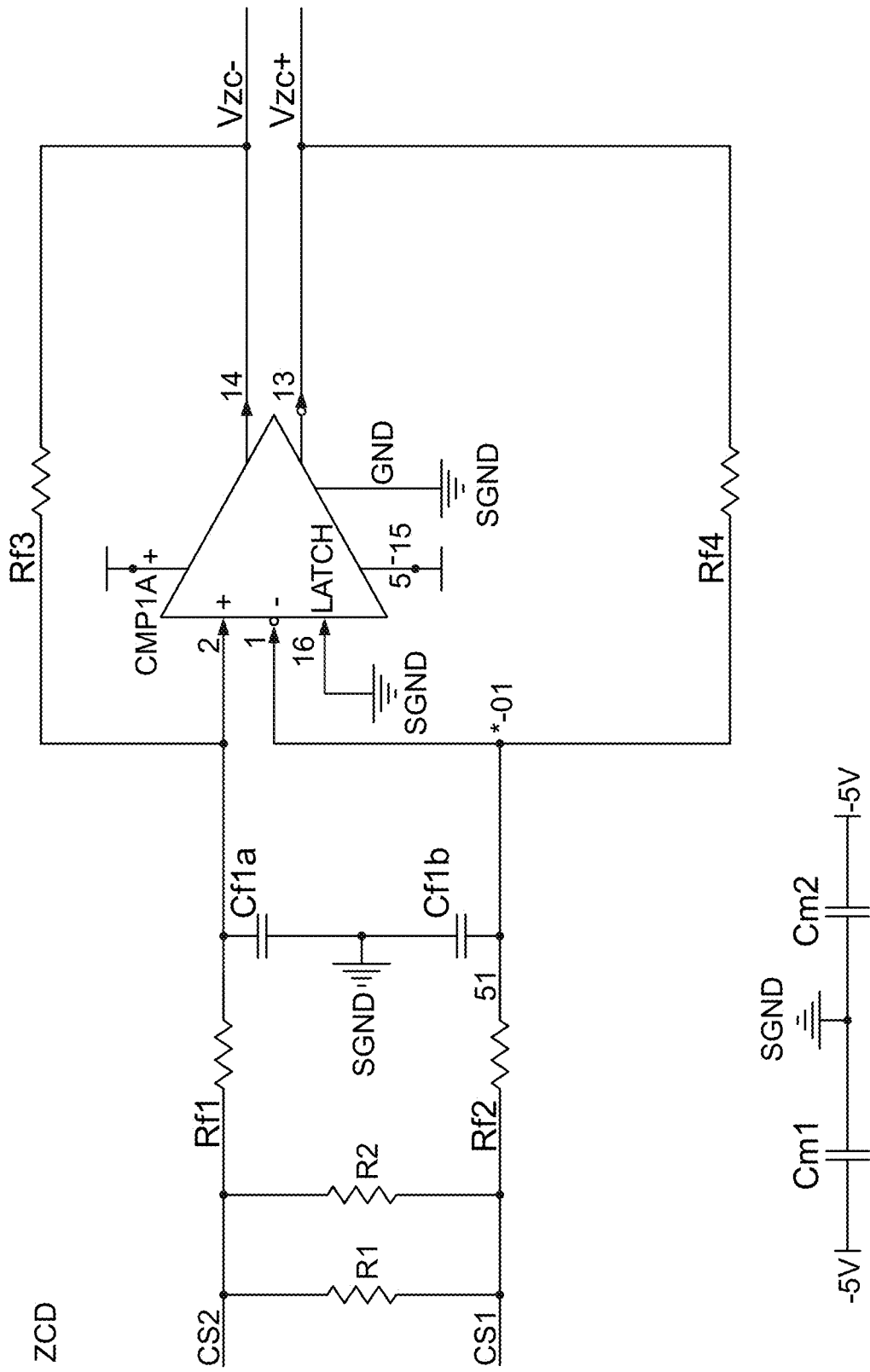
FIG. 18 is an example circuit implementation of a zero-crossing detector that can form a part of the system of FIG. 12.
Figure 23A:
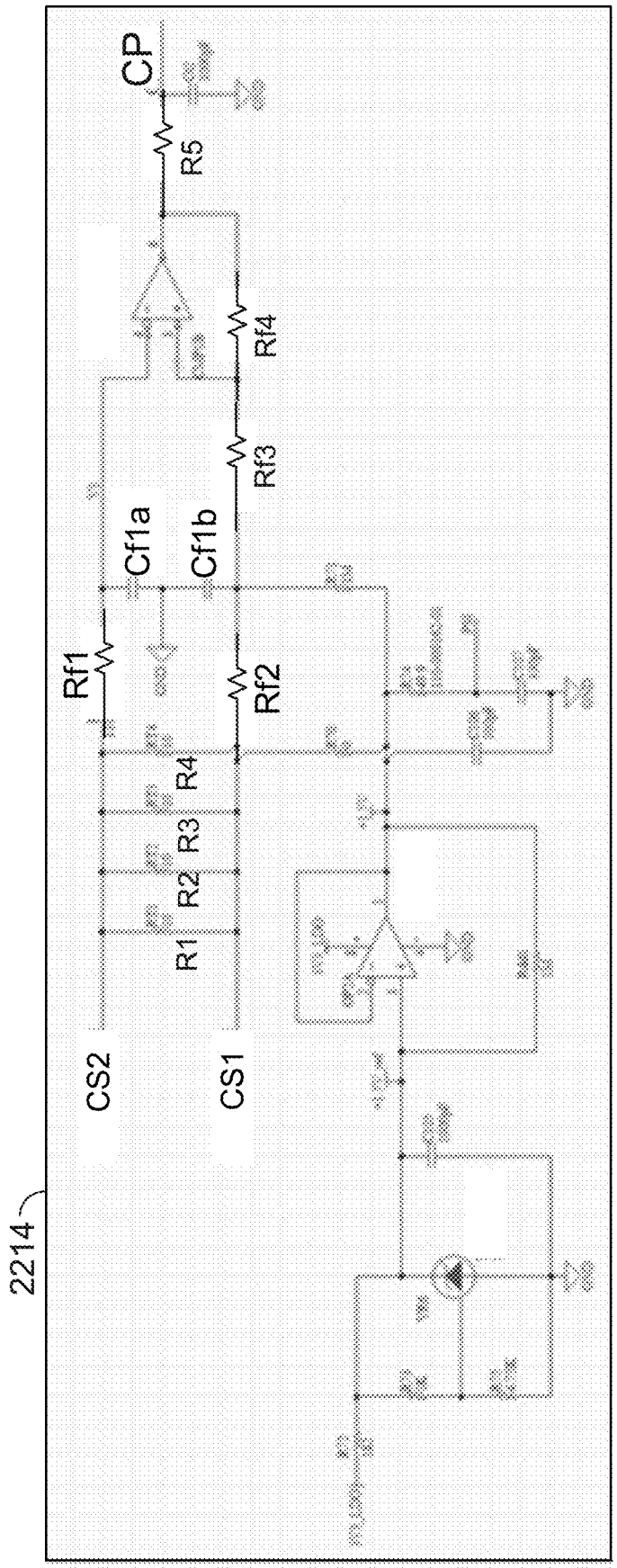
FIG. 23A is an example circuit implementation of a zero-crossing detector.

FIG. 23A shows an example implementation of a zero-crossing detector which can correspond to zero-crossing detector 2214 in FIG. 22. The zero-crossing detector 2214 receives capacitor current information signals CS1, CS2 as input and generates an output signal CP. The output signal CP is provided to the controller 2202. For example, rising and falling edges of signal CP indicate zero-crossings of the capacitor current. In some implementations, the to zero-crossing detector 2214 can be configured as shown in FIG. 18 and described above.

The example zero-crossing detector 2214 as shown in FIG. 23A uses a unipolar (e.g., +3.3V) voltage supply. In some implementations, the zero-crossing detector 2214 can be configured to use a bipolar (e.g., +5V and −5V) voltage supply (e.g., as shown in FIG. 18. Furthermore, the comparators can include hysteresis that prevents faulty current pulse detections. In addition, AC waveforms such as current measurement can be normalized to the +1.5 V dc voltage bias. DC voltage bias can be generated using, for example, resistive dividers, voltage references, shunts and regulators, operational amplifiers, dc-dc converters, or a combination thereof. The slope of the comparator outputs can be controlled by load resistors and capacitors.

Figure 23B:
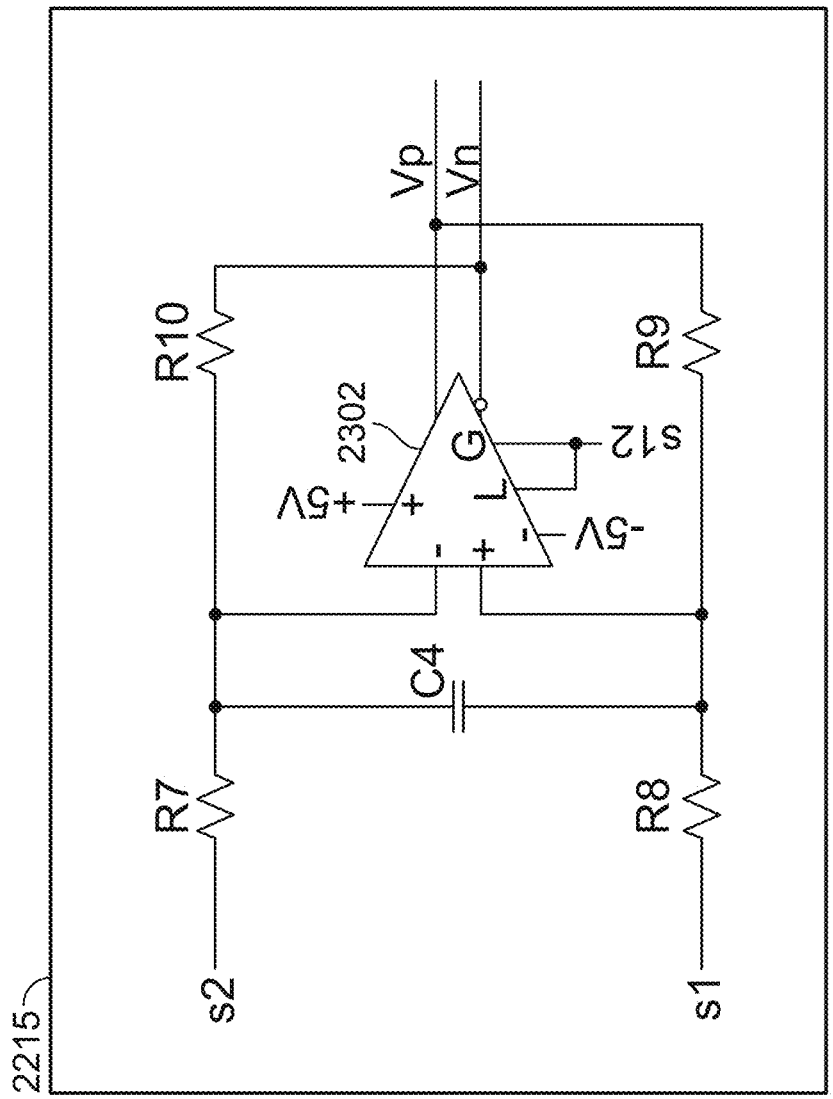
FIG. 23B is an example circuit implementation of a body diode conduction sensor.

FIG. 23B shows an example embodiment of the body diode conduction sensor 2215 of FIG. 22. The example body diode conduction sensor 2215 as shown in FIG. 23A uses a bipolar (e.g., +5V and −5V) voltage supply. In some implementations, the body diode conduction sensor 2215 can be configured to use a unipolar (e.g., 3.3 V) voltage supply. As noted above, the body diode conduction sensor 2215 receives the voltage at nodes s1, s2 at each terminal of the sense resistor Rdcs (FIG. 22). In some implementations, the body diode conduction sensor 2215 includes a rail-to-rail comparator 2302 having a first input coupled to node s2 via R7 and a second input coupled to node s1 via R8, with a capacitor C4 coupled across the first and second inputs. The comparator 2302 provides differential outputs Vp, Vn, which are fed back to inputs of the comparator via R9 and R10.

In one embodiment, where switching elements M1, M2 are provided as MOSFETs, when the body-diode for M1, for example, begins to conduct, a current pulse in the sense resistor Rdcs is detected. Components R7, R8, and C4 form a low-pass filter to reduce noise due to ringing of the M1 (or M2) current. Components R7, R8, R9, R10 provide hysteresis for the comparator 2302 that prevents faulty current pulse detections. A rising edge of output $V_n$ corresponds to the detection of M1 body-diode start of conduction and a rising edge of output $V_p$ corresponds to the detection of M2 body-diode start of conduction. In some implementations, outputs $V_n$ and $V_p$ are complementary signals.

FIGS. 24A-24E show example waveforms for automatic ZVS in accordance with illustrative embodiments of the invention. FIG. 24A shows a waveform for a voltage V(Vcap+, s1) (see FIG. 22), which corresponds to the voltage across M1 and FIG. 24B shows a waveform V(Vcap−,s2), which is the voltage across M2. FIG. 24C shows a current I(Rdcs) across the sense resistor Rdcs (see FIG. 22). As noted above, when body diode conduction begins, a current pulse is detected across sense resistor Rdcs. In the illustrated embodiment, at time $t_1$, M2 (see FIG. 24B) begins body diode conduction and the M2 voltage drops to nearly zero as body diode conduction clamps the M2 voltage, which generates a current pulse across the sense resistor Rdcs. At time $t_2$, M2 is turned on by the M2 gate drive signal (voltage across PWM2, s12 (see FIGS. 22 and 23)), as shown in FIG. 24E. FIG. 24D shows the gate drive signal for M1. As can be seen, current pulses on Rdcs correspond to body diode conduction of the M1, M2 switching elements. Time td, which is the body diode conduction time, corresponds to $t_2$-$t_1$. Furthermore, shorter body diode conduction times, td, can correspond to reduced losses because the voltage drop on the MOSFET channel is lower than the voltage drop of the body diode D1, D2. In some implementations, automatic ZVS waits until detecting M1 or M2 voltage going to zero until enabling the corresponding switch (e.g., M1/M2) to turn on.

Figure 25A:
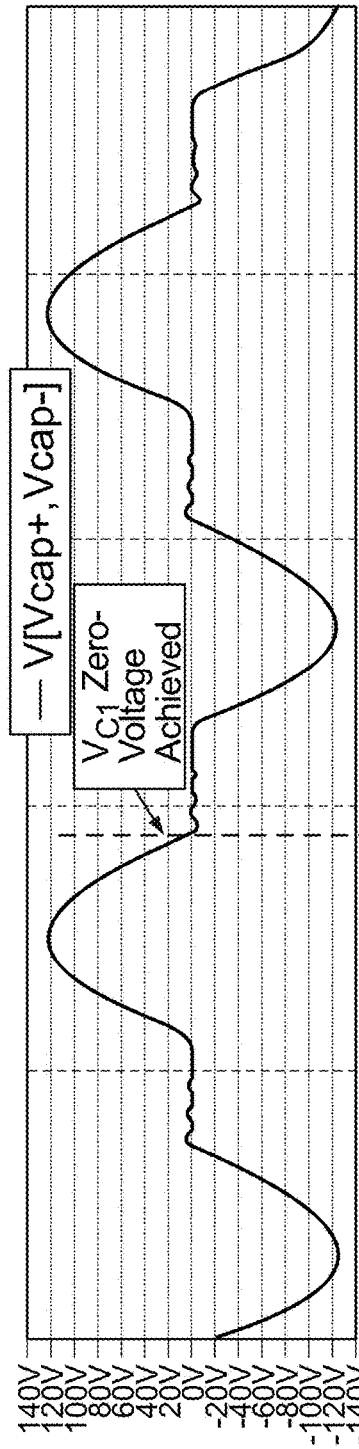
FIGS. 25A-25C are waveform diagrams showing illustrative waveforms for the circuits of FIGS. 22 and 23.
Figure 25B:
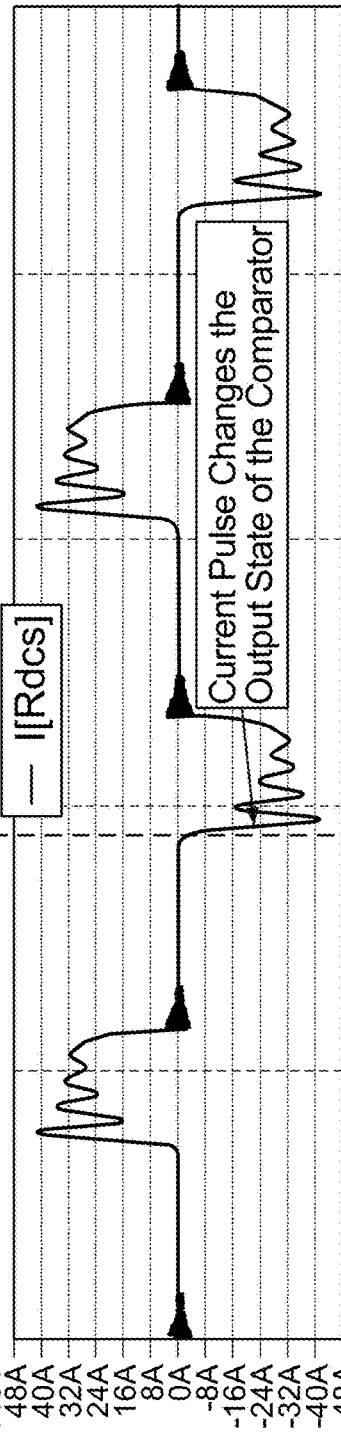
Figure 25C:
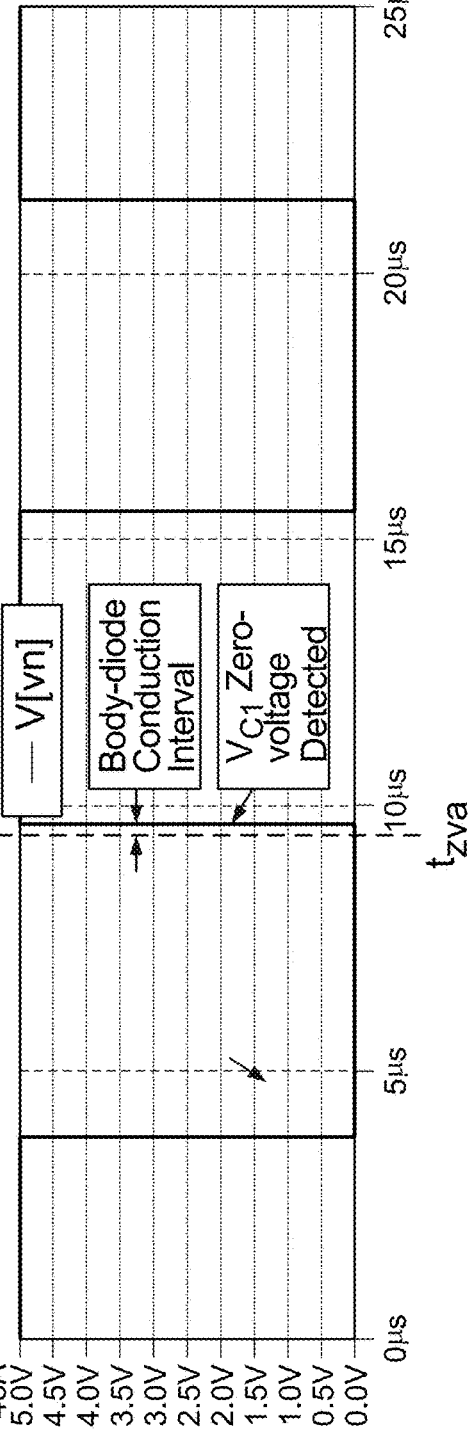

FIGS. 25A-25C show further example waveforms for an illustrative automatic ZVS implementation. FIG. 25A shows the voltage across capacitor C1 (V(V$_{cap+}$, V$_{cap-}$). At time t$_{zva}$, zero voltage across C1 is achieved, which corresponds to a current pulse across the sense resistor Rdcs caused by body diode conduction of M1 or M2, as shown in FIG. 25B. As described above, the current pulse results in a change in the comparator 2302 (FIG. 23) output V(V$_n$), which is shown in FIG. 25C.

Figure 26:
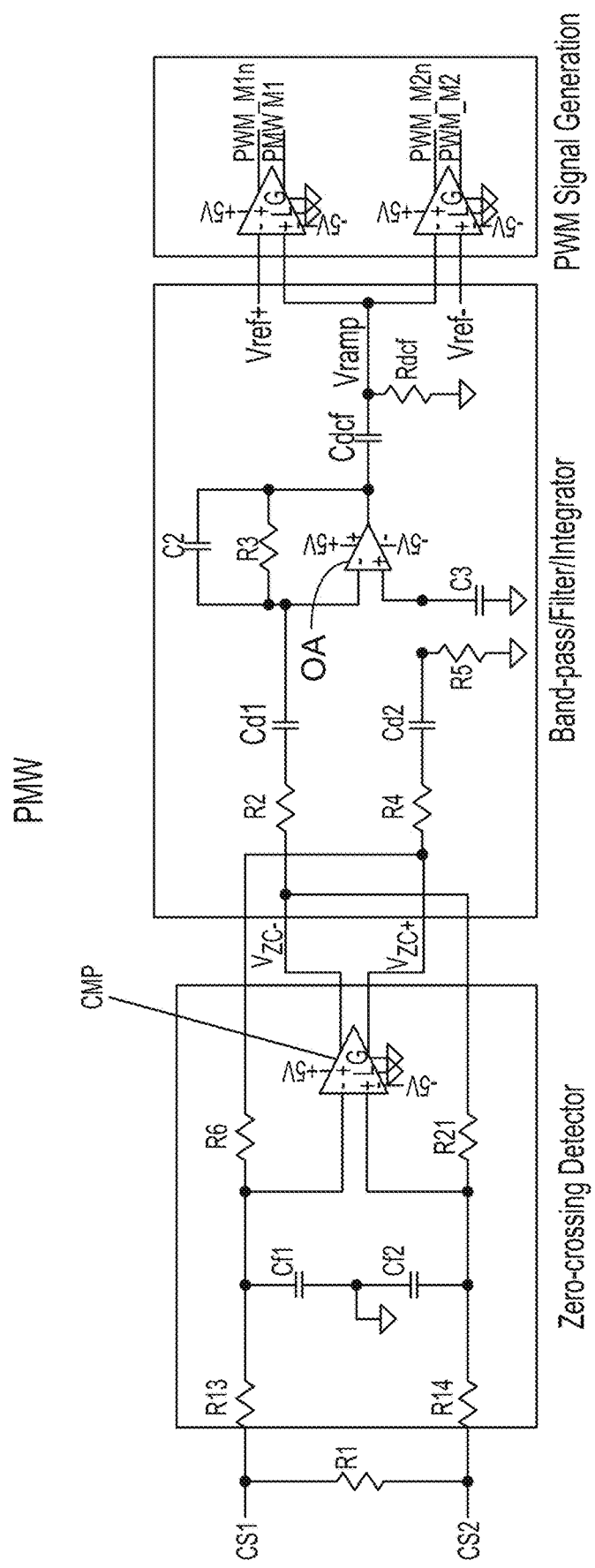
FIG. 26 is an example circuit implementation of the modulator of FIG. 22.

FIG. 26 shows an example modulator circuit implementation having similarity with the modulator of FIG. 5A. Other circuit implementations are possible that can include programmable devices and various partitions between hardware and software. Operation of the modulator of FIG. 26 is briefly described below.

Resistor R1 converts current signal CS1, CS2 (see FIG. 22) from a current to a voltage signal. Components R13, R14, R6, R21, Cf1, Cf2, and comparator CMP form a zero-crossing detector, operation of which is described above. Components R13, R14, Cf1, Cf2, form a low-pass filter to attenuate common-mode and differential mode noise and R13, R14, R6 and R21 provide hysteresis in the zero-crossing detector. Component R2, R4, Cd1, Cd2, R3, R5, C2, C3, Cdcf, Rdcf, and op amp OA includes a band-pass filter/integrator. The integrator function converts a square-wave signal V$_{zc}$=V$_{zc-}$−V$_{zc+}$ to a triangular waveform V$_{ramp}$. The band-pass filter function limits the impact of noise. In some implementations V$_{ref}$=V$_{ref+}$=−V$_{ref}$, where V$_{ref}$ determines the turn-off edge of the gate driver signals for M1, M2, which can be provided as power MOSFETs, and the equivalent impedance of the PWM capacitor C1. PWM generation circuit outputs PWM_M1$n$, PWM_M1, PWM_M2$n$, and PWM_M2.

Figure 27A:
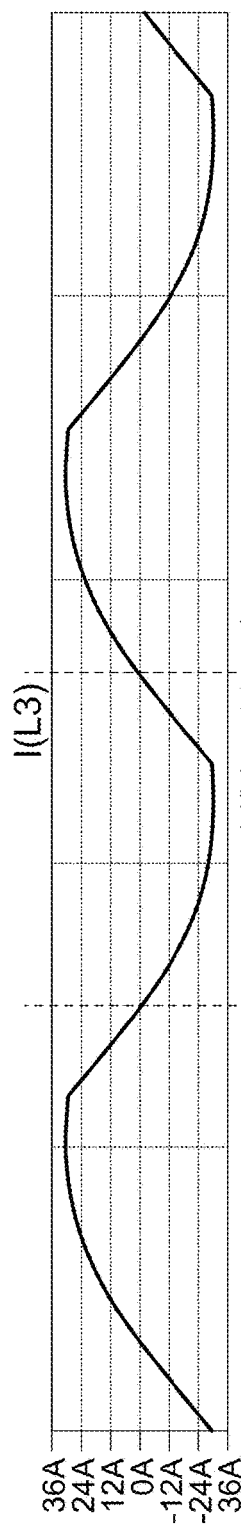
FIGS. 27A-27E are waveform diagrams showing illustrative waveforms for the circuits of FIG. 22 and FIG. 26.
Figure 27B:
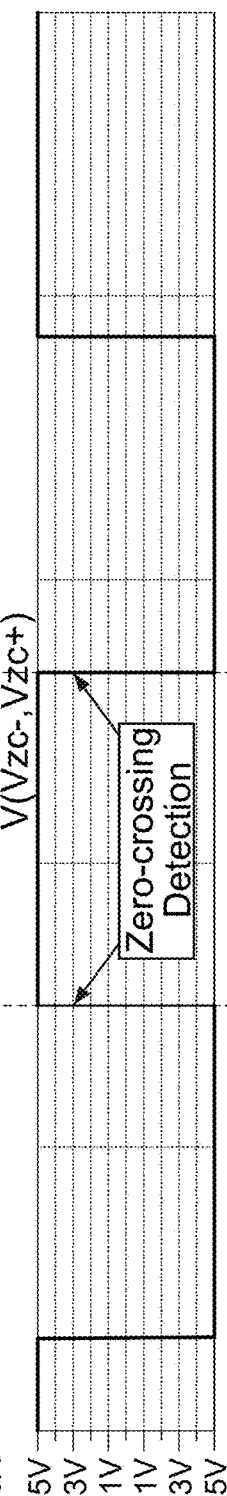
Figure 27C:
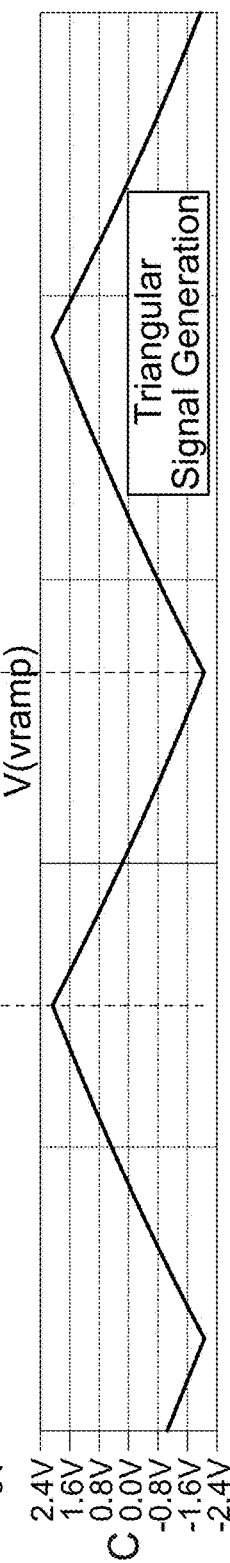
Figure 27D:
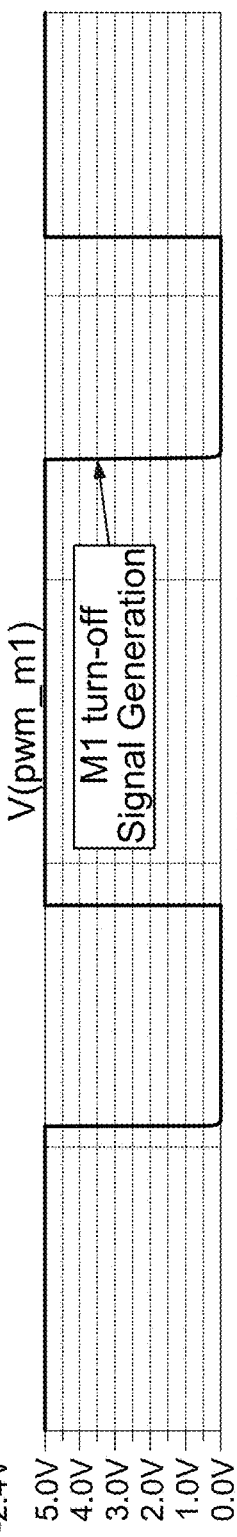
Figure 27E:
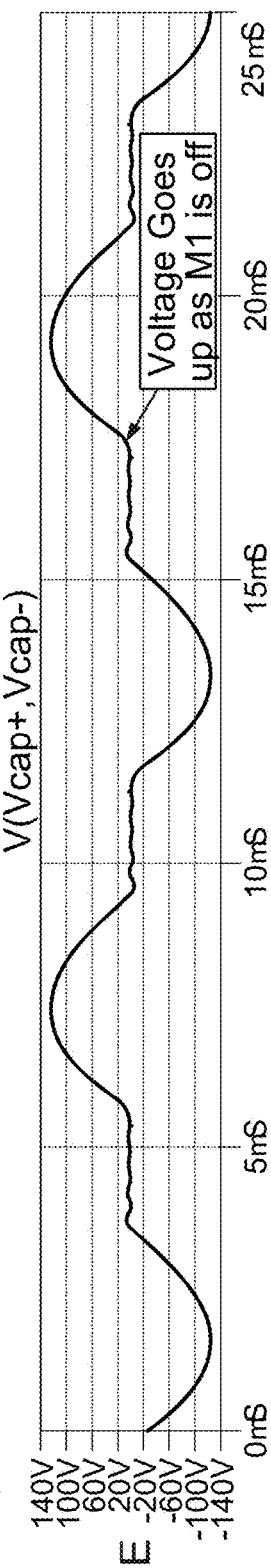

FIGS. 27A-27E shows example waveforms for modulator operation for ZVS. FIG. 27A shows current waveform I(L3), which is current through inductor L3$s$ of FIG. 2, for example. FIG. 27B shows the differential output (V$_{zc+}$, V$_{zc-}$) of the zero-crossing detector (see FIG. 26) including zero-crossing detection at the high peak and low peak of the triangular ramp signal V(V$_{ramp}$), shown in FIG. 27C, which is output from the band-pass filter/integrator. FIG. 27D shows the M1 gate drive signal V(pwm_m1) output from the PWM signal generation circuit (FIG. 26). FIG. 27E shows the voltage across capacitor C1. As can be seen, M1 is turned off at a time at which the voltage across C1 rises from 0V.

Figures 28A, 28B:
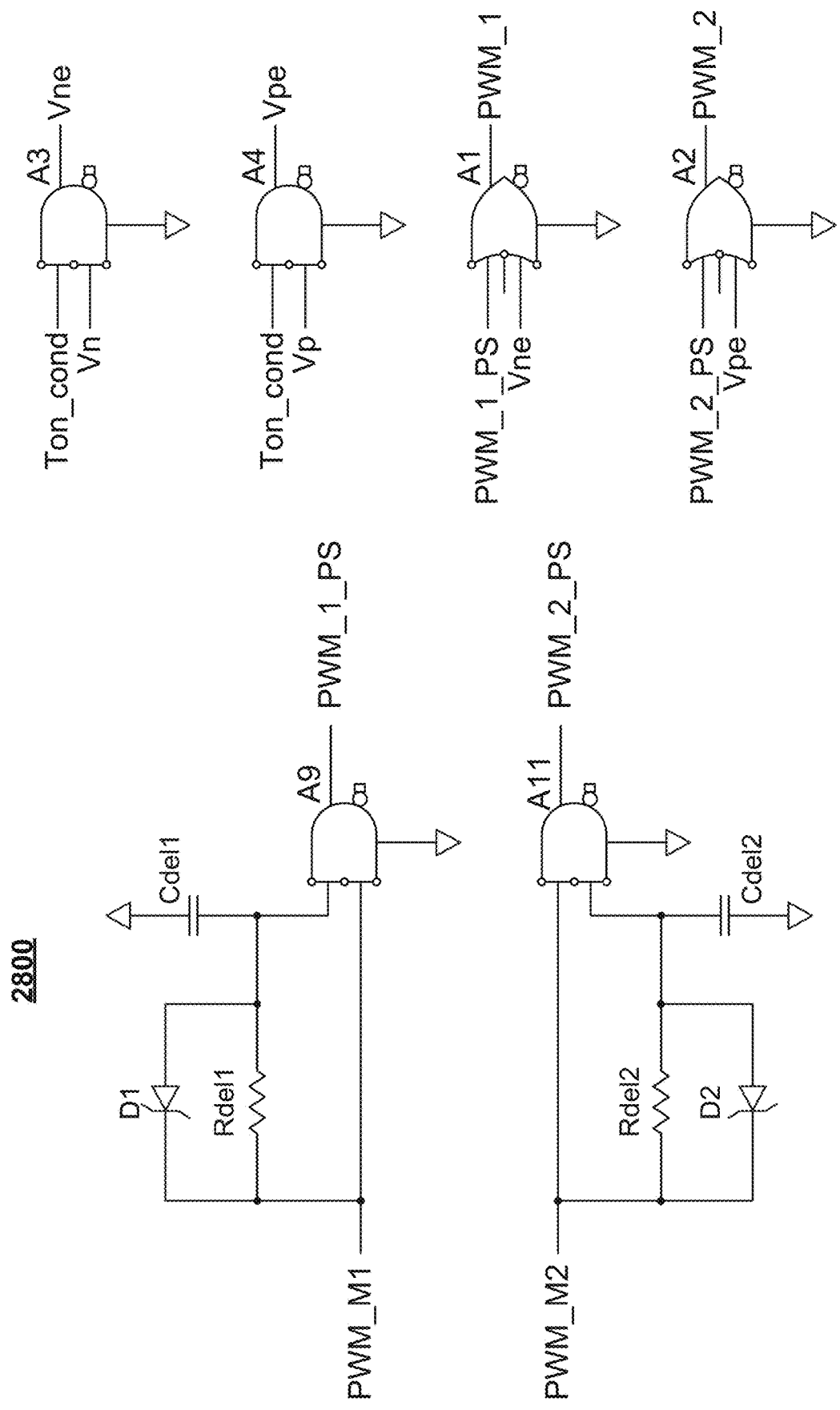
FIG. 28A is an example circuit implementation of a signal delay circuit and FIG. 28B is an example circuit implementation of a signal conditioning circuit.

FIGS. 28A and 28B show example pulse shaping and logic conditioning circuit implementations to effect ZVS in illustrative embodiments. FIG. 28A shows a pulse shaping circuit 2800 that receives signals PWM_M1 and PWM_M2 output by the PWM signal generator of FIG. 26. The pulse shaping circuit 2800 delays the turn on edge of signals PWM_M1 and PWM_M2.

FIG. 28 shows a circuit with a logic AND gate A3 with a first input as an enable signal Ton_cond from the controller, for example, and a second input V$_n$, which can be provided by the comparator 2302 of FIG. 23. As described above, a rising edge of output, V$_n$ corresponds to the detection of M1 body-diode start of conduction and rising edge of output V$_p$ corresponds to the detection of M2 body-diode start of conduction. The AND A3 output is signal, V$_{ne}$, which is signal V$_n$ enabled by the controller. Similarly, AND gate A4 generates enabled signal V$_{pe}$. It will be appreciated that the controller can turn-on or turn-off the PWM capacitor C1 switching elements M1, M2, as well as turn-on or turn-off automatic ZVS functionality.

The M1 pulse-shaped gate drive signal PWM_1_PS and V$_{ne}$ signal are provided as input to logic OR gate A1, which outputs M1 gate drive signal PWM_1. The M2 delayed gate drive signal PWM_2_PS and V$_{pe}$ signal are provided as input to logic OR gate A2, which outputs M2 gate drive signal PWM_2.

Signals PWM_M1 and PWM_M2 are modified to PWM_1_PS and PWM_2_PS so that their rising edge in time-domain waveform comes after the rising edge of V$_n$ and V$_p$. The rising edge of M1 gate driver signal PWM_1 is determined by rising edge of V$_{ne}$, while the falling edge is determined by PWM_1_PS. The rising edge of the M2 gate driver signal PWM_2 is determined by the rising edge of V$_{pe}$, while the falling edge is determined by PWM_2_PS.

Figure 29A:
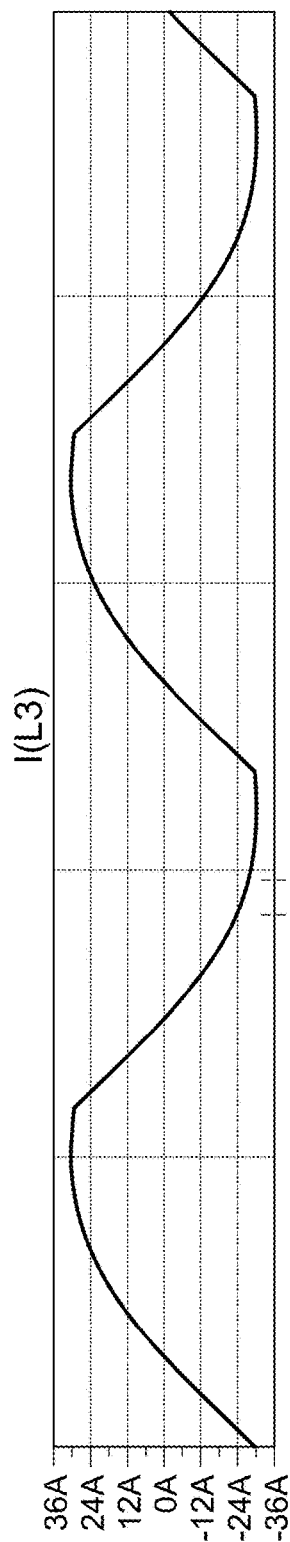
FIGS. 29A-29D are waveform diagrams showing illustrative waveforms for the circuits of FIG. 22 and FIGS. 28A and 28B.
Figure 29B:
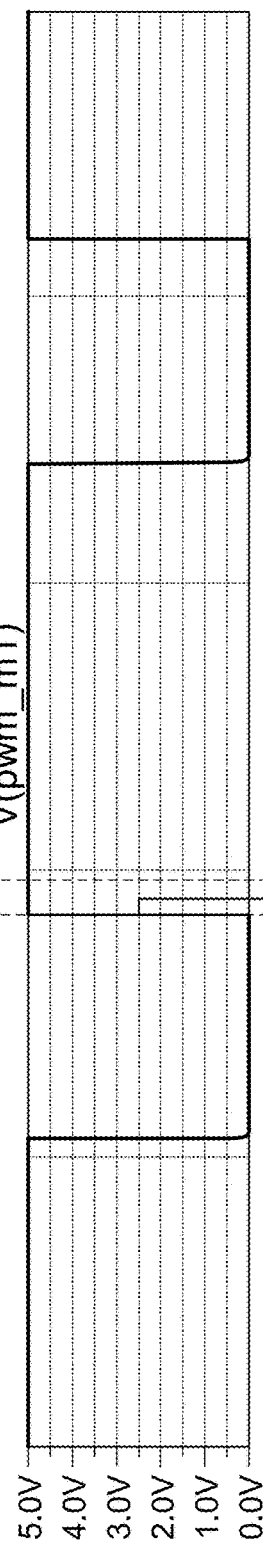
Figure 29C:
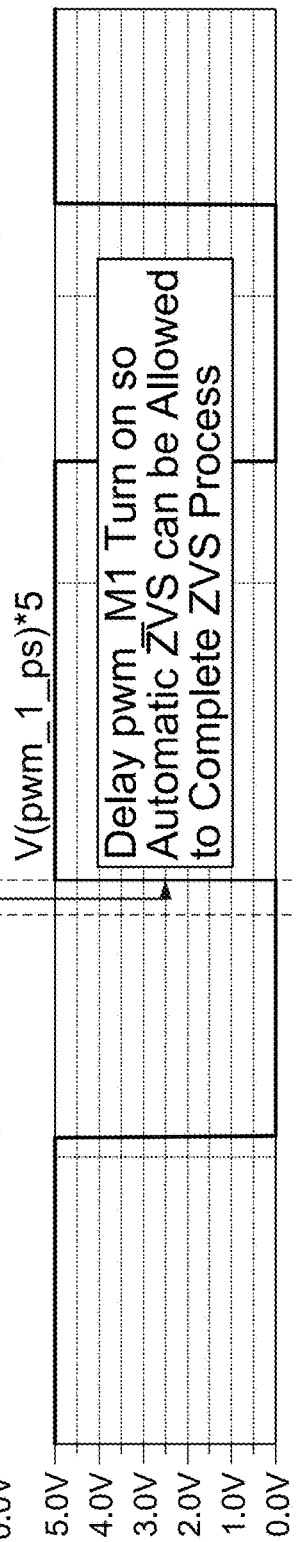
Figure 29D:
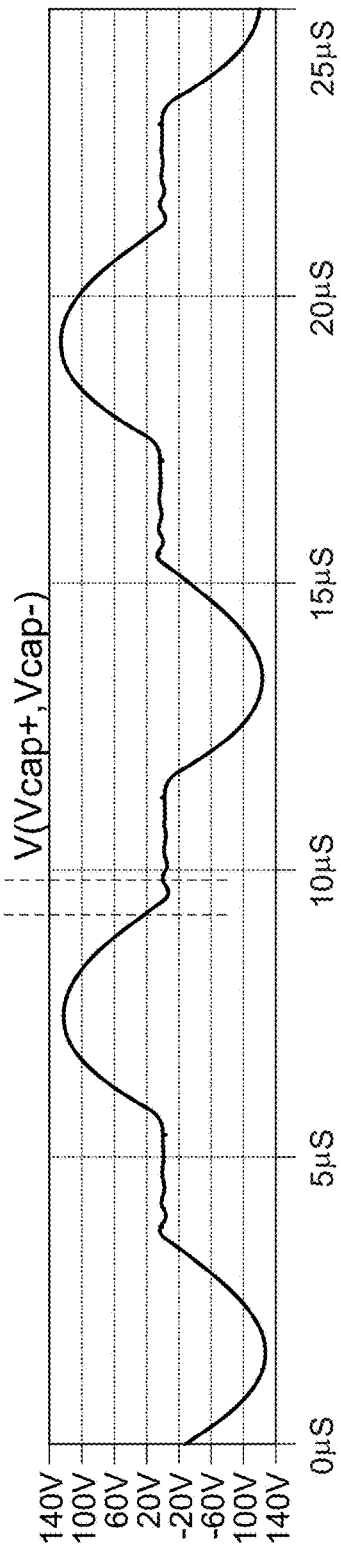

FIG. 29A shows current signal I(L3), FIG. 29B shows voltage level for signal PWM_M1 (input to circuit 2800 of FIG. 28A), FIG. 29C shows the voltage level for PWM_1_PS*5, where the "*5" refers to a scaling factor. FIG. 29D shows the voltage across C1, V(V$_{cap+}$, V$_{cap-}$). As described above, the M1 gate drive signal PMW_M1 is delayed to delay M1 turn on so that automatic ZVS is allowed to complete.

FIGS. 30A-30F show example waveforms for PWM control of capacitor C1 with automatic ZVS in accordance with example embodiments of the invention. FIG. 30A shows the voltage V(v$_{cap+}$, V$_{cap-}$) across capacitor C1 and FIG. 30B shows a current pulse I(Rdcs) across sense resistor Rdcs (FIG. 25B), resulting in a transition of signal V$_n$ in FIG. 30C (also shown in FIG. 25C), to enable M1 to turn on. The delayed turn-on of M1 is shown in FIG. 30D as V(pwm_1_ps), the generation of which is shown in FIG. 28A. The modulator and pulse shaping (see FIG. 28A, 28B) determine the pulse edge of V(pwm_1_ps) that turns off M1. FIG. 30E shows the gate drive signal to M1, V(PWM1, s12), as the logical OR of V$_n$ and pwm_1_ps, as shown in FIG. 28B. The gate drive signal V(PWM2, s12) for M2 shown in FIG. 30F is generated in a similar manner.

Figure 31C:
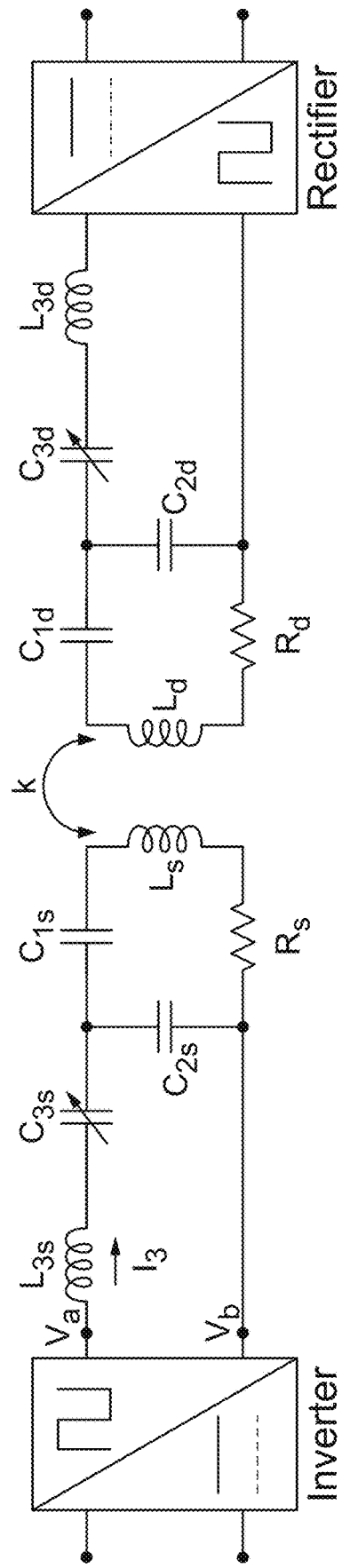
FIGS. 31A and 31B show example waveforms for a circuit shown in FIG. 31C with silicon MOSFETs without automatic ZVS and example waveforms for the circuit shown in FIG. 31C with automatic ZVS.

FIG. 31A and FIG. 31B show example results for the illustrative test circuit shown in FIG. 31C, which is similar to the circuit of FIG. 2. PWM of capacitor C3$s$ (see FIG. 31C) is performed with automatic ZVS, as described above. FIG. 31A shows, on the left, for silicon MOSFET switching devices for M1 and M2, no automatic ZVS, and, on the right, with automatic ZVS. FIG. 31B shows, on the left, for silicon MOSFET switching devices for M1 and M2, with automatic ZVS, and, on the right, without automatic ZVS for a different voltage reference V$_{ref}$ from that of FIG. 31A.

Figure 32:
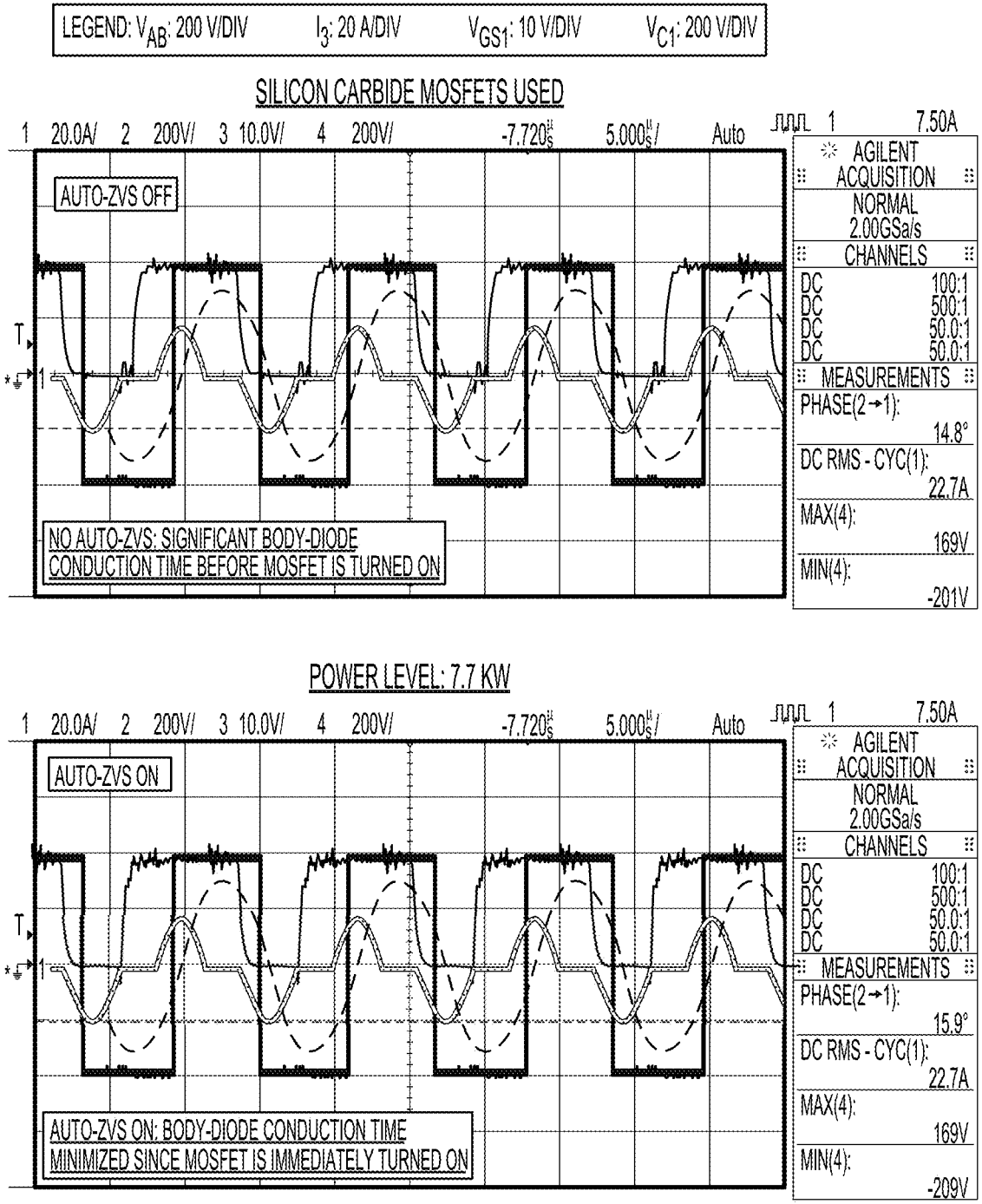
FIG. 32 shows example waveforms for a circuit with silicon carbide MOSFETs without and with automatic ZVS.

FIG. 32 shows power loss reduction for SiC MOSFETs for M1 and M2 without (left side of FIG. 32) and with (right side of FIG. 32) automatic ZVS for the circuit of FIG. 31C. As can be seen, Automatic ZVS brings about 16 W of power loss savings.

Figure 33:
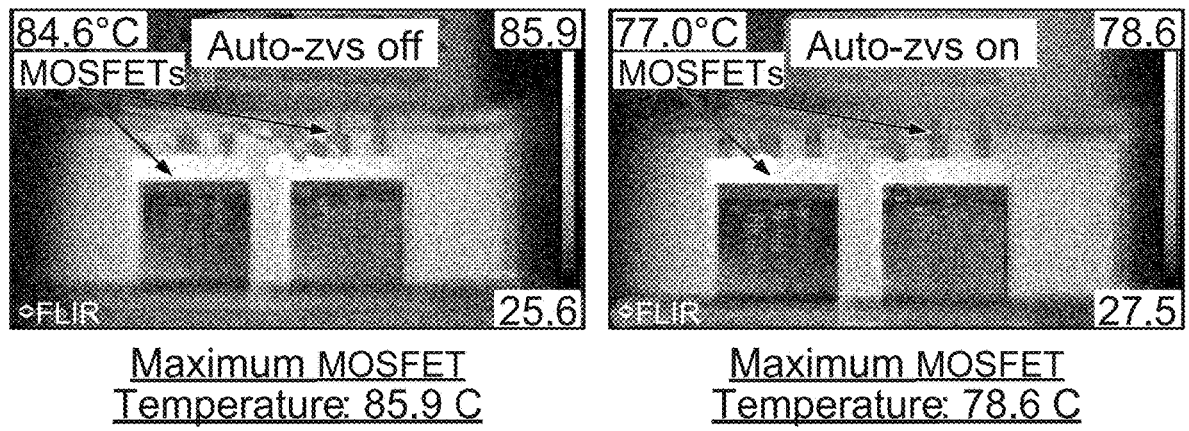
FIG. 33 shows example thermal imaging of a circuit without and with automatic ZVS.

FIG. 33 shows thermal imaging of M1 and M2 as Sic MOSFETs providing about a 7.3 C temperature reduction during operation of automatic ZVS (right side of FIG. 33) as compared to operating without ZVS functionality (left side of FIG. 33).

Figure 34:
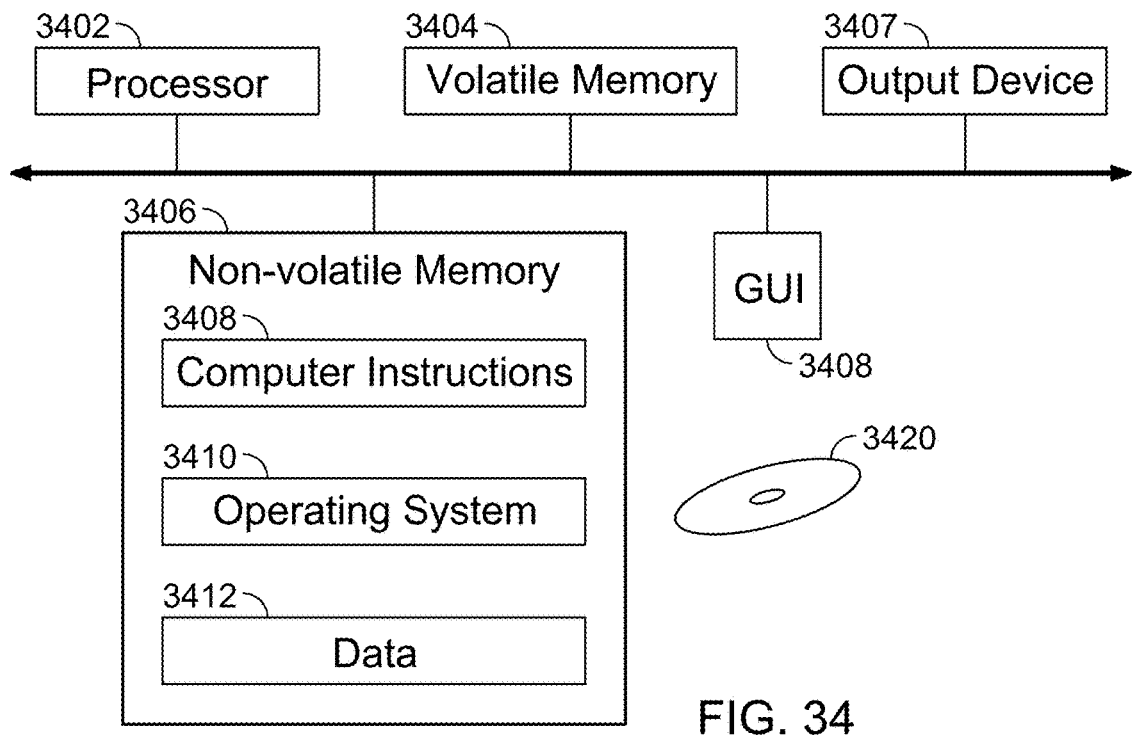
FIG. 34 shows a schematic representation of an illustrative computer that can perform at least a portion of the processing described herein.

FIG. 34 shows an exemplary computer 3400 that can perform at least part of the processing described herein. The computer 3400 includes a processor 3402, a volatile memory 3404, a non-volatile memory 3406 (e.g., hard disk), an output device 3407 and graphical user interface (GUI) 3408 (e.g., a mouse, a keyboard, a display, for example). The non-volatile memory 3406 stores computer instructions

3412, an operating system 3416 and data 3418. In one example, the computer instructions 3412 are executed by the processor 3402 out of volatile memory 3404. In one embodiment, an article 3420 includes non-transitory computer-readable instructions.

While the disclosed techniques have been described in connection with certain preferred embodiments, other embodiments will be understood by one of ordinary skill in the art and are intended to fall within the scope of this disclosure. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

For illustrative purposes, the foregoing description focuses on the use of devices, components, and methods in high power wireless power transfer applications, e.g., power transfer for charging electric vehicles.

More generally, however, it should be understood that devices that can receive power using the devices, components, and methods disclosed herein can include a wide range of electrical devices, and are not limited to those devices described for illustrative purposes herein. In general, any portable electronic device, such as a cell phone, keyboard, mouse, radio, camera, mobile handset, headset, watch, headphones, dongles, multifunction cards, food and drink accessories, and the like, and any workspace electronic devices such as printers, clocks, lamps, headphones, external drives, projectors, digital photo frames, additional displays, and the like, can receive power wirelessly using the devices, components, and methods disclosed herein. Furthermore, any electrical device, such as electric or hybrid vehicles, motorized wheel chairs, scooters, power tools, and the like, can receive power wirelessly using the devices, components, and methods disclosed herein.

In this disclosure, certain circuit or system components such as capacitors, inductors, resistors, are referred to as circuit "components" or "elements." The disclosure also refers to series and parallel combinations of these components or elements as elements, networks, topologies, circuits, and the like. More generally, however, where a single component or a specific network of components is described herein, it should be understood that alternative embodiments may include networks for elements, alternative networks, and/or the like.

As used herein, the term "coupled" when referring to circuit or system components is used to describe an appropriate, wired or wireless, direct or indirect, connection between one or more components through which information or signals can be passed from one component to another.

As used herein, the term "direct connection" or "directly connected," refers to a direct connection between two elements where the elements are connected with no intervening active elements between them. The term "electrically connected" or "electrical connection," refers to an electrical connection between two elements where the elements are connected such that the elements have a common potential. In addition, a connection between a first component and a terminal of a second component means that there is a path between the first component and the terminal that does not pass through the second component.

Implementations of the subject matter and the operations described in this specification can be realized in digital electronic circuitry, or in computer software, firmware, or hardware, including the structures disclosed in this specification and their structural equivalents, or in combinations of one or more of them. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal; a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer can include a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a wireless power transmitter or receiver or a wirelessly charged or powered device such as a vehicle, a mobile telephone, a personal digital assistant (PDA), a mobile audio or video player, a game console, or a Global Positioning System (GPS) receiver, to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any implementation of the present disclosure or of what may be claimed, but rather as descriptions of features specific to example implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A variable capacitance device comprising:
a capacitor;
a first transistor comprising a first-transistor first terminal, a first-transistor second terminal, and a first-transistor gate terminal, the first-transistor first terminal electrically connected to a first terminal of the capacitor;
a second transistor comprising a second-transistor first terminal, a second-transistor second terminal, and a second-transistor a gate terminal, the second-transistor first terminal electrically connected to a second terminal of the capacitor, and the second-transistor second terminal electrically connected to the first-transistor second terminal; and
control circuitry coupled to the first-transistor gate terminal and the second-transistor gate terminal, wherein the control circuitry is configured to adjust an effective capacitance of the capacitor by performing operations comprising:
generating an alternating ramp signal having peaks and troughs that are timed to correspond with zero-crossings of an input current, and
switching off the first transistor in response to the ramp signal crossing a first reference value; and
switching on the first transistor following a fixed time delay after the ramp signal crosses the first reference value following a peak or trough in the ramp signal.

2. The device of claim 1, wherein the first and second transistors are selected from the group consisting of: silicon MOSFET transistors, silicon carbide MOSFET transistors, or gallium nitride MOSFET transistors.

3. The device of claim 1, wherein the capacitor is electrically connected to an impedance matching system.

4. The device of claim 1, wherein operations comprise:
switching off the second transistor following a second fixed time delay after the ramp signal crosses a second reference value; and
switching on the second transistor in response to the ramp signal crossing the second reference value following a second peak or trough in the ramp signal.

5. A variable capacitance device comprising:
a capacitor;
a first transistor comprising a first-transistor first terminal, a first-transistor second terminal, and a first-transistor gate terminal, the first-transistor first terminal electrically connected to a first terminal of the capacitor;
a second transistor comprising a second-transistor first terminal, a second-transistor second terminal, and a second-transistor a gate terminal, the second-transistor first terminal electrically connected to a second terminal of the capacitor, and the second-transistor second terminal electrically connected to the first-transistor second terminal; and
control circuitry coupled to the first-transistor gate terminal and the second-transistor gate terminal, wherein the control circuitry is configured to adjust an effective capacitance of the capacitor by performing operations comprising:
generating an alternating ramp signal having peaks and troughs that are timed to correspond with zero-crossings of an input current,
switching off the first transistor in response to the ramp signal crossing a first reference value when the ramp signal has a first slope;
switching on the first transistor in response to the ramp signal crossing the first reference value when the ramp signal has a second slope;

switching off the second transistor in response to the ramp signal crossing a second reference value when the ramp signal has the second slope; and switching on the second transistor in response to the ramp signal crossing the second reference value when the ramp signal has the first slope.

6. The device of claim 5, wherein the effective capacitance of the capacitor is controlled by the first and second reference values.

7. The device of claim 5, wherein the second reference value has a value that is the negative of the first reference value.

8. The device of claim 5, wherein the operations comprise switching on the first transistor after the ramp signal crosses the first reference value and in response to a zero-voltage condition across the capacitor.

9. The device of claim 5, wherein the first and second transistors are selected from the group consisting of: silicon MOSFET transistors, silicon carbide MOSFET transistors, or gallium nitride MOSFET transistors.

10. The device of claim 5, wherein the capacitor is electrically connected to an impedance matching system.

11. A high-power wireless energy transfer system comprising:
a variable capacitance device comprising:
a capacitor;
a first transistor comprising a first-transistor first terminal, a first-transistor second terminal, and a first-transistor gate terminal, the first-transistor first terminal electrically connected to a first terminal of the capacitor;
a second transistor comprising a second-transistor first terminal, a second-transistor second terminal, and a second-transistor a gate terminal, the second-transistor first terminal electrically connected to a second terminal of the capacitor, and the second-transistor second terminal electrically connected to the first-transistor second terminal; and
control circuitry coupled to the first-transistor gate terminal and the second-transistor gate terminal, wherein the control circuitry is configured to adjust an effective capacitance of the capacitor by performing operations comprising:
generating an alternating ramp signal having peaks and troughs that are timed to correspond with zero-crossings of an input current, and
switching off the first transistor in response to the ramp signal crossing a first reference value; and
switching on the first transistor following a fixed time delay after the ramp signal crosses the first reference value following a peak or trough in the ramp signal; and
an inductive coil electrically coupled to the variable capacitance.

12. The system of claim 11, wherein operations comprise:
switching off the second transistor following a second fixed time delay after the ramp signal crosses a second reference value; and
switching on the second transistor in response to the ramp signal crossing the second reference value following a second peak or trough in the ramp signal.

13. The system of claim 11, wherein the first and second transistors are selected from the group consisting of: silicon MOSFET transistors, silicon carbide MOSFET transistors, or gallium nitride MOSFET transistors.

14. The system of claim 11, wherein the capacitor is electrically connected to an impedance matching system.

15. A high-power wireless energy transfer system comprising:
a variable capacitance device comprising:
a capacitor;
a first transistor comprising a first-transistor first terminal, a first-transistor second terminal, and a first-transistor gate terminal, the first-transistor first terminal electrically connected to a first terminal of the capacitor;
a second transistor comprising a second-transistor first terminal, a second-transistor second terminal, and a second-transistor a gate terminal, the second-transistor first terminal electrically connected to a second terminal of the capacitor, and the second-transistor second terminal electrically connected to the first-transistor second terminal; and
control circuitry coupled to the first-transistor gate terminal and the second-transistor gate terminal, wherein the control circuitry is configured to adjust an effective capacitance of the capacitor by performing operations comprising:
generating an alternating ramp signal having peaks and troughs that are timed to correspond with zero-crossings of an input current,
switching off the first transistor in response to the ramp signal crossing a first reference value when the ramp signal has a first slope;
switching on the first transistor in response to the ramp signal crossing the first reference value when the ramp signal has a second slope;
switching off the second transistor in response to the ramp signal crossing a second reference value when the ramp signal has the second slope; and
switching on the second transistor in response to the ramp signal crossing the second reference value when the ramp signal has the first slope; and
an inductive coil electrically coupled to the variable capacitance.

16. The system of claim 15, wherein the second reference value has a value that is the negative of the first reference value.

17. The system of claim 15, wherein the first and second transistors are selected from the group consisting of: silicon MOSFET transistors, silicon carbide MOSFET transistors, or gallium nitride MOSFET transistors.

18. The system of claim 15, wherein the capacitor is electrically connected to an impedance matching system.

19. The system of claim 15, wherein the second reference value has a value that is the negative of the first reference value.

20. The system of claim 15, wherein the operations comprise switching on the first transistor after the ramp signal crosses the first reference value and in response to a zero-voltage condition across the capacitor.

* * * * *